US009761995B2

United States Patent
Little et al.

(10) Patent No.: US 9,761,995 B2
(45) Date of Patent: *Sep. 12, 2017

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Wei-Hao Su, New Taipei (TW)

(73) Assignee: FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 0 days.

This patent is subject to a terminal disclaimer.

(21) Appl. No.: 15/345,517

(22) Filed: Nov. 8, 2016

(65) Prior Publication Data
US 2017/0077644 A1 Mar. 16, 2017

Related U.S. Application Data

(63) Continuation of application No. 14/935,378, filed on Nov. 7, 2015, now Pat. No. 9,490,584, and a
(Continued)

(51) Int. Cl.
*H01R 13/6585* (2011.01)
*H01R 13/6592* (2011.01)
(Continued)

(52) U.S. Cl.
CPC ..... *H01R 13/6215* (2013.01); *H01R 13/6581* (2013.01); *H01R 13/748* (2013.01);
(Continued)

(58) Field of Classification Search
CPC .. H01R 13/658; H01R 9/032; H01R 13/6585; H01R 13/6592; H01R 13/6581; H01R 13/6215; H01R 13/748
(Continued)

(56) References Cited

U.S. PATENT DOCUMENTS 4,842,555 A * 6/1989 Cosmos ............... H01R 13/627
174/359
4,936,795 A * 6/1990 Kawai ................. H01R 13/655
439/607.19
(Continued)

FOREIGN PATENT DOCUMENTS

CM  CN201868687 U  6/2011
CN  1253402 A  5/2000
(Continued)

OTHER PUBLICATIONS

Universal Serial Bus Type-C Cable and Connector Specification Revision 0.7 Working Draft Jan. xx, 2014, p. 13-14,2021,33,38.
(Continued)

*Primary Examiner* — Gary Paumen
(74) *Attorney, Agent, or Firm* — Wei Te Chung; Ming Chieh Chang

(57) ABSTRACT

A plug connector mateable with the receptacle connector, includes an insulative housing enclosed in a metallic shell, defining a receiving cavity to receive the mating tongue, and equipped with a plurality of contacts on opposite sides in the vertical direction. A latch forms a pair of locking heads extending into two opposite lateral sides of the receiving cavity to lock with a shielding plate embedded within a mating tongue of the complementary receptacle connector during mating. The plug connector is equipped with a pair of locking screws symmetrically located by two sides of the metallic shell and aligned with the pair of locking heads in the transverse direction, and the receptacle connector is equipped with a pair of screw holes to receive the pair of locking screws in a locked manner.

20 Claims, 59 Drawing Sheets

Related U.S. Application Data continuation-in-part of application No. 14/675,620, filed on Mar. 31, 2015, now Pat. No. 9,466,930, said application No. 14/935,378 is a continuation-in-part of application No. 14/558,732, filed on Dec. 3, 2014, now Pat. No. 9,490,594, said application No. 14/935,378 is a continuation-in-part of application No. 14/542,550, filed on Nov. 15, 2014, now Pat. No. 9,350,126, and a continuation-in-part of application No. 14/497,205, filed on Sep. 25, 2014, now Pat. No. 9,472,910, said application No. 14/935,378 is a continuation-in-part of application No. 14/477,889, filed on Sep. 5, 2014, now Pat. No. 9,525,223, said application No. 14/935,378 is a continuation-in-part of application No. 14/454,737, filed on Aug. 8, 2014, now Pat. No. 9,525,227, said application No. 14/935,378 is a continuation-in-part of application No. 14/337,180, filed on Jul. 21, 2014, now Pat. No. 9,318,853, said application No. 14/935,378 is a continuation-in-part of application No. 14/517,941, filed on Oct. 20, 2014, now Pat. No. 9,496,662.

(60) Provisional application No. 62/095,768, filed on Dec. 22, 2014, provisional application No. 62/077,166, filed on Nov. 7, 2014, provisional application No. 61/981,217, filed on Apr. 18, 2014, provisional application No. 62/001,084, filed on May 21, 2014, provisional application No. 61/940,815, filed on Feb. 17, 2014, provisional application No. 61/943,310, filed on Feb. 22, 2014, provisional application No. 61/949,232, filed on Mar. 6, 2014, provisional application No. 61/917,363, filed on Dec. 18, 2013, provisional application No. 61/926,270, filed on Jan. 11, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.
| | | |
|---|---|---|
| *H01R 13/621* | (2006.01) | |
| *H01R 13/6581* | (2011.01) | |
| *H01R 13/74* | (2006.01) | |
| *H01R 24/64* | (2011.01) | |
| *H01R 24/60* | (2011.01) | |
| *H05K 1/11* | (2006.01) | |
| *H05K 1/18* | (2006.01) | |
| *H01R 107/00* | (2006.01) | |

(52) U.S. Cl.
CPC ............ *H01R 24/64* (2013.01); *H01R 24/60* (2013.01); *H01R 2107/00* (2013.01); *H05K 1/117* (2013.01); *H05K 1/184* (2013.01); *H05K 2201/09063* (2013.01); *H05K 2201/10189* (2013.01)

(58) Field of Classification Search
USPC ............ 439/607.41, 607.51, 607.57, 607.47, 439/607.48, 362
See application file for complete search history.

(56) References Cited

U.S. PATENT DOCUMENTS

| | | | | |
|---|---|---|---|---|
| 5,022,871 | A | * | 6/1991 | Sekiguchi .......... H01R 23/6873 439/607.19 |
| 6,755,689 | B2 | | 6/2004 | Zhang et al. |
| 7,134,899 | B1 | * | 11/2006 | Huang ............... H01R 13/6215 439/352 |
| 7,267,579 | B1 | * | 9/2007 | Wu ..................... H01R 13/6658 439/607.41 |
| 7,357,675 | B2 | * | 4/2008 | Barringer ......... H01R 13/65802 174/354 |
| 7,591,680 | B2 | * | 9/2009 | Zhang .............. H01R 13/65802 439/607.17 |
| 7,758,379 | B2 | | 7/2010 | Chen |
| 7,909,647 | B2 | * | 3/2011 | Kawaguchi ............ H01R 9/035 439/585 |
| 8,087,944 | B2 | | 1/2012 | Kumamoto et al. |
| 8,517,773 | B2 | | 8/2013 | Lee et al. |
| 8,870,596 | B2 | * | 10/2014 | Ii ........................ H01R 13/6581 439/607.41 |
| 8,968,031 | B2 | | 3/2015 | Simmel et al. |
| 9,281,642 | B1 | | 3/2016 | Tseng et al. |
| 9,300,095 | B2 | | 3/2016 | Lin et al. |
| 9,312,641 | B2 | | 4/2016 | Wang et al. |
| 9,318,856 | B2 | | 4/2016 | MacDougall et al. |
| 9,373,901 | B2 | * | 6/2016 | Singer .................. H01R 4/4881 |
| 9,379,499 | B2 | | 6/2016 | Miyoshi et al. |
| 2001/0046809 | A1 | * | 11/2001 | Chiran ................. H01R 13/506 439/607.48 |
| 2002/0081904 | A1 | * | 6/2002 | Ko ....................... H01R 13/506 439/607.48 |
| 2002/0142659 | A1 | * | 10/2002 | Nishio ............... H01R 13/6581 439/607.48 |
| 2007/0049100 | A1 | | 3/2007 | Tsai |
| 2007/0212942 | A1 | * | 9/2007 | Long .................... G02B 6/4201 439/607.17 |
| 2008/0003881 | A1 | * | 1/2008 | Wu ..................... H01R 13/5808 439/607.41 |
| 2009/0156027 | A1 | | 6/2009 | Chen |
| 2009/0264018 | A1 | * | 10/2009 | Weber .................. H01R 13/745 439/607.17 |
| 2010/0151734 | A1 | * | 6/2010 | Wu ....................... H01R 13/648 439/607.57 |
| 2013/0095702 | A1 | | 4/2013 | Golko et al. |
| 2013/0323970 | A1 | * | 12/2013 | Wang ................. H01R 13/6471 439/607.08 |
| 2014/0024257 | A1 | | 1/2014 | Castillo et al. |
| 2015/0162684 | A1 | | 6/2015 | Amini et al. |
| 2015/0171562 | A1 | | 6/2015 | Gao et al. |
| 2015/0214673 | A1 | | 7/2015 | Gao et al. |
| 2015/0214674 | A1 | | 7/2015 | Simmel et al. |
| 2015/0295362 | A1 | | 10/2015 | Tziviskos et al. |
| 2015/0340813 | A1 | | 11/2015 | Ng et al. |
| 2015/0340815 | A1 | | 11/2015 | Gao et al. |
| 2015/0340825 | A1 | | 11/2015 | Ng et al. |
| 2016/0118752 | A1 | | 4/2016 | Guo et al. |

FOREIGN PATENT DOCUMENTS

| | | |
|---|---|---|
| CN | 2454802 Y | 10/2001 |
| CN | 2724249 Y | 9/2005 |
| CN | 2728006 Y | 9/2005 |
| CN | 201029143 Y | 2/2008 |
| CN | 201078847 Y | 6/2008 |
| CN | 201107821 Y | 8/2008 |
| CN | 201230066 Y | 4/2009 |
| CN | 101573840 A | 11/2009 |
| CN | 201708399 U | 1/2011 |
| CN | 201717435 U | 1/2011 |
| CN | 201741935 U | 2/2011 |
| CN | 201741937 U | 2/2011 |
| CN | 201868687 U | 6/2011 |
| CN | 102280732 B | 12/2011 |
| CN | 202076514 U | 12/2011 |
| CN | 102437482 A | 5/2012 |

(56) References Cited

FOREIGN PATENT DOCUMENTS

| | | |
|---|---|---|
| CN | 102544812 A | 7/2012 |
| CN | 202423735 | 9/2012 |
| CN | 202513384 U | 10/2012 |
| CN | 202737282 | 2/2013 |
| CN | 103081253 A | 5/2013 |
| CN | 203242848 U | 10/2013 |
| CN | 103427263 A | 12/2013 |
| CN | 203326282 U | 12/2013 |
| CN | 203481540 U | 3/2014 |
| CN | 103762479 A | 4/2014 |
| CN | 203521683 | 4/2014 |
| CN | 204577669 U | 8/2015 |
| TW | M288035 | 2/2006 |
| TW | M357077 | 5/2009 |
| TW | M391213 | 10/2010 |
| TW | M398256 | 2/2011 |
| TW | M398262 | 2/2011 |
| TW | I427870 | 6/2011 |
| TW | M414692 | 10/2011 |
| TW | M426911 | 4/2012 |
| TW | M443957 | 12/2012 |
| TW | M453995 | 5/2013 |
| TW | M454654 | 6/2013 |
| TW | M471688 | 2/2014 |
| TW | M475728 | 4/2014 |
| WO | WO2009147791 | 12/2009 |
| WO | WO2013/020359 | 2/2013 |

OTHER PUBLICATIONS

USB Type-C Specification 0.9c05—May 18, 2014, p. 24-44,47,53-64,84-86.

Universal Serial Bus Type-C Cable and Connector Specification Revision 1.0 Aug. 11, 2014, p. 18-19,28-48,51,55,58,59-63,65-67,70,93,96-99.107,110-113.

* cited by examiner

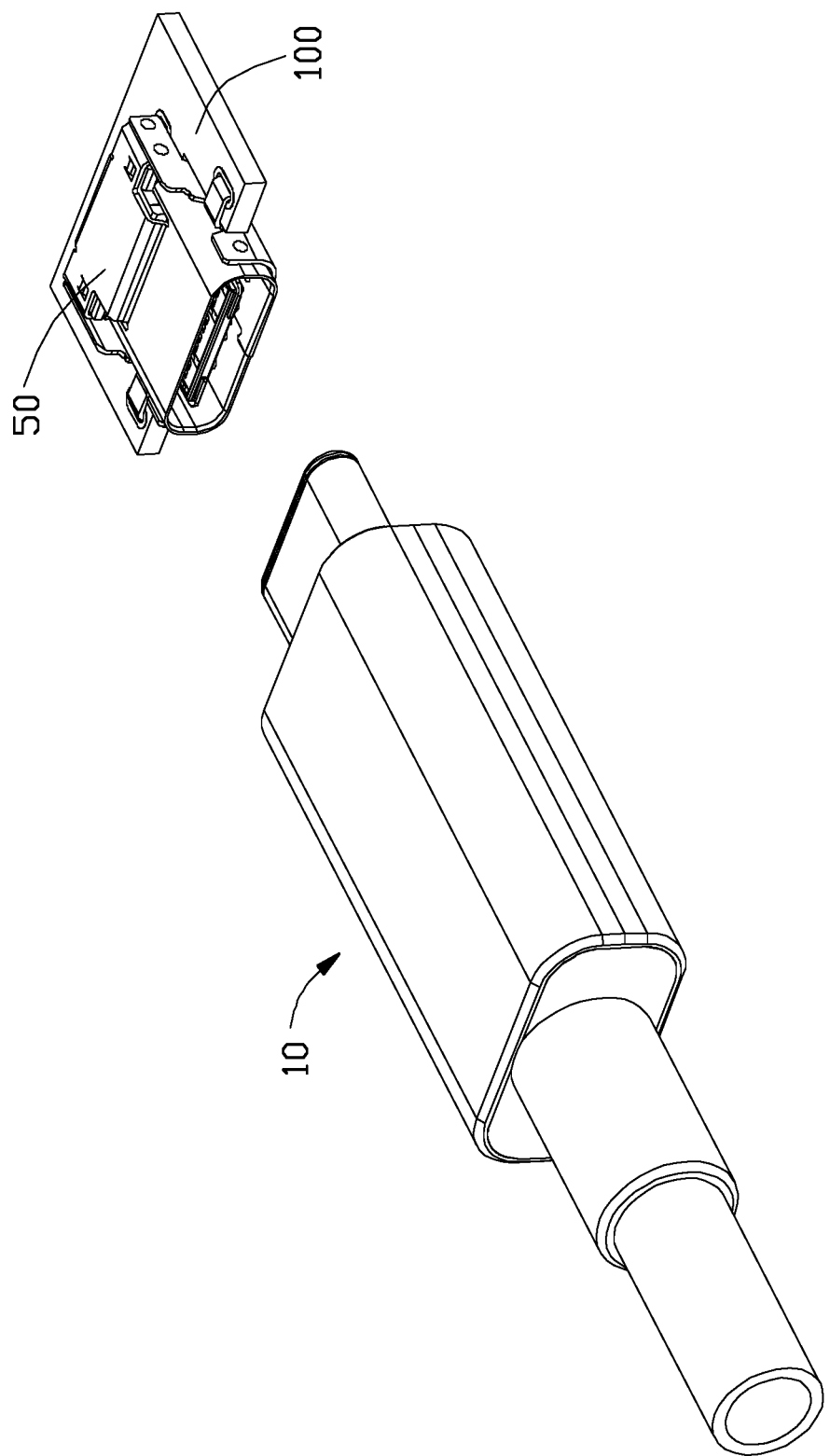

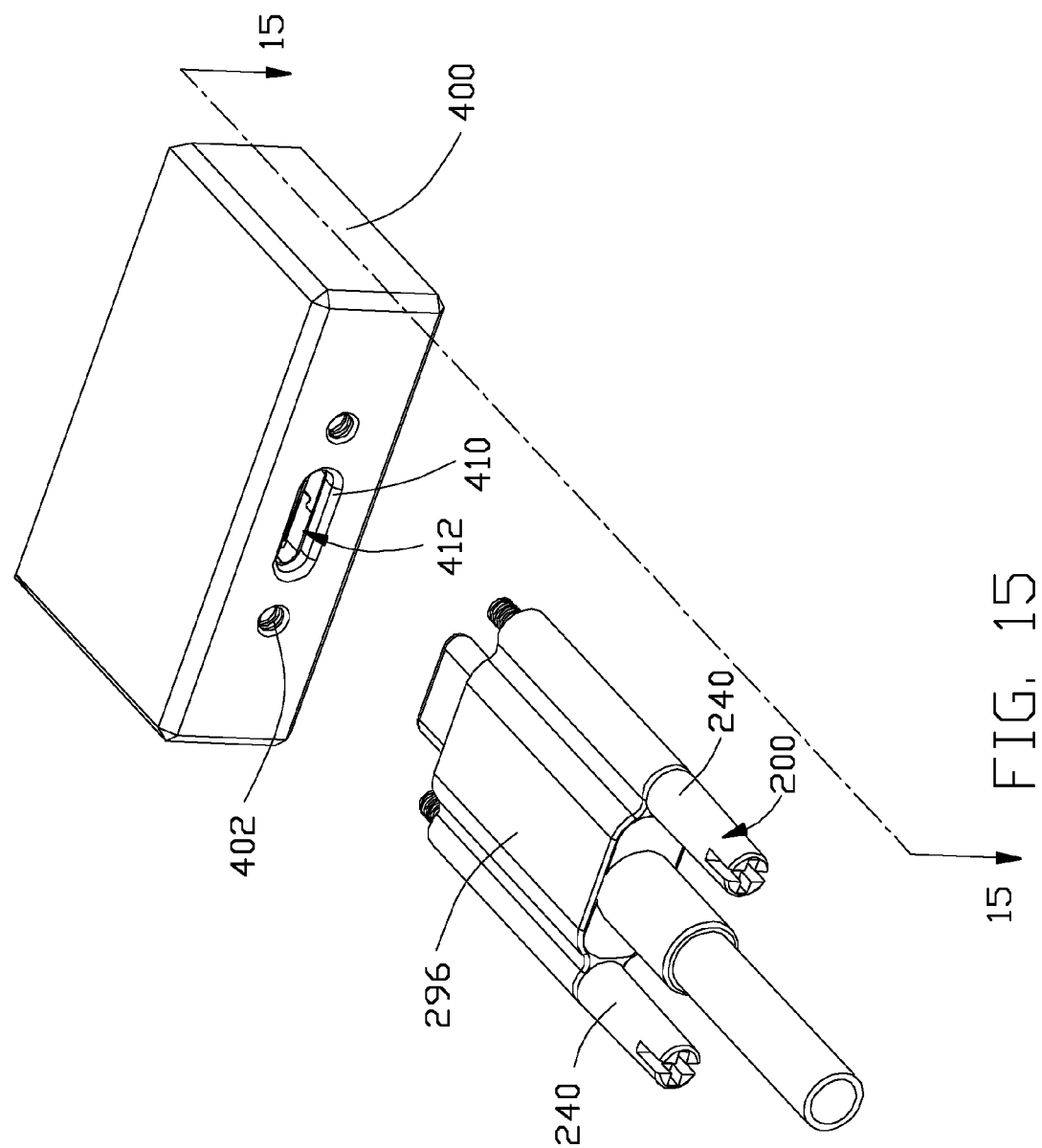

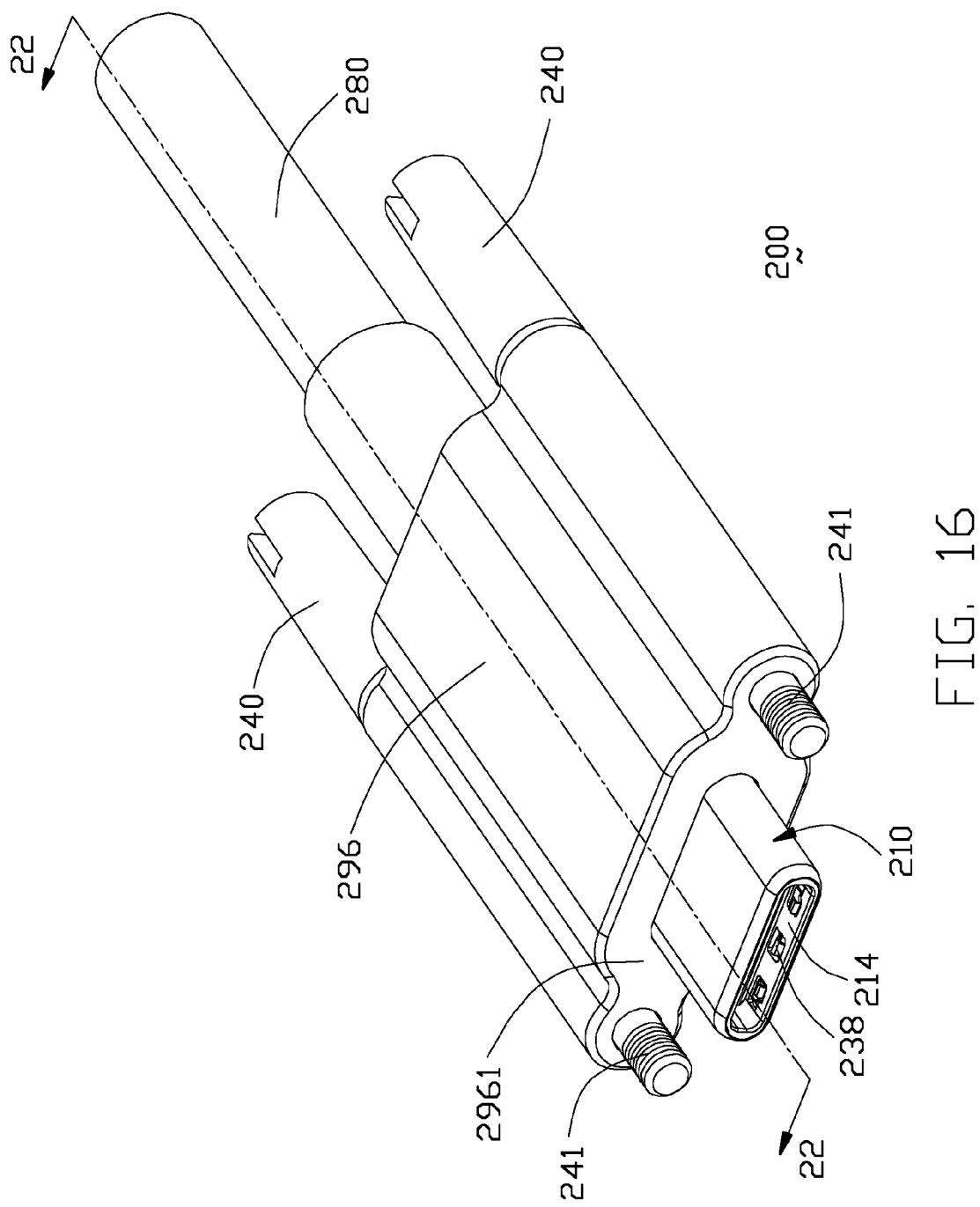

FLIPPABLE ELECTRICAL CONNECTOR

CROSS REFERENCE TO RELATED APPLICATIONS

This application is a continuation application of Ser. No. 14/935,378 filed Nov. 7, 2015, which is a continuation-in-part application of Ser. No. 14/558,732 filed Mar. 12, 2014, and of Ser. No. 14/675,620 filed 31 Mar. 2015, and further claims the benefit of, and priority to, U.S. Provisional Patent Application No. 62/077,166, filed Nov. 7, 2014, and Provisional Patent Application No. 62/095,768, filed Dec. 22, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degradation in the super speed signals. Recently, a proposal for use with the future USB (Universal Serial Bus) was presented.

Hence, a new and simple electrical plug connector and the complementary receptacle connector are desired to improve those disclosed in the aforementioned proposal.

SUMMARY OF THE INVENTION

Accordingly, the object of the present invention is to provide a plug connector for mating with a receptacle connector, comprises an insulative housing defining a receiving cavity communicating with an exterior in a front-to-back direction; two rows of contacts arranged along a transverse direction perpendicular to the front-to-back direction and disposed in the insulative housing with contacting sections of the contacts exposed in said receiving cavity in a vertical direction perpendicular to both front-to-back direction and the transverse direction; a metallic latch including a pair of locking heads located beside the receiving cavity in the transverse direction and extending into receiving cavity; a metallic shell enclosing said housing; and a pair of locking screws located by two sides of the shell and aligned with the pair of locking heads in the transverse direction.

Other objects, advantages and novel features of the invention will become more apparent from the following detailed description when taken in conjunction with the accompanying drawings.

BRIEF DESCRIPTION OF THE DRAWINGS

FIG. 2(A) is a front exploded perspective view of the receptacle connector and the plug connector of FIG. 1.

FIG. 15 is a perspective view of a second embodiment of the receptacle connector enclosed in the case and the plug connector according to the invention.

FIG. 16 is a front perspective view of the plug connector of FIG. 15.

DETAILED DESCRIPTION OF THE PREFERRED EMBODIMENT

Reference will now be made in detail to the preferred embodiment of the present invention.

Figure 1:
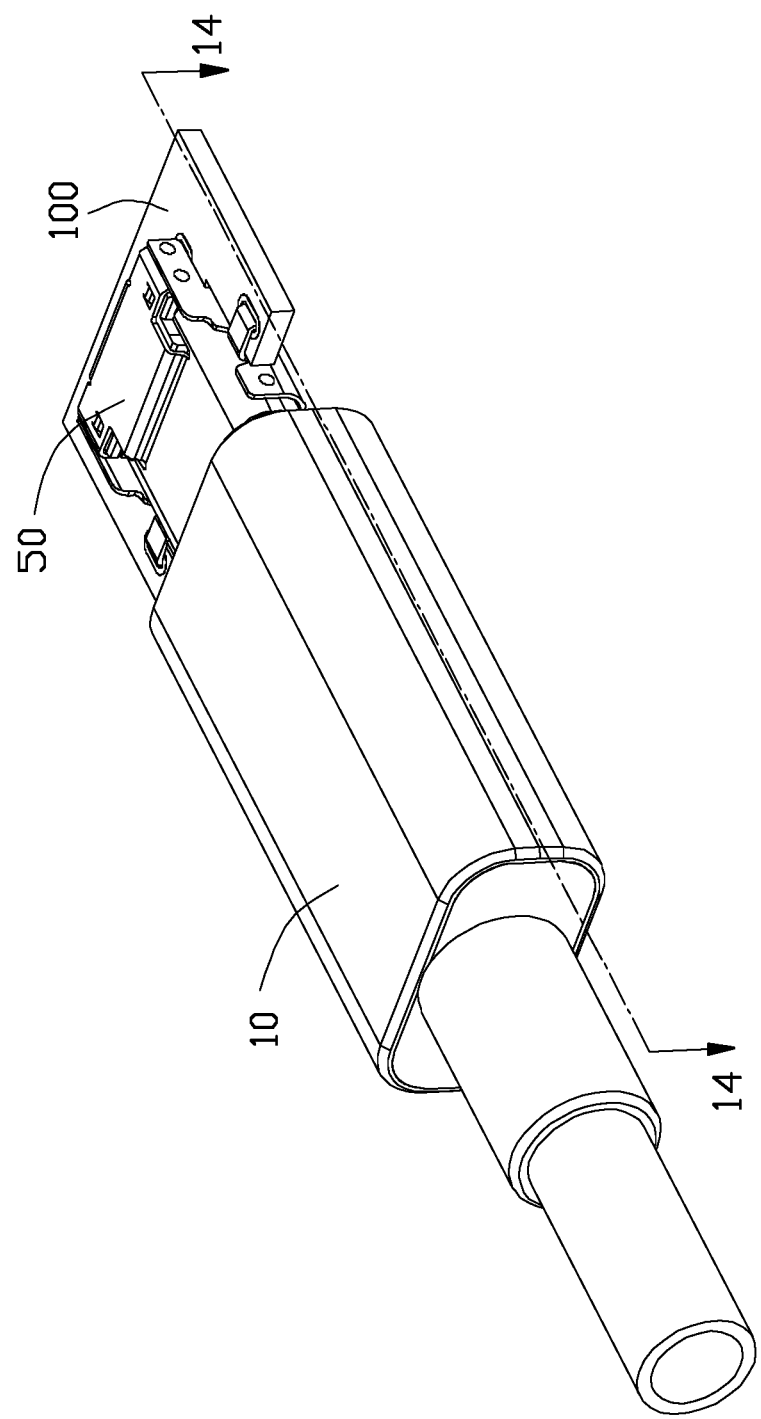
FIG. 1 is an assembled perspective view of the mated receptacle connector on the printed circuit board and the plug connector of a first embodiment of the instant invention.
Figure 2B:
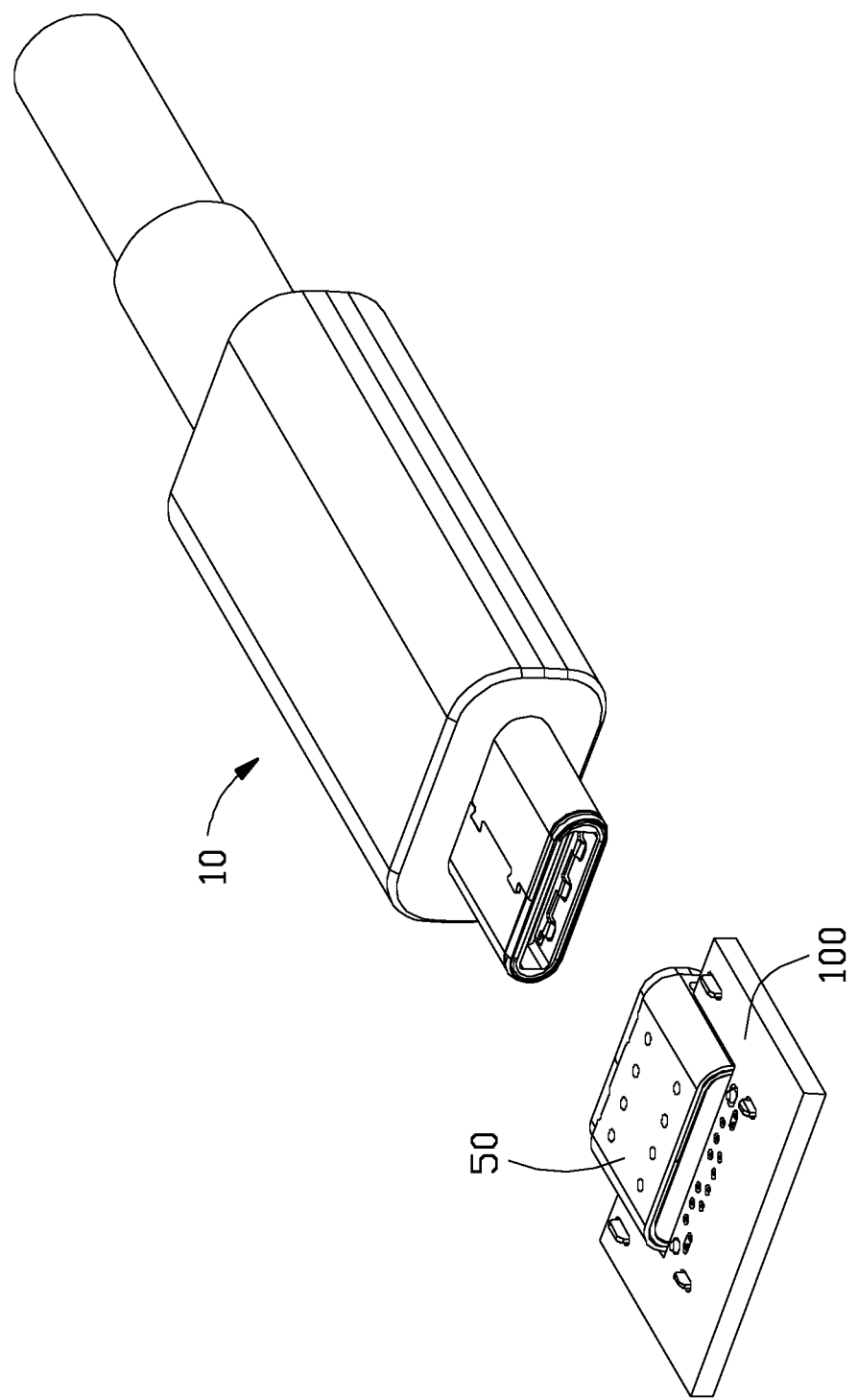
FIG. 2(B) is a rear exploded perspective view of the receptacle connector and the plug connector of FIG. 1.
Figure 3:
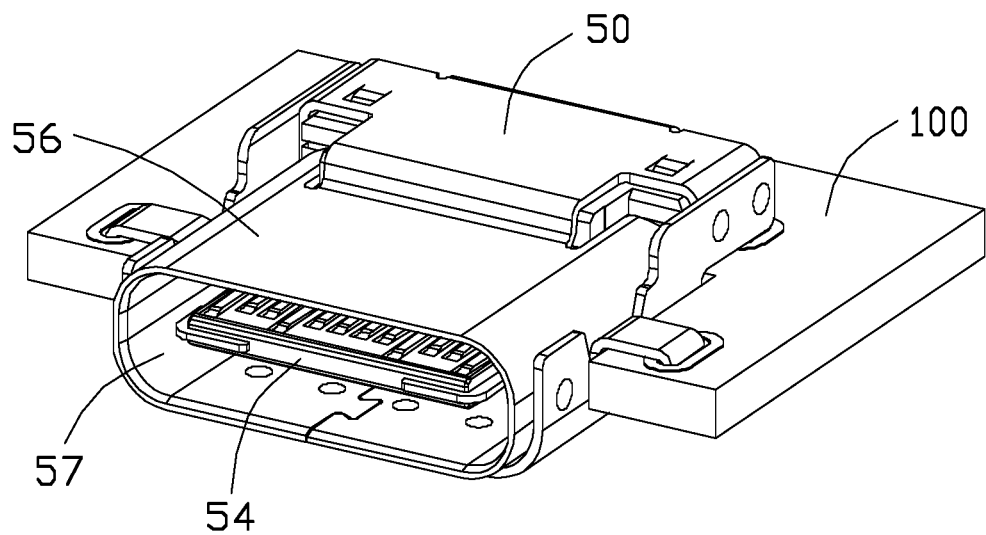
FIG. 3 is a front perspective view of the receptacle connector on the printed circuit board of FIG. 1.
Figure 4:
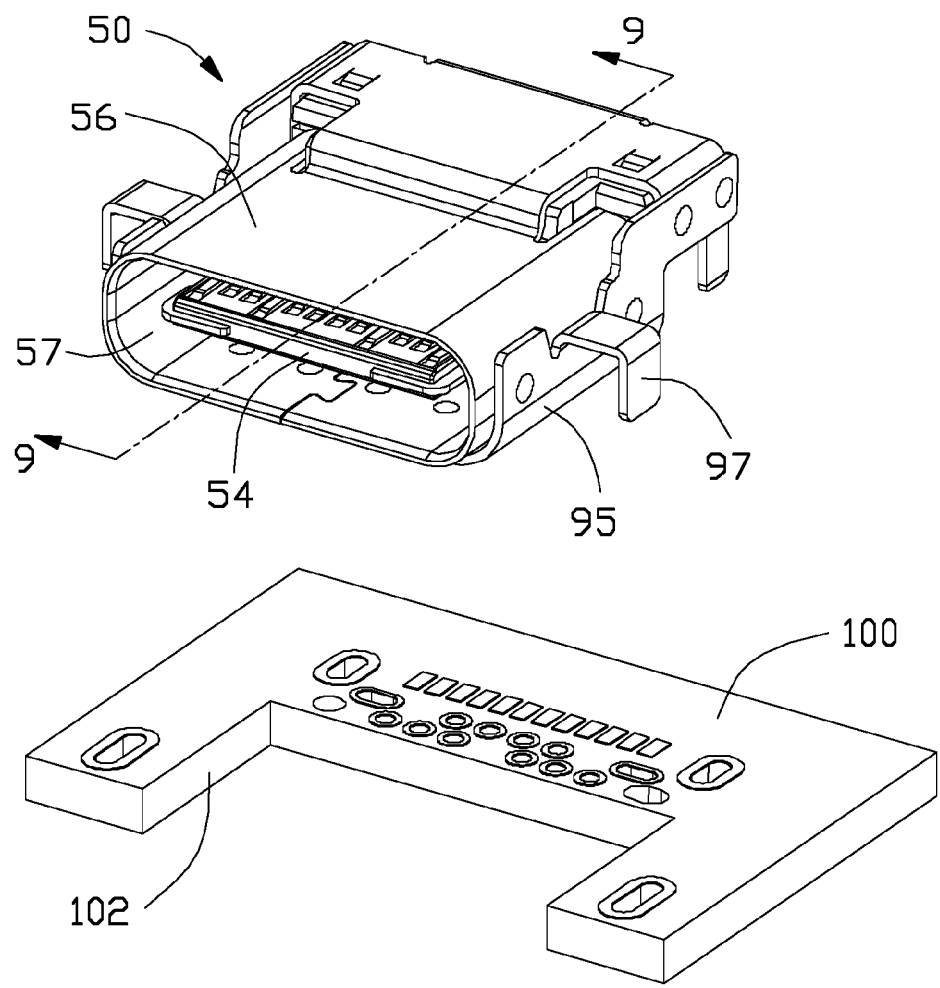
FIG. 4 is a front perspective view of the receptacle connector spaced from the printed circuit board of FIG. 1.
Figure 5A:
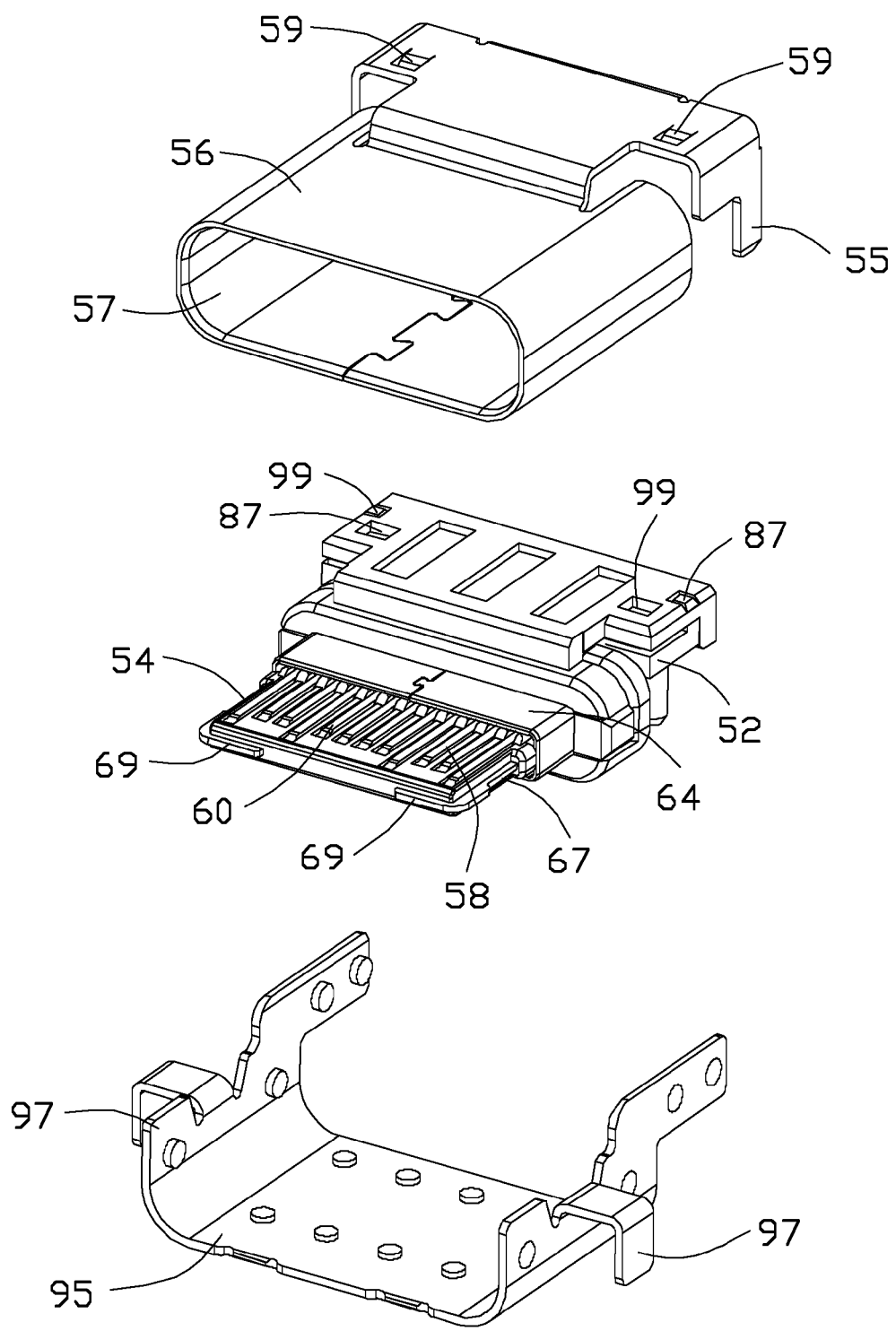
FIG. 5(A) is a front partially exploded perspective view of the receptacle connector of FIG. 1.
Figure 5B:
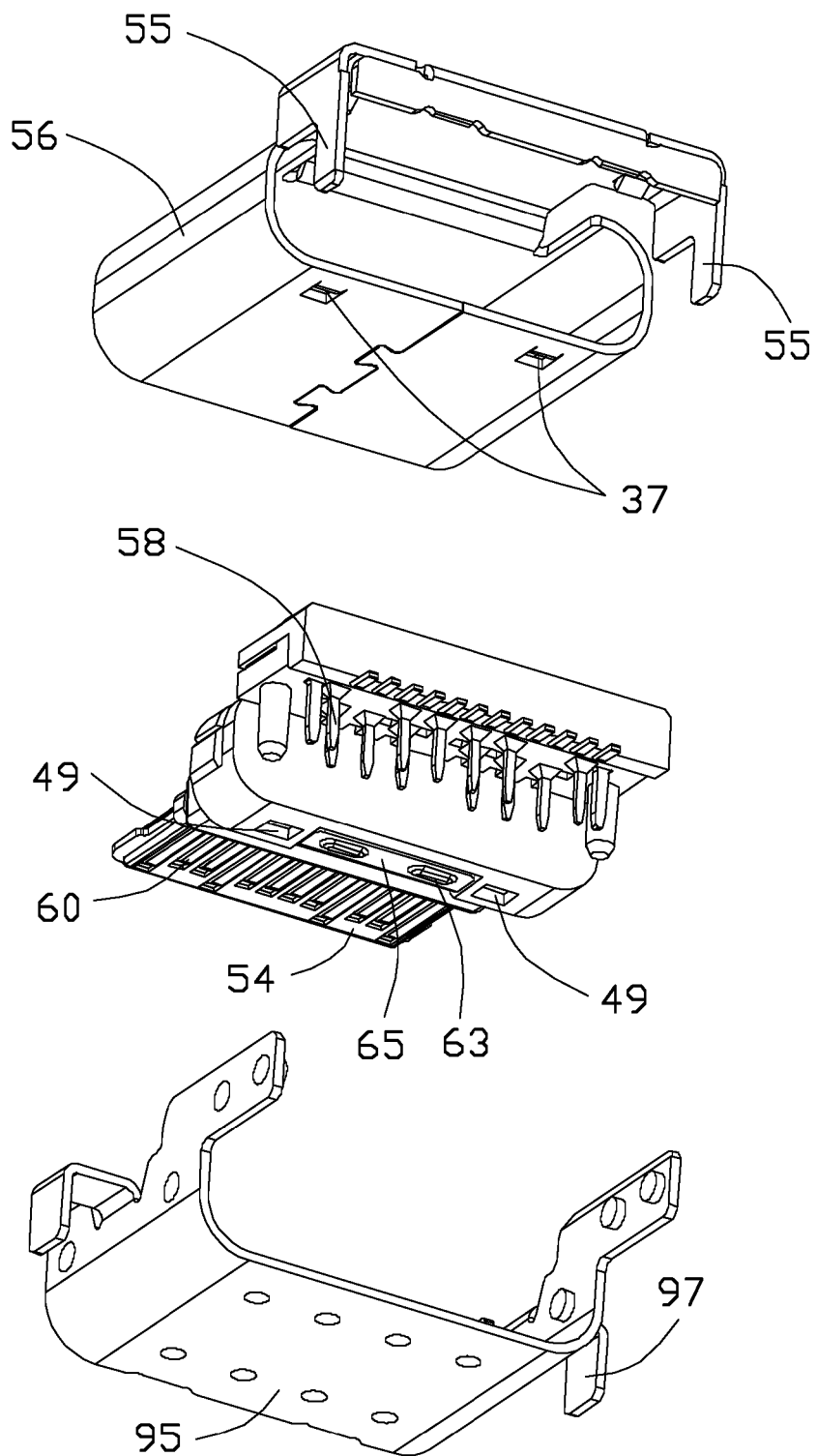
FIG. 5(B) is a rear partially exploded perspective view of the receptacle connector of FIG. 1.
Figure 6:
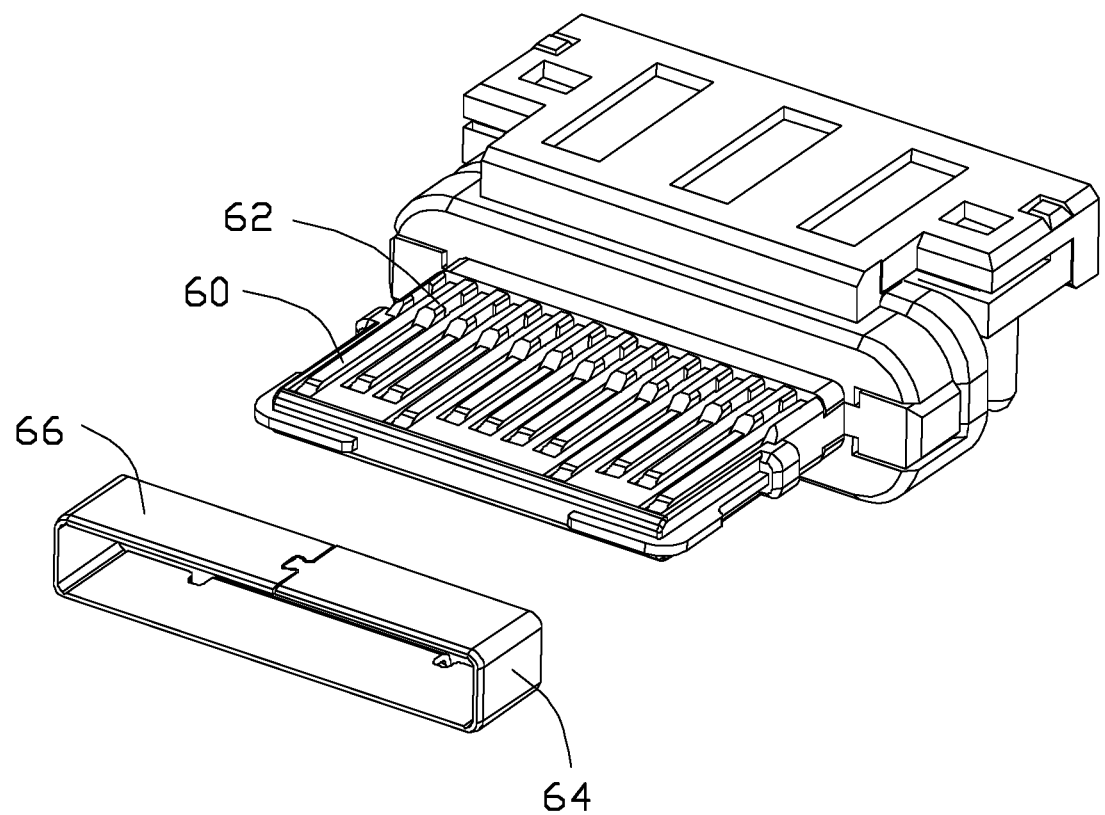
FIG. 6 is a front partially exploded perspective view of the receptacle connector of FIG. 1 without the shield thereof.
Figure 7A:
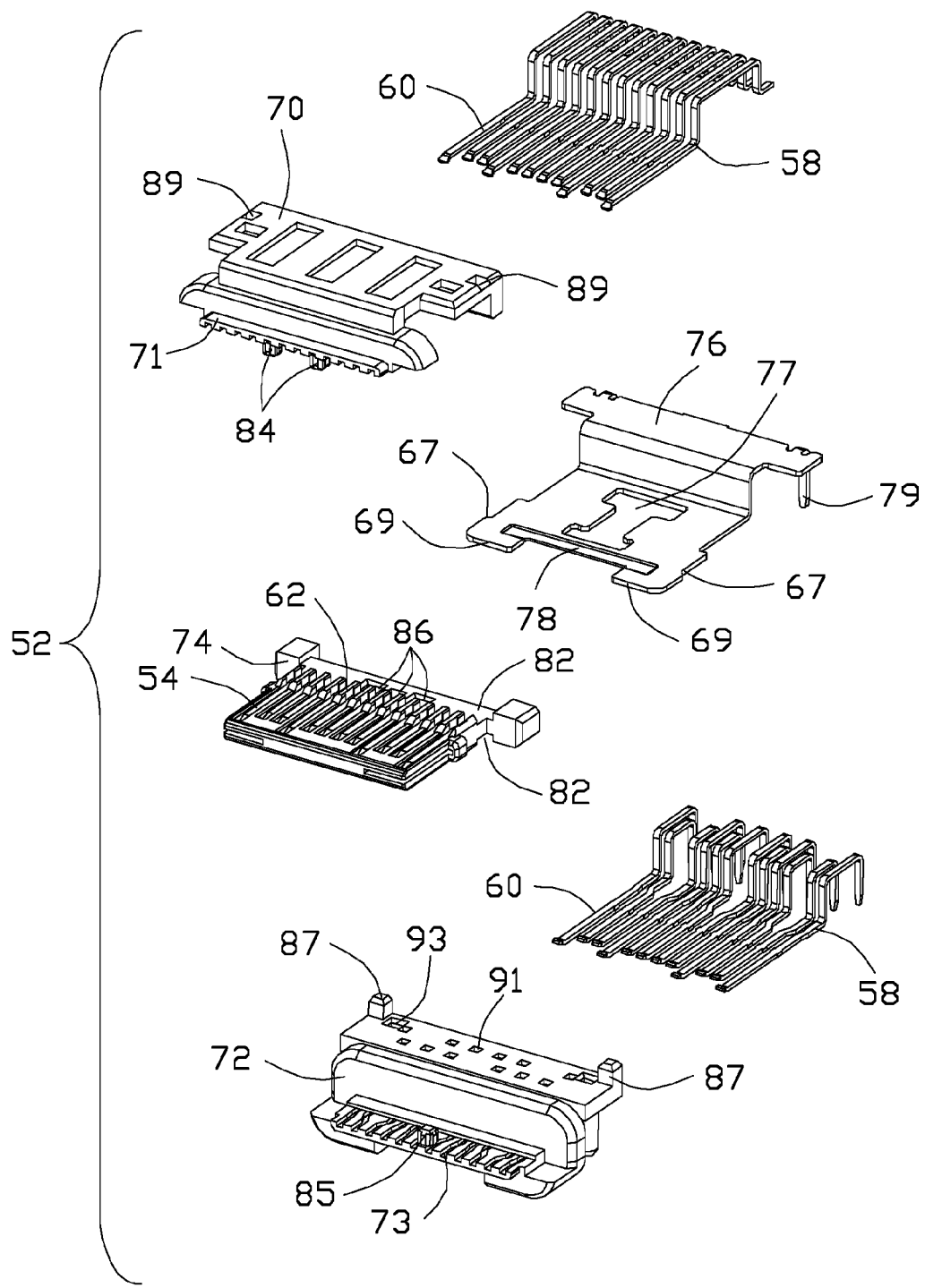
FIG. 7(A) is a front partially exploded perspective view of the receptacle connector of FIG. 1 to show the housing and the contacts thereof.
Figure 7B:
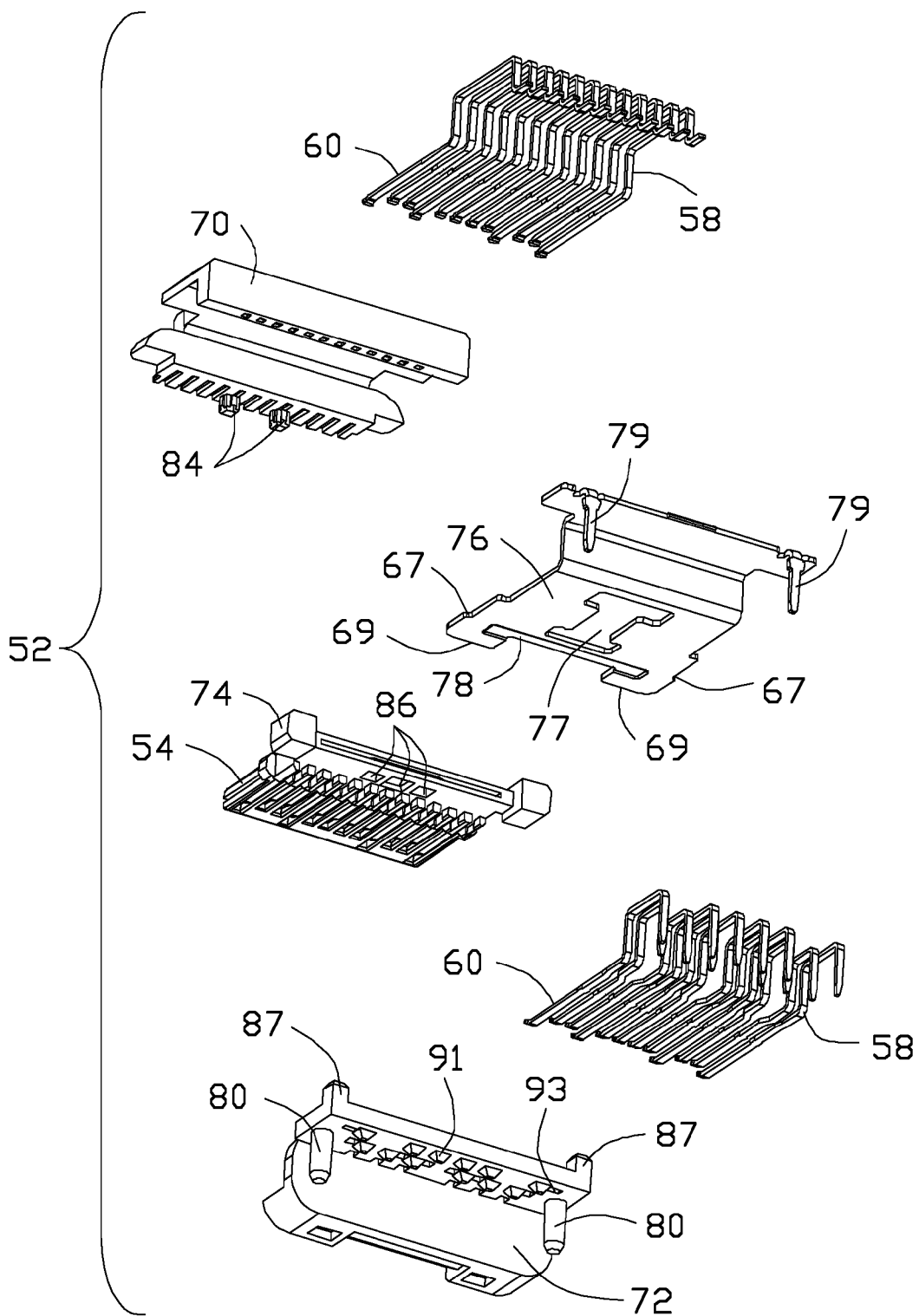
FIG. 7(B) is a rear partially exploded perspective view of the receptacle connector of FIG. 1 to show the housing and the contacts thereof.
Figure 8A:
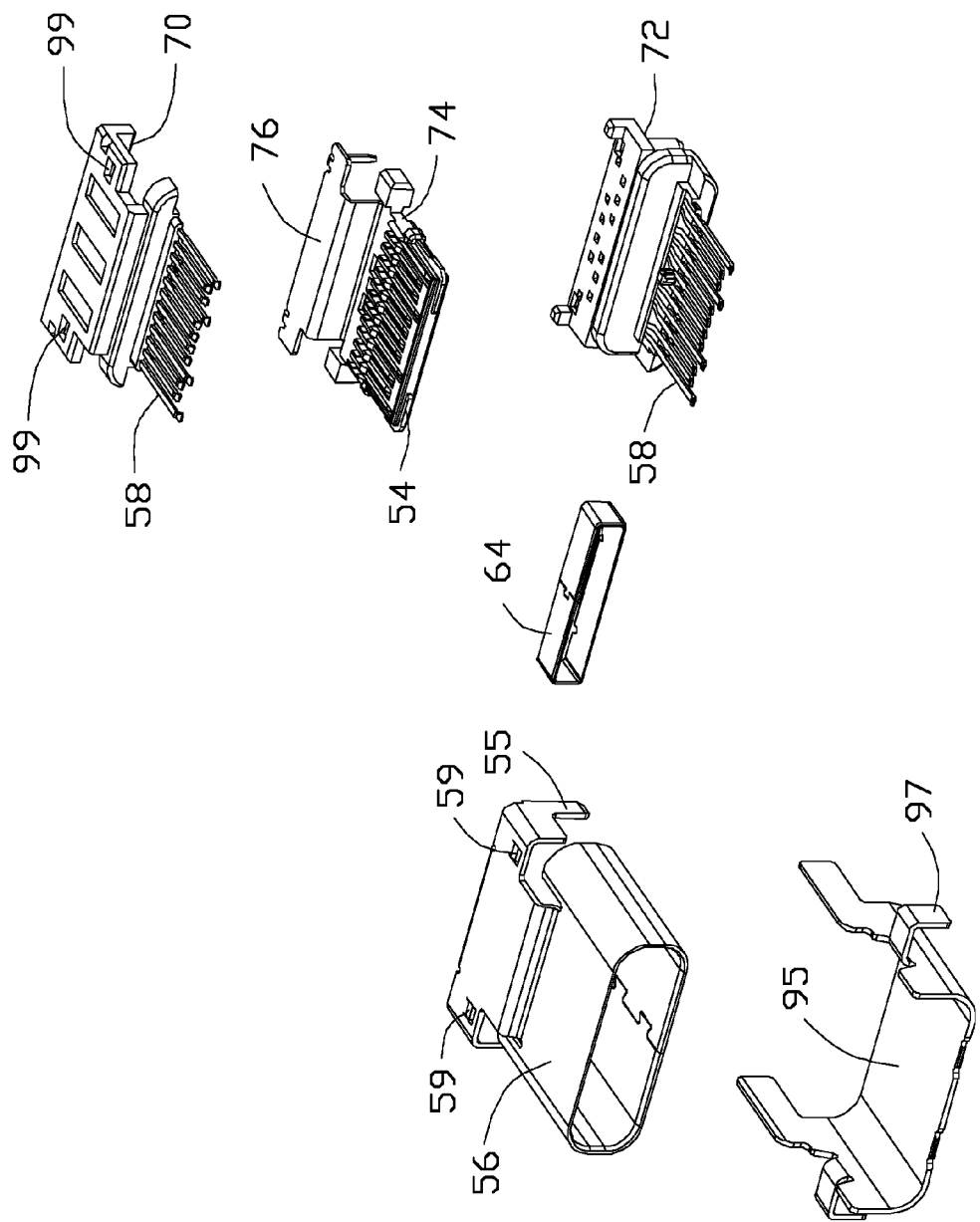
FIG. 8(A) is a front partially exploded perspective view of the receptacle connector of FIG. 1 wherein the housing and the contacts are pre-assembled together.
Figure 8B:
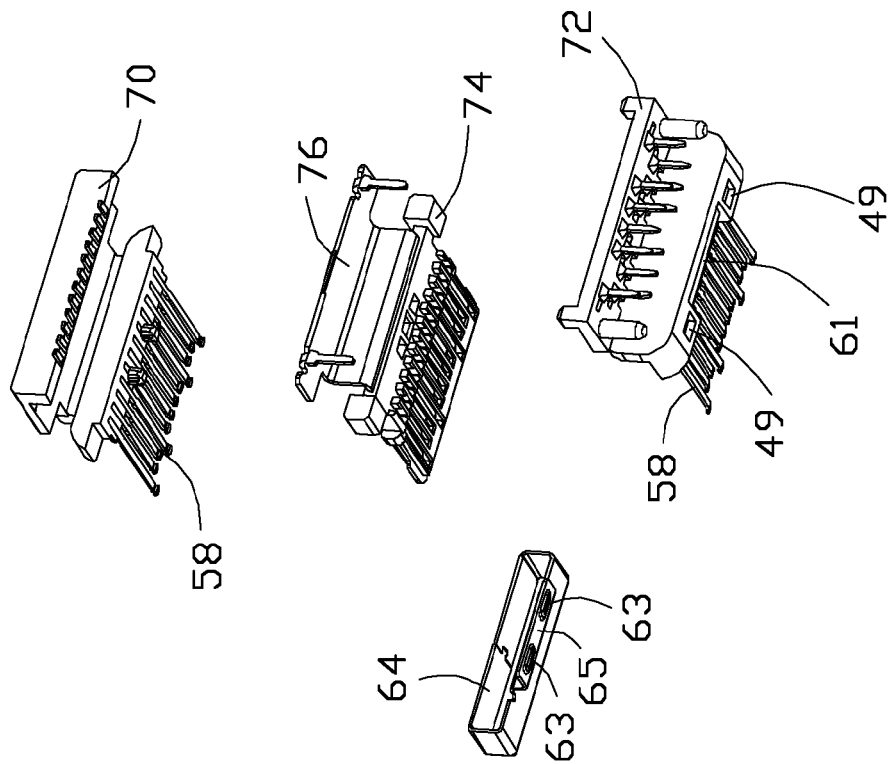
FIG. 8(B) is a rear partially exploded perspective view of the receptacle connector of FIG. 1 wherein the housing and the contacts are pre-assembled together.
Figure 8B:
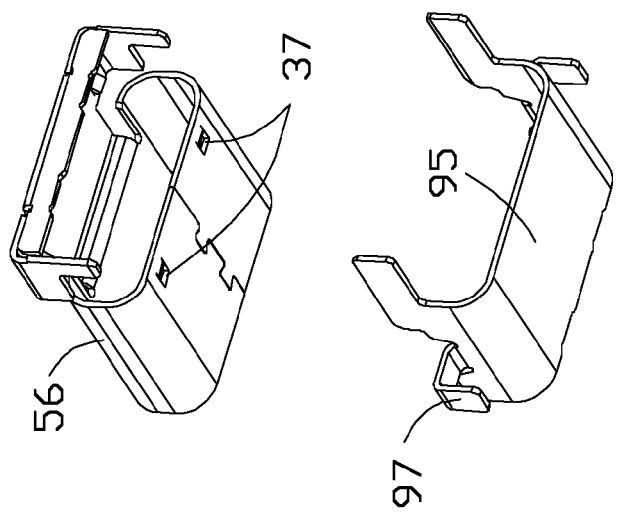
Figure 9:
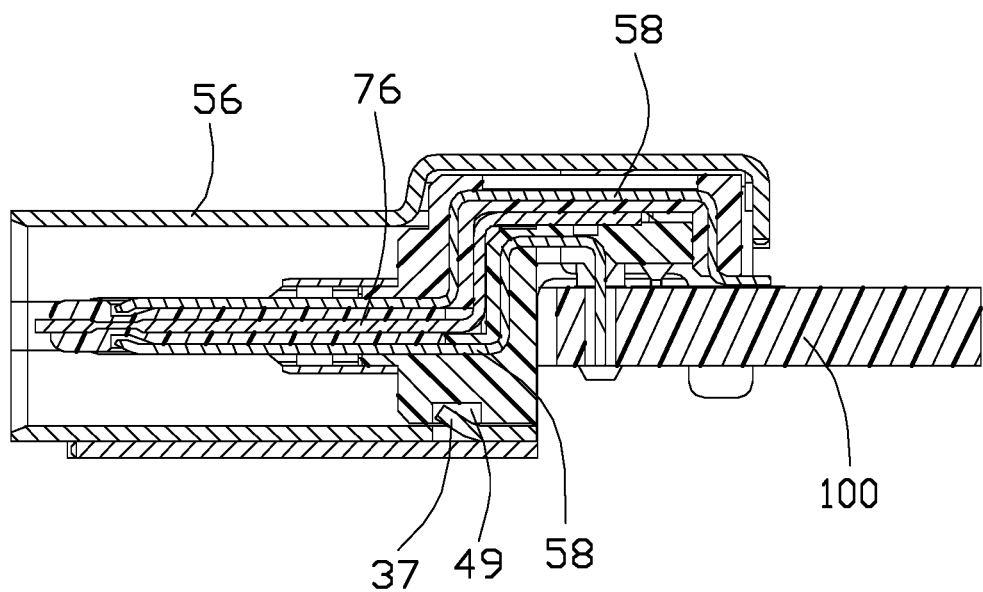
FIG. 9 is a cross-sectional view of the receptacle connector on the printed circuit board of FIG. 1 to show the retention tang of the shield.
Figure 9A:
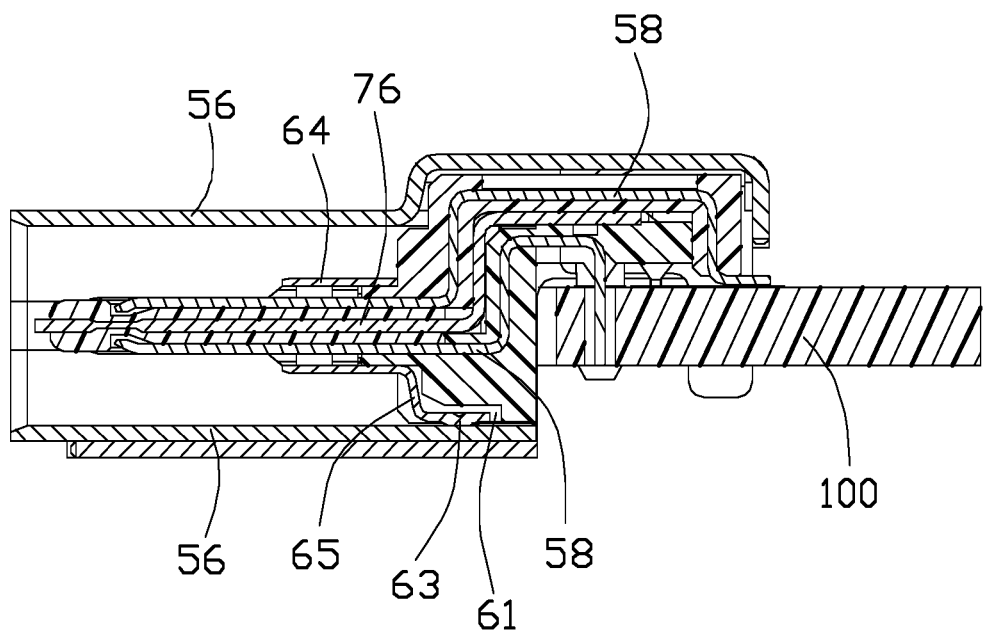
FIG. 9(A) is a cross-sectional view of the receptacle connector to show the extending plate of the collar.
Figure 10:
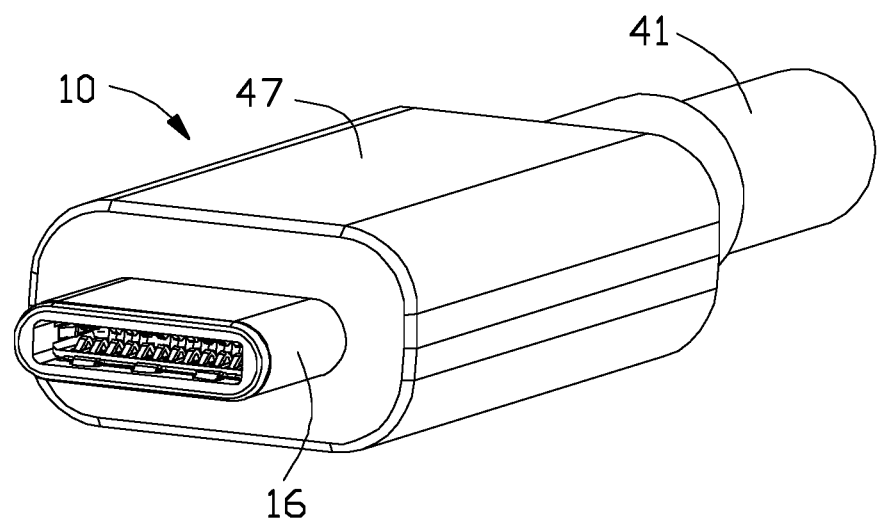
FIG. 10 is a front assembled perspective view of the plug connector of FIG. 1.
Figure 11A:
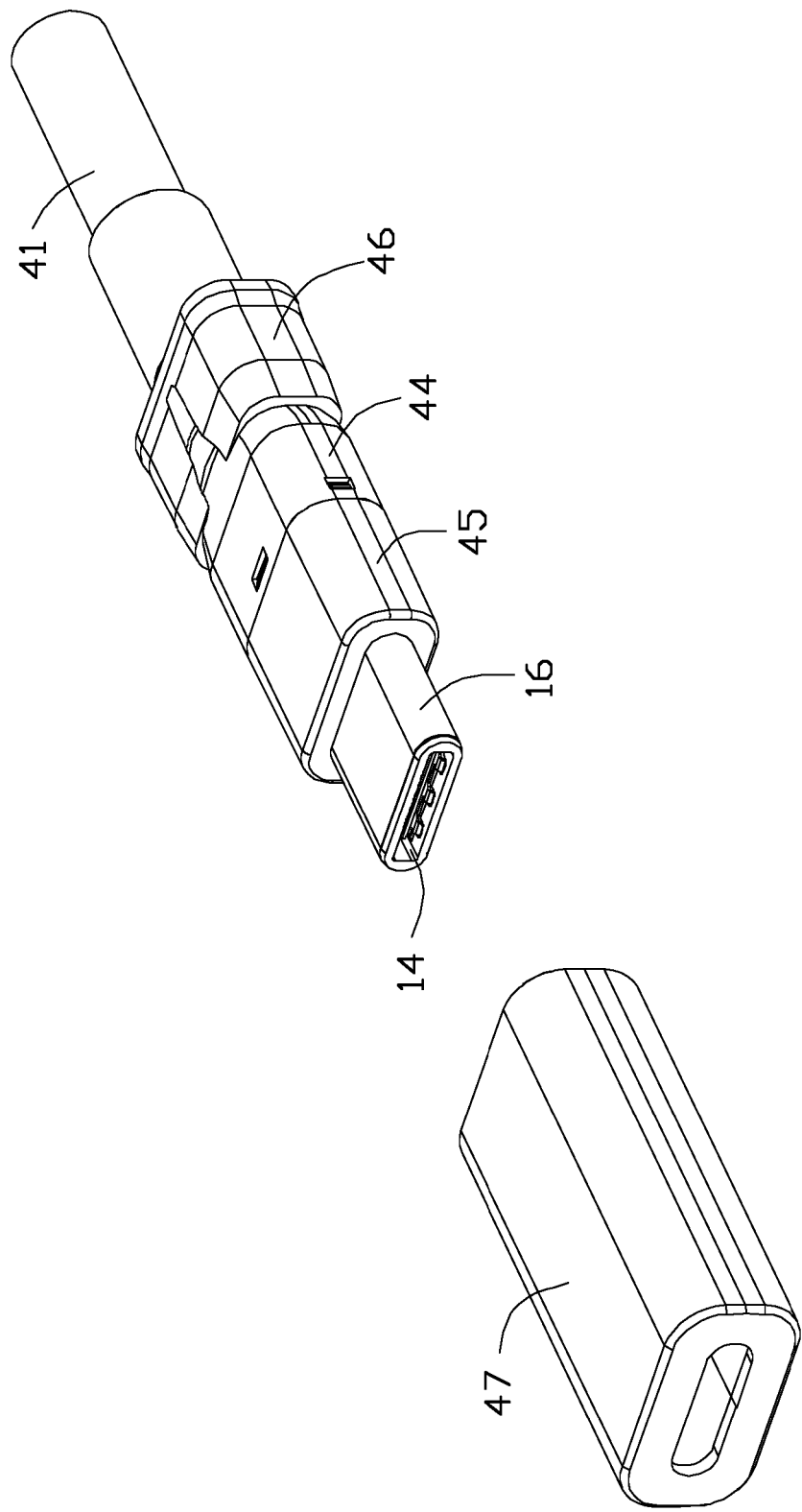
FIG. 11(A) is a front partially exploded perspective view of the plug connector of FIG. 1 wherein the cover is removed away from the remainder.
Figure 11B:
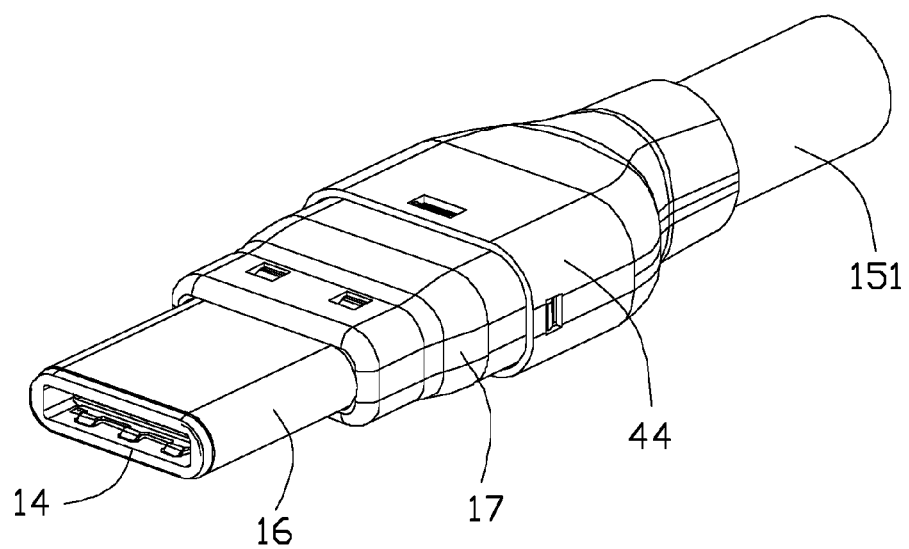
FIG. 11(B) is a front partially exploded perspective view of the plug connector of FIG. 11(A) wherein the front and rear over-moldings have been further removed.
Figure 12A:
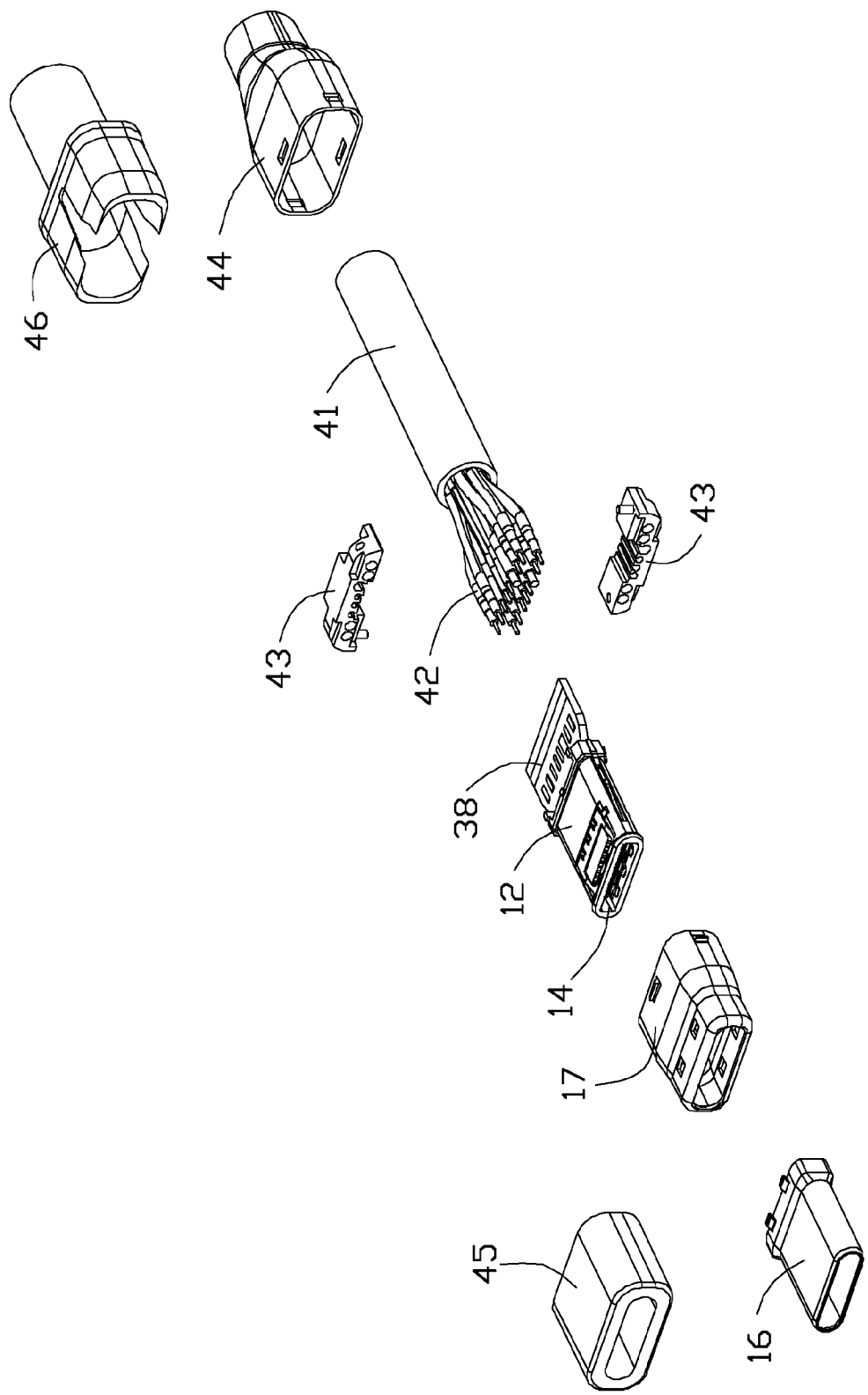
FIG. 12(A) is a front partially exploded perspective view of the plug connector of FIG. 1 without the cover thereof.
Figure 12B:
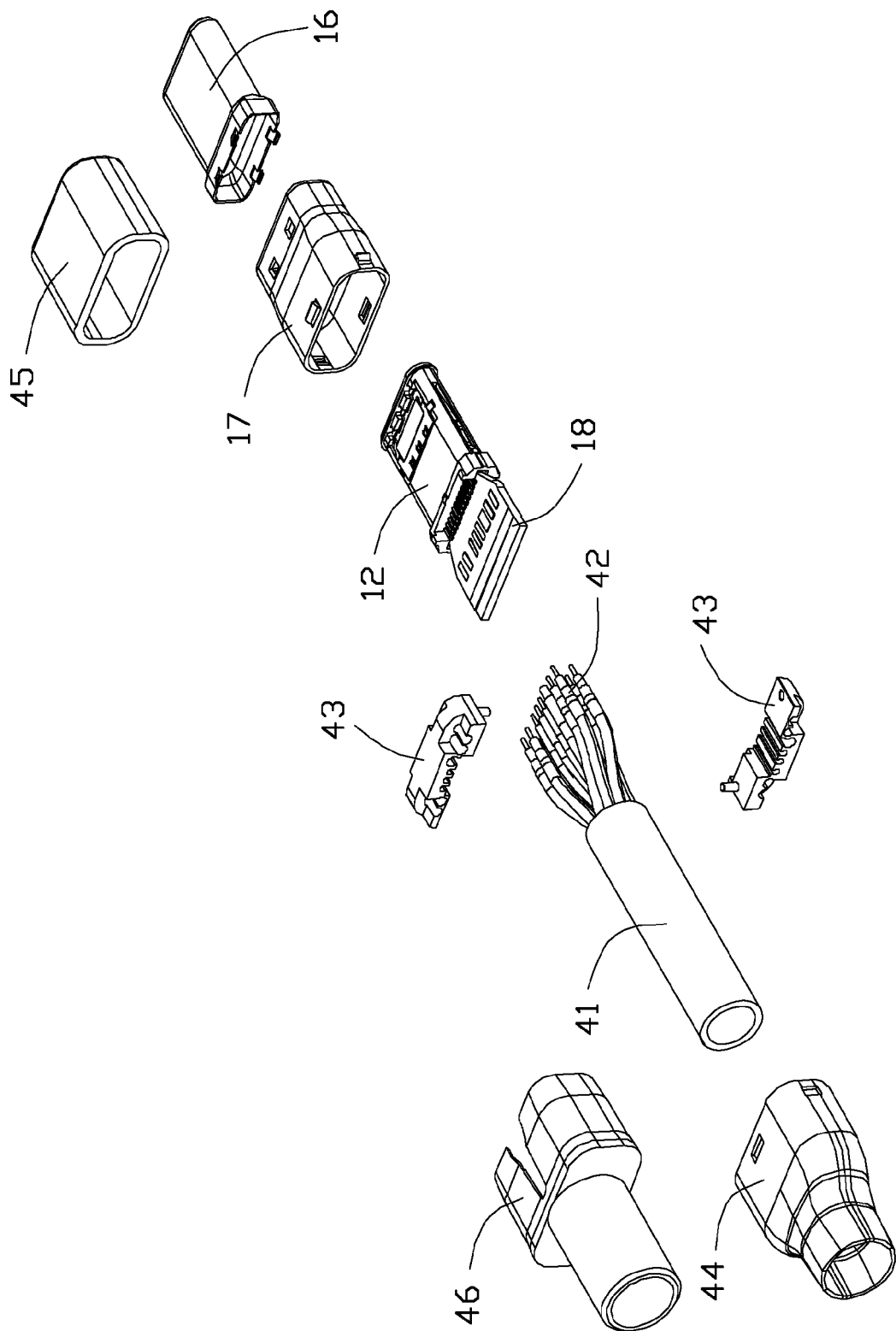
FIG. 12(B) is a rear partially exploded perspective view of the plug connector of FIG. 12(A).
Figure 13A:
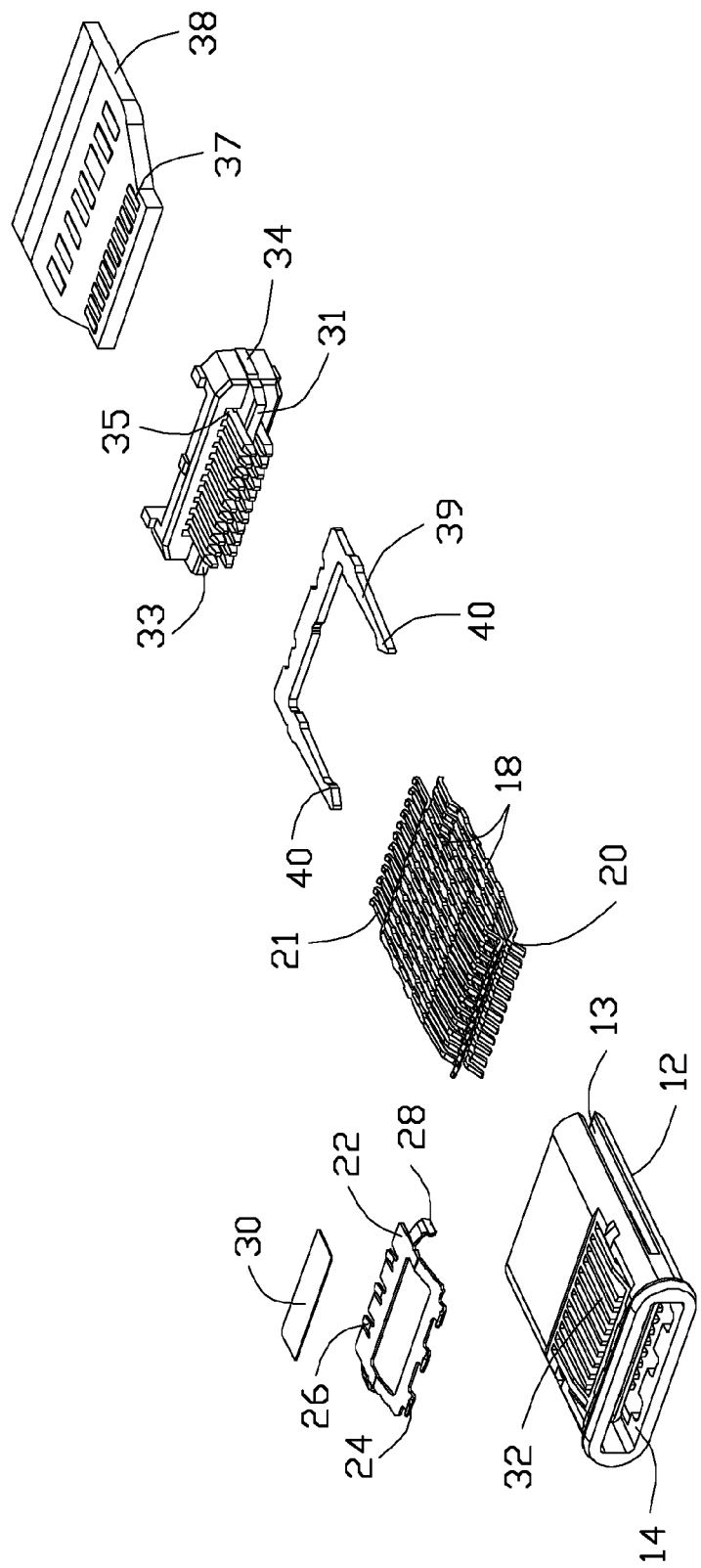
FIG. 13(A) is a front partially exploded perspective view of the plug connector of FIG. 12(A) by removal of additional parts therefrom.
Figure 13B:
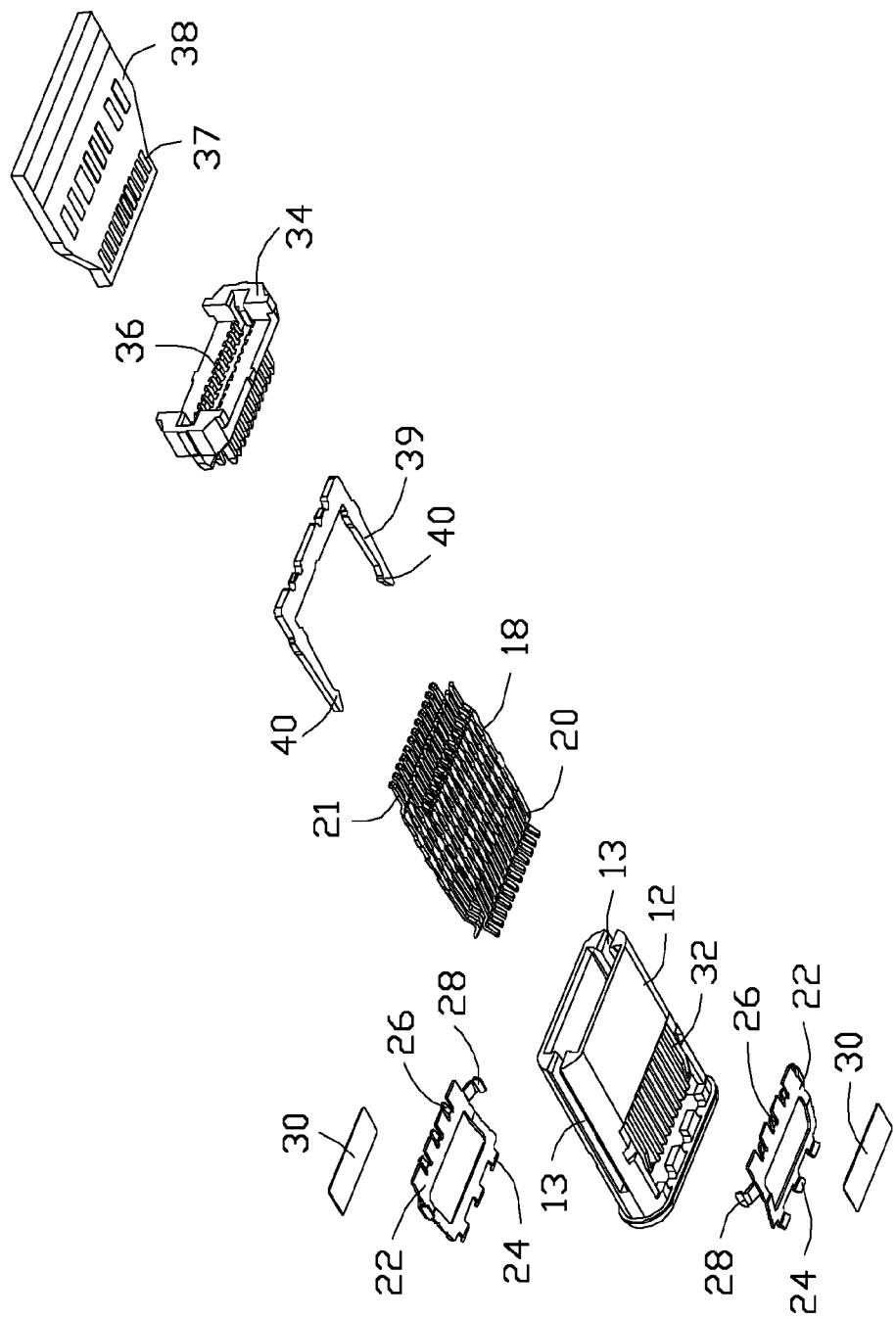
FIG. 13(B) is a rear partially exploded perspective view of the plug connector of FIG. 13(A).

FIGS. 1-14 shows a first embodiment of this present invention. FIGS. 1-2(B) show a plug connector 10 mated with a receptacle connector 50 mounted in a notch 102 of a printed circuit board. 100. Referring to FIGS. 3-9, the receptacle connector 50 includes an insulative housing 52 with a mating tongue 54 forwardly extending in a capsular mating cavity 57 of a metallic shield 56 which encloses the housing 52. Opposite upper and lower rows of contacts 58 are disposed in the housing 52 with corresponding contacting sections 60 exposed upon opposite surfaces of the mating tongue 54 in a diagonally symmetrical arrangement mechanically and electrically so as to allow a so-called flappable insertion of the plug connector 10 thereinto. A step structure 62 is formed around a root of the mating tongue 54. A one piece metallic EMI collar 64 includes a loop structure 66 intimately surrounding the step structure 62. The collar 64 further includes an L-shaped extending plate 65 equipped with embossments 63 thereon and received in the recess 61 of the lower piece 72 of the housing 52 (illustrated later) for mechanically and electrically connecting to the shield 56.

The housing 52 is composed of the upper piece 70 and a lower piece 72 commonly sandwiching therebetween a middle piece 74 which forms the mating tongue 54. The upper row contacts 58 are associated with the upper piece 70, the lower row contacts 58 are associated with a lower piece 72 and the shielding plate 76 is associated with the middle piece 74 via an insert molding process wherein the contacting sections 60 of the upper row contacts 58 and those of the lower rows contacts 58 are seated upon opposite upper surface and lower surface of the mating tongue 54, respectively, as mentioned before. Understandably, the housing 52 and the associated contacts 58 may be deemed wholly as a so-called terminal module implying the terminals being integrally formed within an insulator. A rear portion of the step structure 62 is removed to have a front edge region 71 of the upper piece 70 and the front edge region 73 of the lower piece 72 sandwiched between the middle piece 74 and the loop structure 66 of the EMI collar 64 so as to enhance the strength during mating under some bending. In this embodiment, the shielding plate 76 defines an opening 77 and a thinner area 78 for both securing and impedance consideration, and further a pair of mounting legs 79 so as to efficiently separate the upper row contacts 58 and the lower row contacts 58 from each other wherein the upper row contacts 58 form the surface mount type tail sections while the lower row contacts 58 form the through hole type tail sections. In an alternate embodiment, the thinner area 78 may be totally removed from the shielding plate 76. The lower piece 72 includes a pair of mounting posts 80 receiving in the corresponding through hole for mounting the housing 52 to the printed circuit board 100.

The lower piece 72 further forms a pair of recessions 49 to receive the corresponding retention tangs 37 of the shield 56.

In this embodiment, the middle piece 74 forms a pair of recesses 82 to respectively receive the corresponding protrusions 84 of the upper piece 70 and the lower piece 72 for securing the upper piece 70, the lower piece 72 and the middle piece 74 therebetween in a stacked manner wherein the upper piece 70 further include a pair of downward assembling poles 84 received in the corresponding alignment holes 86 of the middle piece 74, and the lower piece 72 further includes an upward assembling pole 85 received in the corresponding alignment holes 86 of the middle piece 74, and the lower piece 72 further forms a pair of upward locating posts 87 received within the corresponding recesses 89 in the upper piece 70. In this embodiment, the lower piece 72 defines a plurality of through holes 91 and 93 to receive the tail sections of the lower row contacts 58 and the mounting legs 79 of the shielding plate 76 to extend therethough as an alignment spacer. Notably, the shielding plate 76 forms a front edge section 69 extending forwardly beyond a front edge of the mating tongue 54 for antimismating consideration, and a pair of lateral edge sections 67 extending either beyond or behind the side edge of the mating tongue 54 for locking with a latch 39 of the plug connector 10 (illustrated later). Understandably, the latch 39 may continuously contact the lateral edge sections 67 during the mating procedure from the initial mating position around the corner of the shielding plate 76 to the final locking position around a notch structure of the lateral edge section 67. In brief, the shielding plate 76 is essentially multifunctional to perform shielding, grounding, reinforcing, anti-mis-mating and locking. A metallic bracket 95 is soldered under the shield 56 and forms a pair of supporting legs 97 mounted into the through hole 103 of the printed circuit board 100 for supporting the receptacle connector 50 within the notch 102 of the printed circuit board 100. The shield 56 further includes an upside-down U-shaped structure (not labeled) on a rear portion covering the rear portion of the housing 52 with a pair of mounting legs 55 received in the through holes 104 for mounting to the printed circuit board 100 and a pair of locking tabs 59 received in the recesses 99 of the upper piece 70 after the shield 56 is rearwardly assembled to the housing 52 in a front-to-back direction. Notably, the mounting leg 79 of the shielding plate 76 share the same through hole with the neighboring grounding contact tail for enhancing grounding effect.

Figure 14:
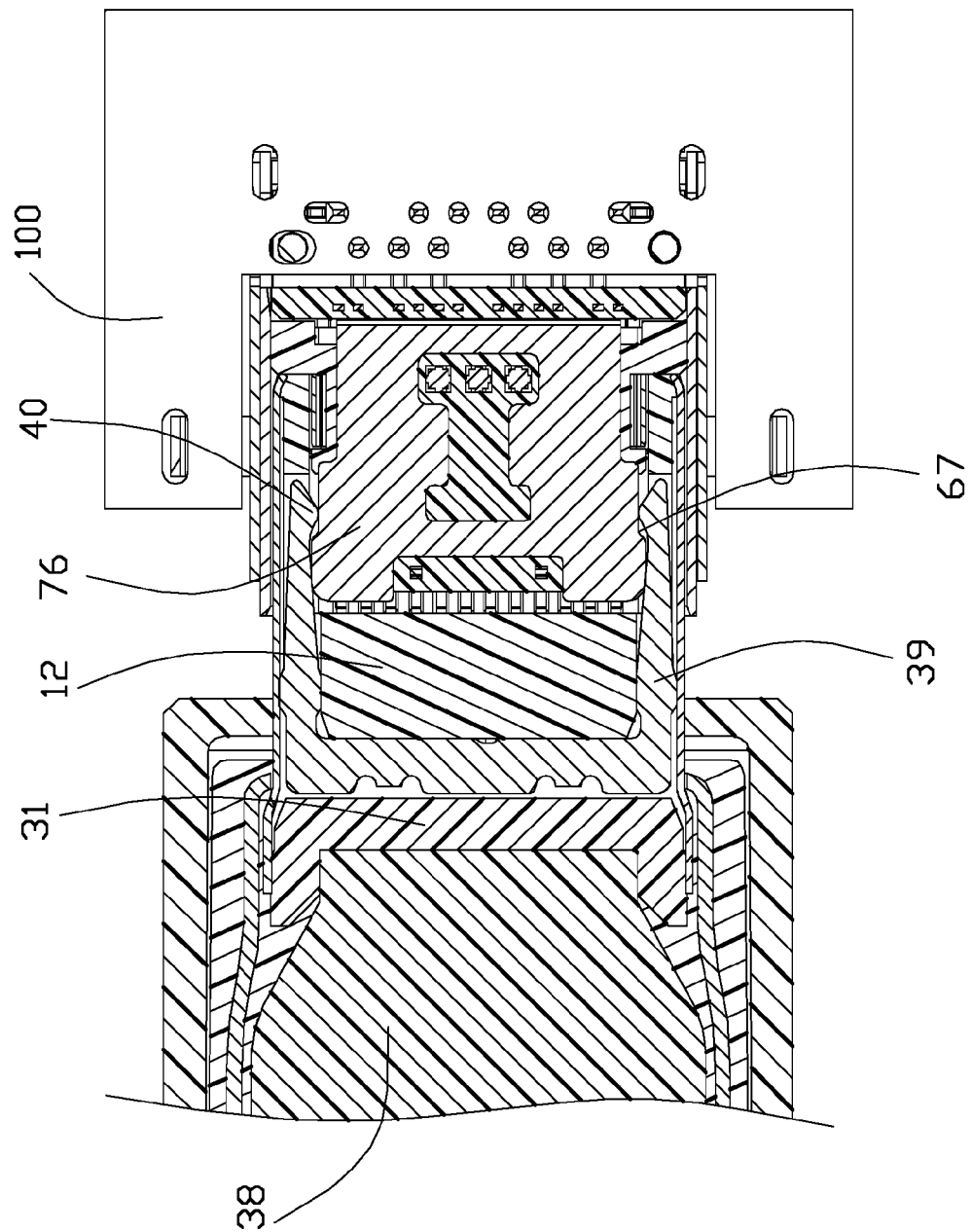
FIG. 14 is a cross-sectional view of the mated plug connector and receptacle connector of FIG. 1 to show how the latch of the plug connector is lockable engaged with the shielding plate of the receptacle connector.

Referring to FIGS. 10-13(B) and further FIG. 14, the plug connector 10 includes an insulative housing 12 having a capsular front contour with a rectangular receiving cavity 14 therein and enclosed in a metallic shell 16. Opposite upper and lower rows of contacts 18 are disposed in the corresponding passageways 32 of the housing with corresponding contacting sections 20 extending into the receiving cavity 14 wherein the upper and lower rows of contacts 18 are diagonally symmetrically arranged with each other in both electrical and mechanical arrangement so as to meet the so-called flappable mating, i.e., the dual opposite orientations. A pair of metallic upper and lower EMI (Electro-Magnetic Interference) spring plates 22 are enclosed in the shell 16, and each of the EMI spring plates 22 is sandwiched between the shell 16 and the housing 12 and includes a front resilient region 24 extending inwardly toward and into the receiving cavity 14 and in front of the contacting sections 20, a rear abutting region 26 to abut against the shell 16, and a pair of side retention regions 28 retainably engaged within corresponding side portions of the housing 12. A pair of tapes 30 are disposed upon two opposite sides of the housing 12 so as to isolate the contacting section 20 from the shell 16. A spacer 34 is located behind the housing and defines a plurality of passages 35 through which the tail sections 21 of the contacts 18 rearwardly extend. A recessed region 36 is formed in a rear face of the spacer 34 to receive a front edge region of a paddle card 38 wherein the tail sections 21 of the contacts 18 extending through the corresponding passages 35, are soldered upon the corresponding pads 37. The spacer 34 forms a forward extending blade 31 with a pair of forward protrusions 33 on two sides to be commonly inserted into a back side of the housing 12 wherein the protrusions 33 of the blade 31 are essentially received in the side slots 13 of the housing 12. A U-shaped metallic latch 39 of a blanking type received in the side slots 13 of the housing 12 with a pair of locking heads 40 extending into the two opposite lateral sides of the receiving cavity 14 to lock with the lateral edge sections 67 of the shielding plate 76 of the receptacle connector 50 during mating. Understandably, the latch 39 is restrained by the blade 31, the comb structures on the blade 31, the protrusions 33 of the blade 31, the slots 13 and an interior rear face of the housing 12.

A cable 41 behind the paddle card 38, encloses a plurality of wires 42 regulated by a pair of organizer 43 to be soldered upon a rear region of the paddle card 38. Via the protrusions and openings (not labeled), an auxiliary rear shell 17 grasps the shell 16 to shield the paddle card 38, and a clipper 44 grasps the rear shell 17 and further the cable 41 behind the paddle card 38. Opposite front overcoat 45 and rear overcoat or strain relief 46 are overmolded upon the rear shell 17 and the clipper 44, respectively. Finally, a cover 47 essentially fully covers the clipper 44, the front overcoat 45 and the rear overcoat 46. During mating, the mating tongue 54 is received in the receiving cavity 14 with the corresponding contacting sections 60 of the contacts 58 of the receptacle connector 50 connected to the contacting sections 20 of the contacts 18 of the plug connector 10 wherein the latch 39 is locked with the shielding plate 76, and the front resilient region 24 of the spring plate 22 contacts the collar 64.

FIGS. 15-23 shows a second embodiment of this present invention, wherein a plug connector 200 is adapted to be mated with the corresponding receptacle connector 410 disposed in a case 400. The plug connector 200 includes a mating part 210 essentially composed of the insulative housing 212 having a capsular contour and enclosed within a metallic (front) shell 208 and defining a receiving cavity 214, upper and lower rows of passageways 216 beside the receiving cavity 214 in the vertical direction, upper and lower rows of contacts 220 disposed within the corresponding passageways 216, respectively. Each of the contacts, 220 includes a front mating section 222 extending into the receiving cavity 214 for mating with the contact of the receptacle connector, and a rear connecting section 224 for mounting to a paddle card 230. A pair of metallic spring plates 236 are disposed upon opposite surfaces of the housing 212 with spring fingers 238 extending, via corresponding through holes 213 in the housing 212, into the receiving cavity 214. A pair of insulative tapes 239 are attached upon the spring plates 238 to isolate the spring plate 236 from contacting the metallic shell 208. A metallic latch 250 is formed with a U-shaped structure to be assembled to the U-shaped channel 215 in the housing 210 with a pair of locking heads 252 extending into the receiving cavity 214. An insulative spacer 260 is located behind the housing 210 and forms a central slot 262 to receive a front region of the paddle card 230, a plurality of passages 264 to receive the connecting sections 224 which are mechanically and electrically connected to the front region of the paddle card 230, and a pair of apertures 266 to receive the corresponding pair of legs 254 of the latch 250 which are mechanically and electrically connected to the front region of the paddle card 230. In this embodiment, the spacer 260 forms a pair of recessions 261 to receive the corresponding protrusions 217 of the housing 212.

An insulative wire organizer 270 is composed of a pair of parts 272 and located behind the paddle card 230. Each of the parts 272 includes a plurality of through holes 274 along a front-to-back direction. A cable 280 is located behind the organizer 270 and includes a plurality of wires 282 extending through the corresponding through holes 274, respectively, with the corresponding inner conductors electrically and mechanically connected to a rear region of the paddle card 230. A metallic middle shell 286 is assembled to a rear portion of the shell 208 to enclose the paddle card 230, and a metallic rear shell 288 is assembled to a rear portion of the middle shell 288 and encloses a front segment of the cable 280. An insulative front inner cover 290 encloses the middle shell 286 and an insulative rear inner cover 292 encloses the rear shell 288. An insulative outer cover 296 encloses the front inner cover 290, the rear shell 288 and the rear inner cover 292. The outer cover 296 forms a pair of channels 298 with a pair of screws 240 retained therein and extending therethrough with screws 241 exposed at front tips and operation knobs 242 at rear ends. The mating part 210 extends forwardly beyond a front face 2961 of the outer cover 296 for mating with the receptacle connector 410.

Figure 15A:
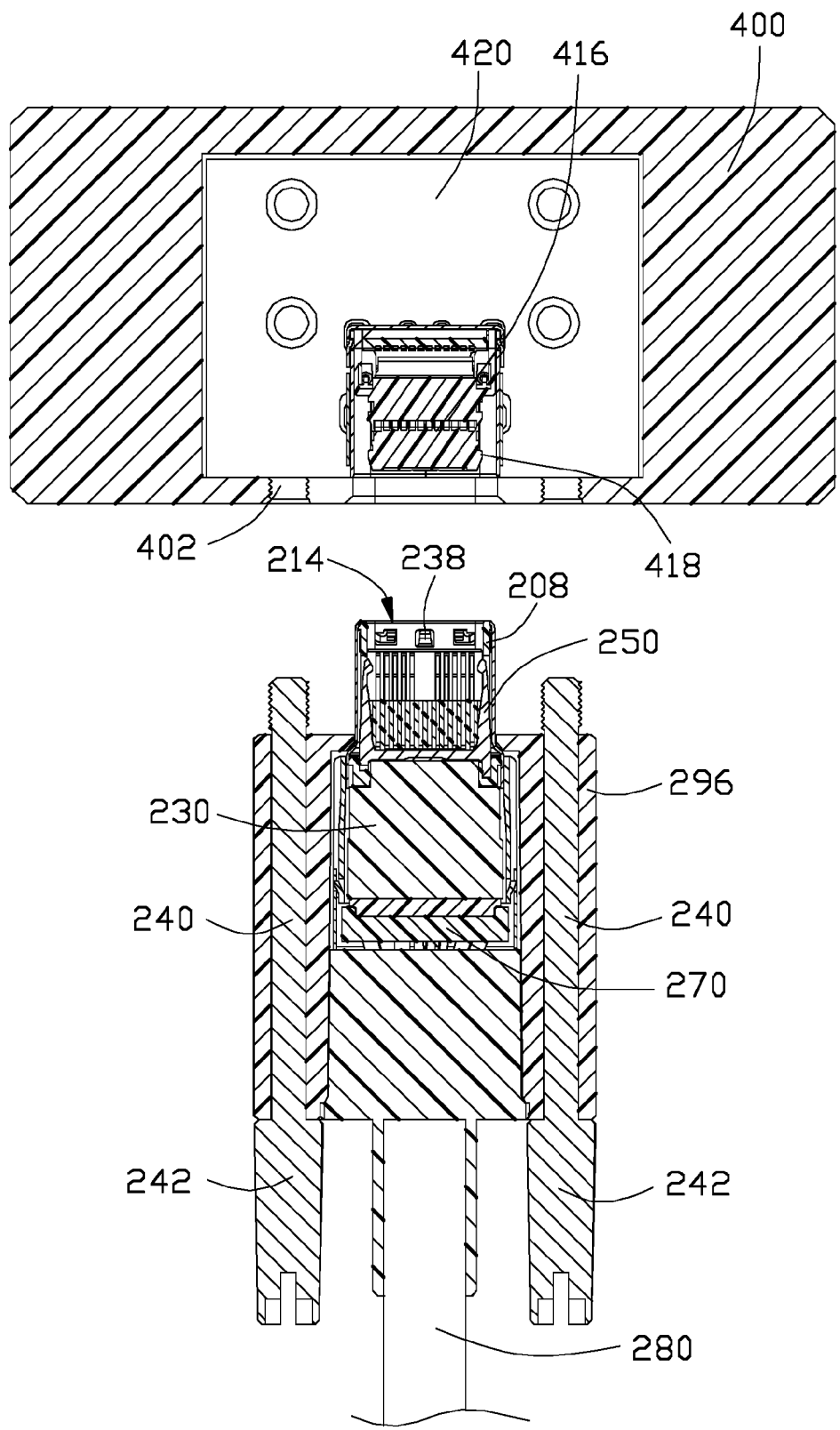
FIG. 15(A) is a cross-sectional view of the receptacle connector and the plug connector taken along lines 15-15 in FIG. 15.
Figure 16A:
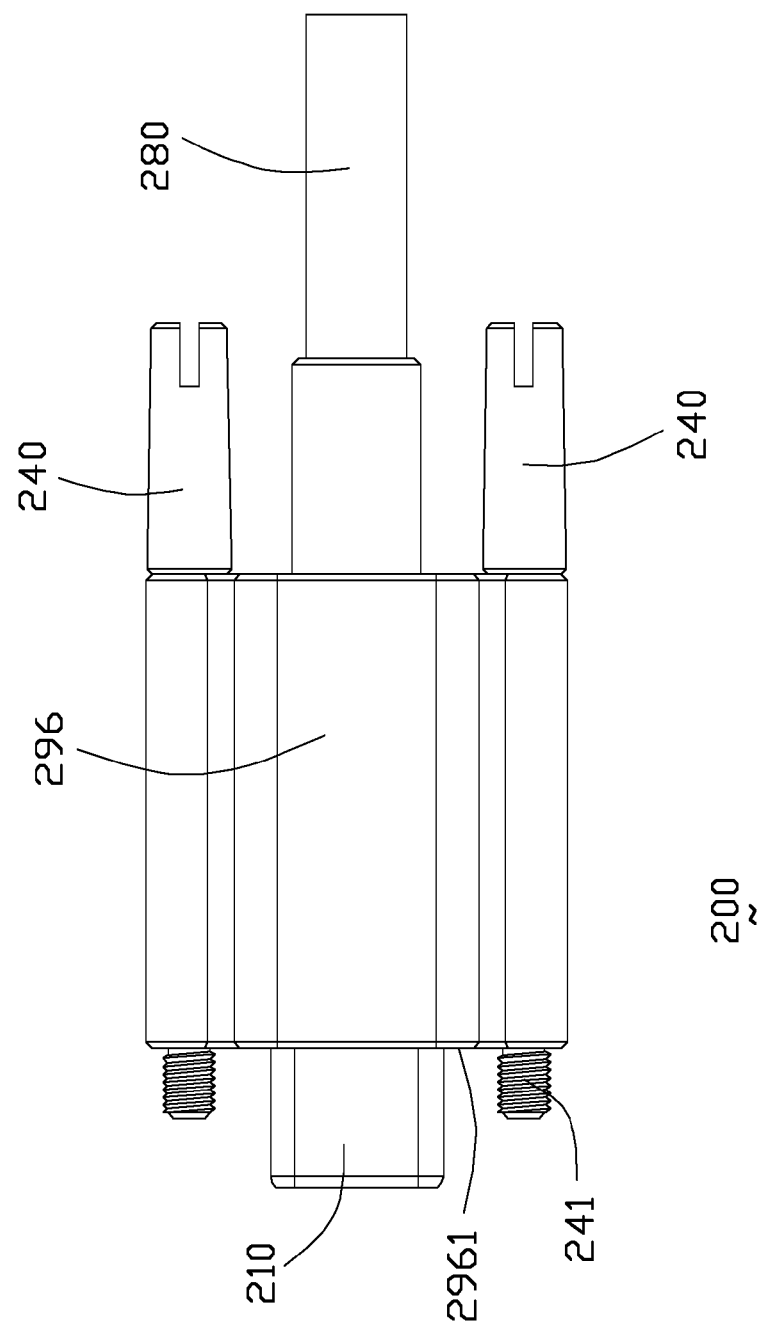
FIG. 16(A) is a top view of the plug connector of FIG. 16.
Figure 16B:
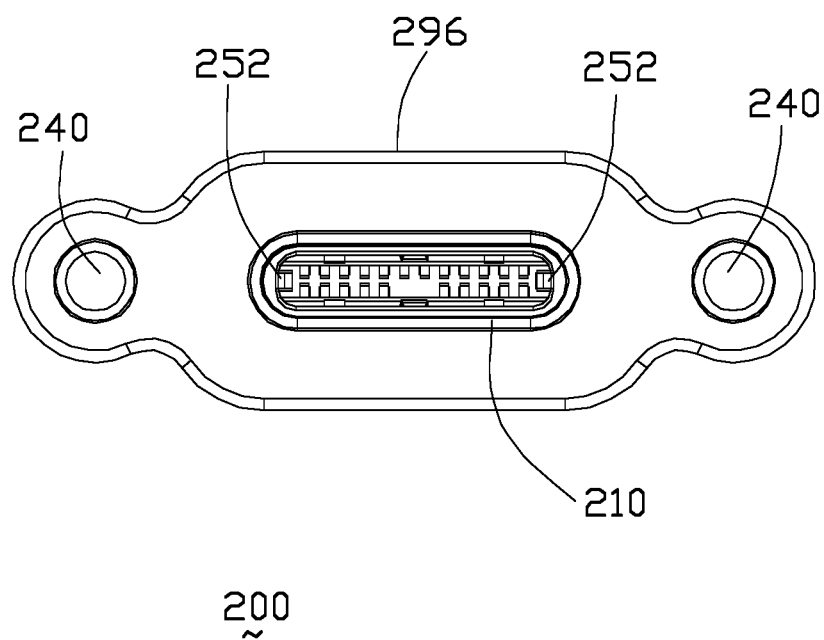
FIG. 16(B) is a front elevational view of the plug connector of FIG. 16.
Figure 17:
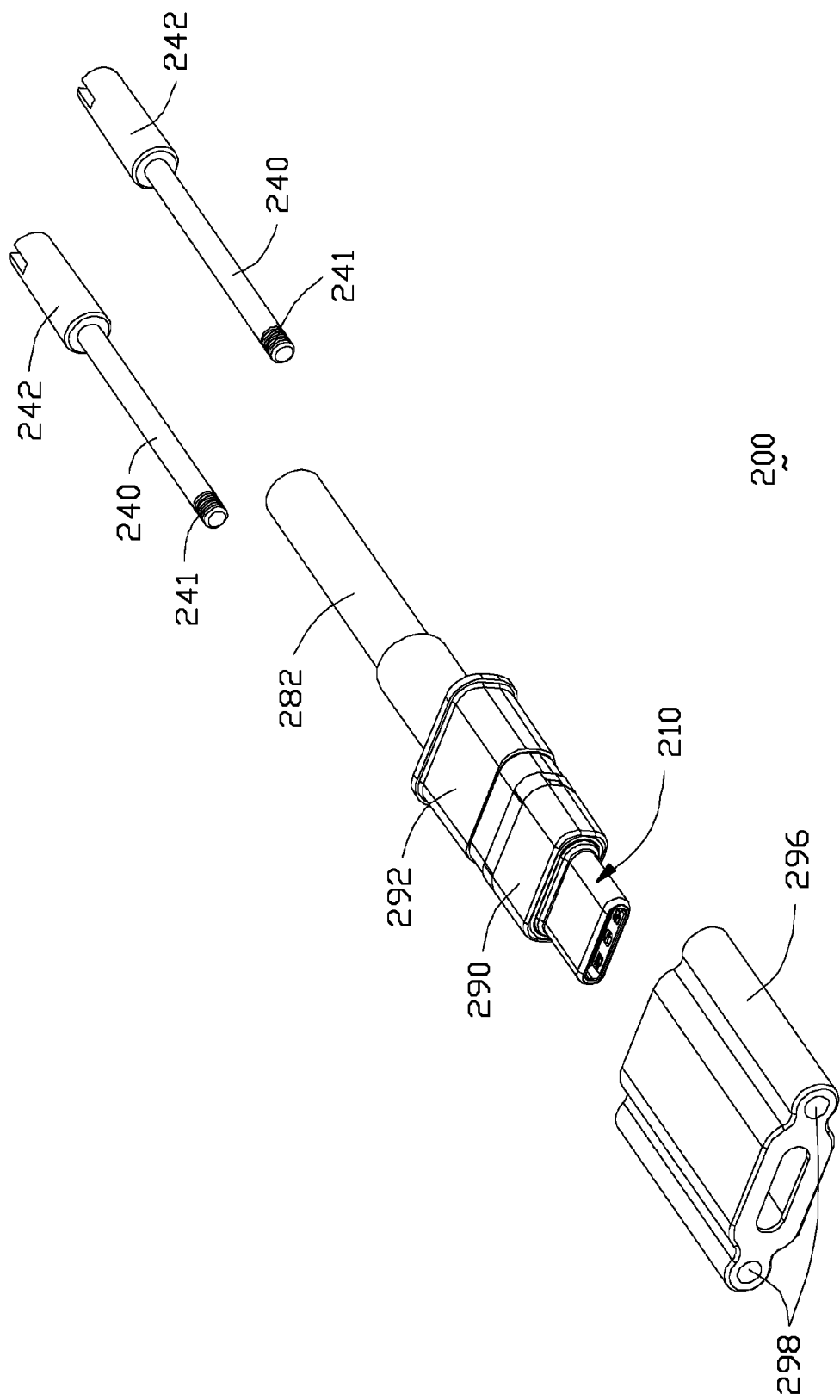
FIG. 17 is a front exploded perspective view of the plug connector of FIG. 16.
Figure 18:
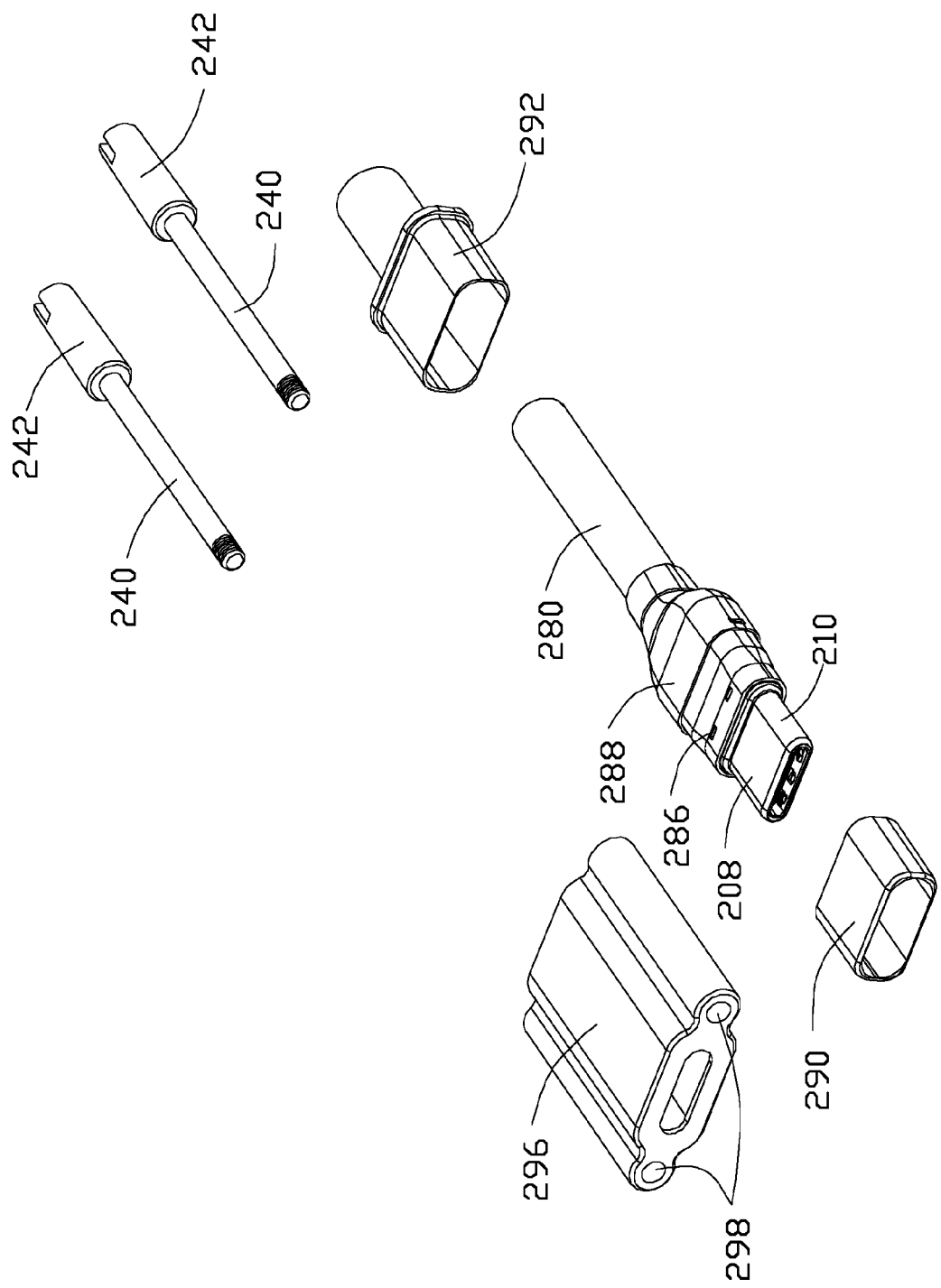
FIG. 18 is a further front exploded perspective view of the plug connector of FIG. 17.
Figure 19A:
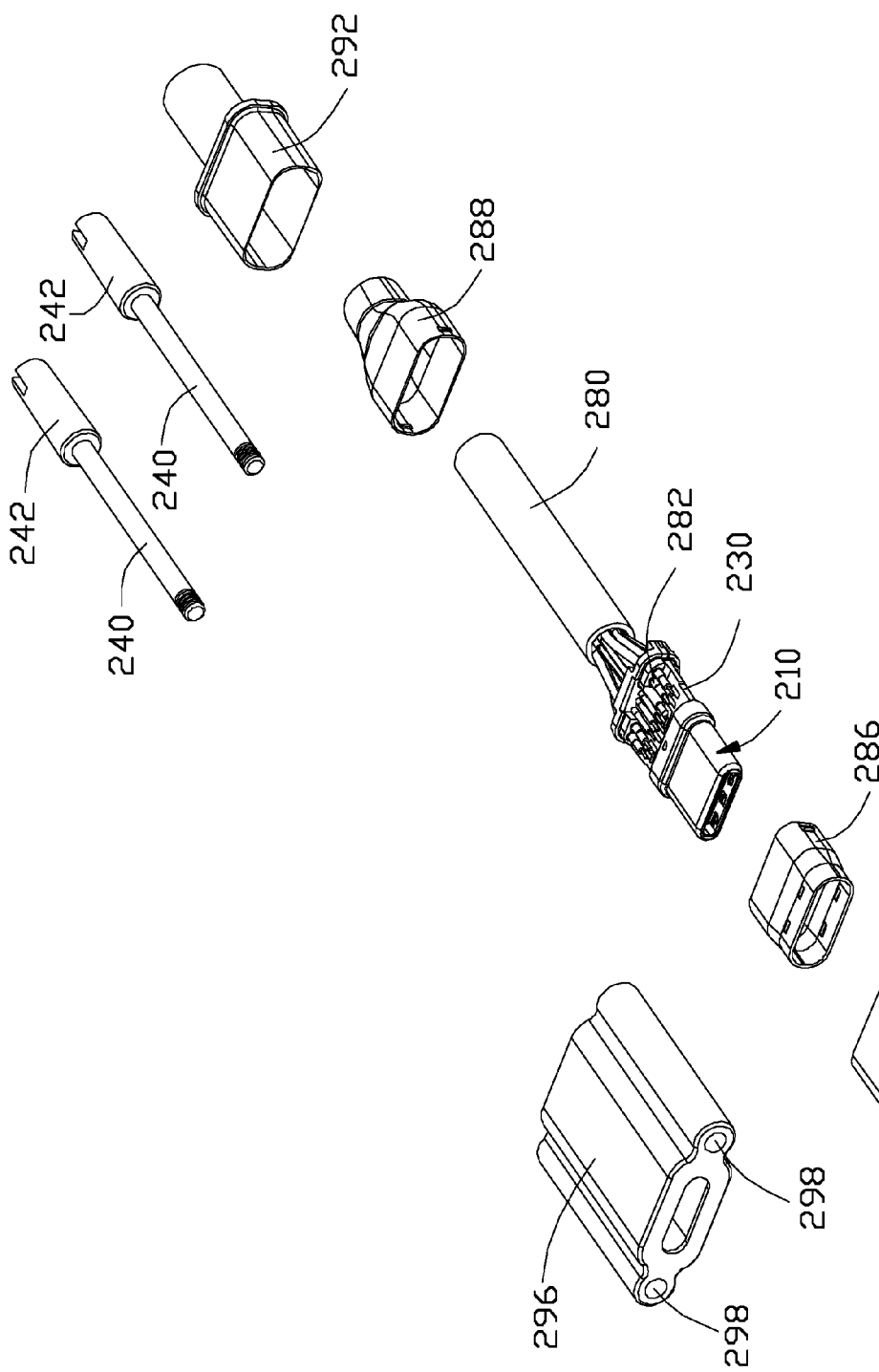
FIG. 19(A) is further front exploded perspective view of the plug connector of FIG. 18.
Figure 19B:
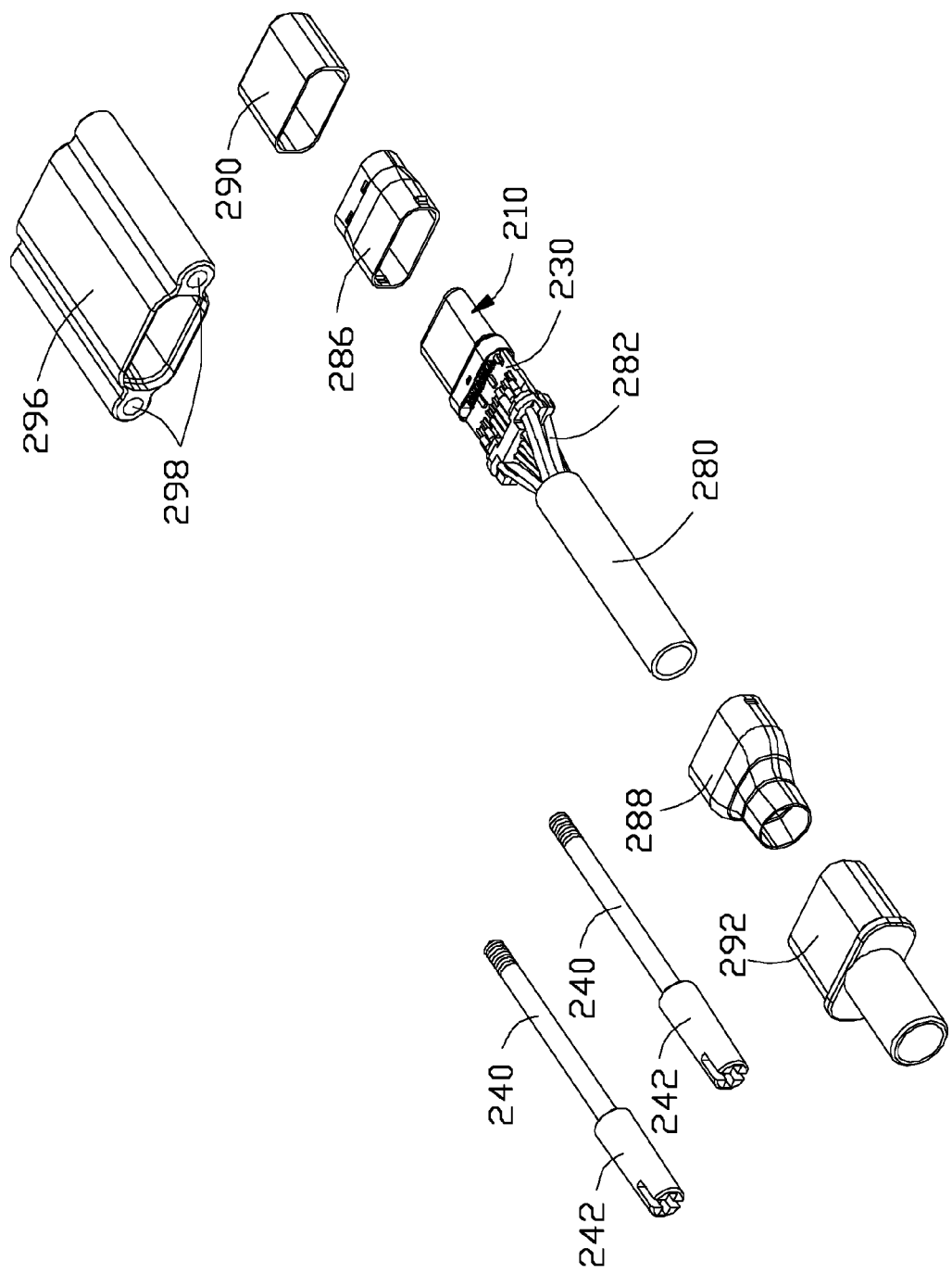
FIG. 19(B) is a further rear exploded perspective view of the plug connector of FIG. 18.
Figure 20A:
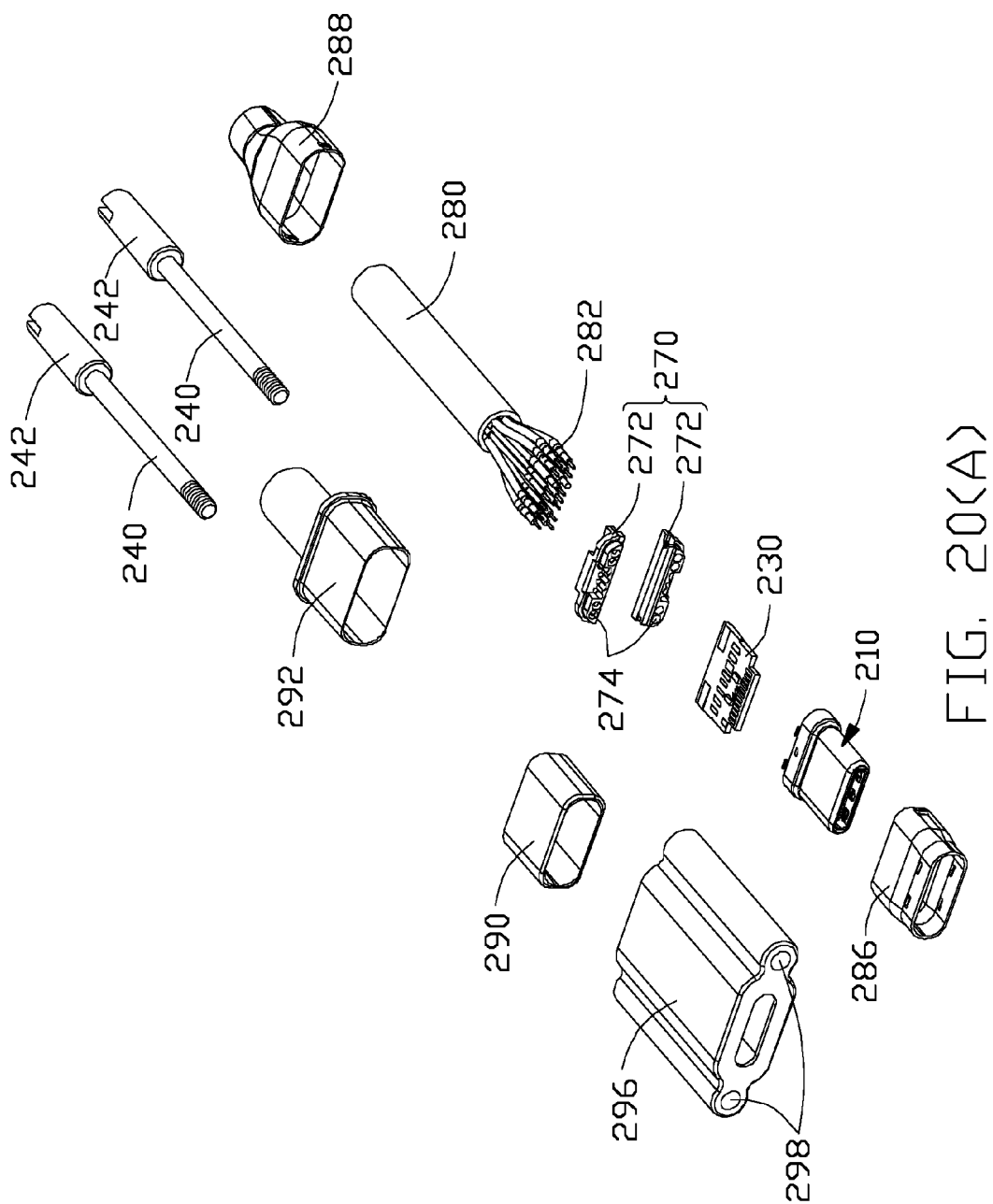
FIG. 20(A) is a further front exploded perspective view of the plug connector of FIG. 19(A).
Figure 20B:
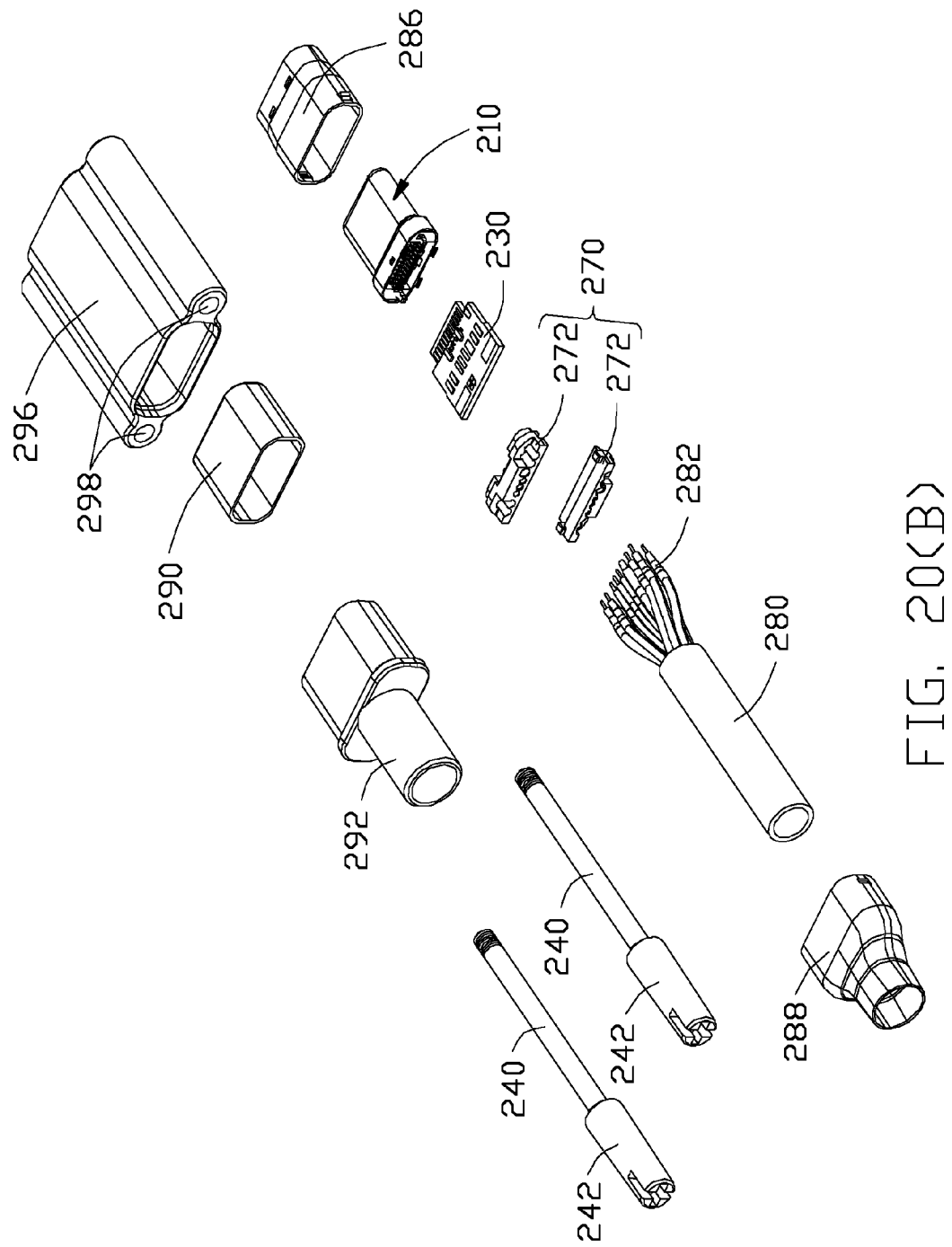
FIG. 20(B) is a further rear exploded perspective view of the plug connector of FIG. 19(B).
Figure 21A:
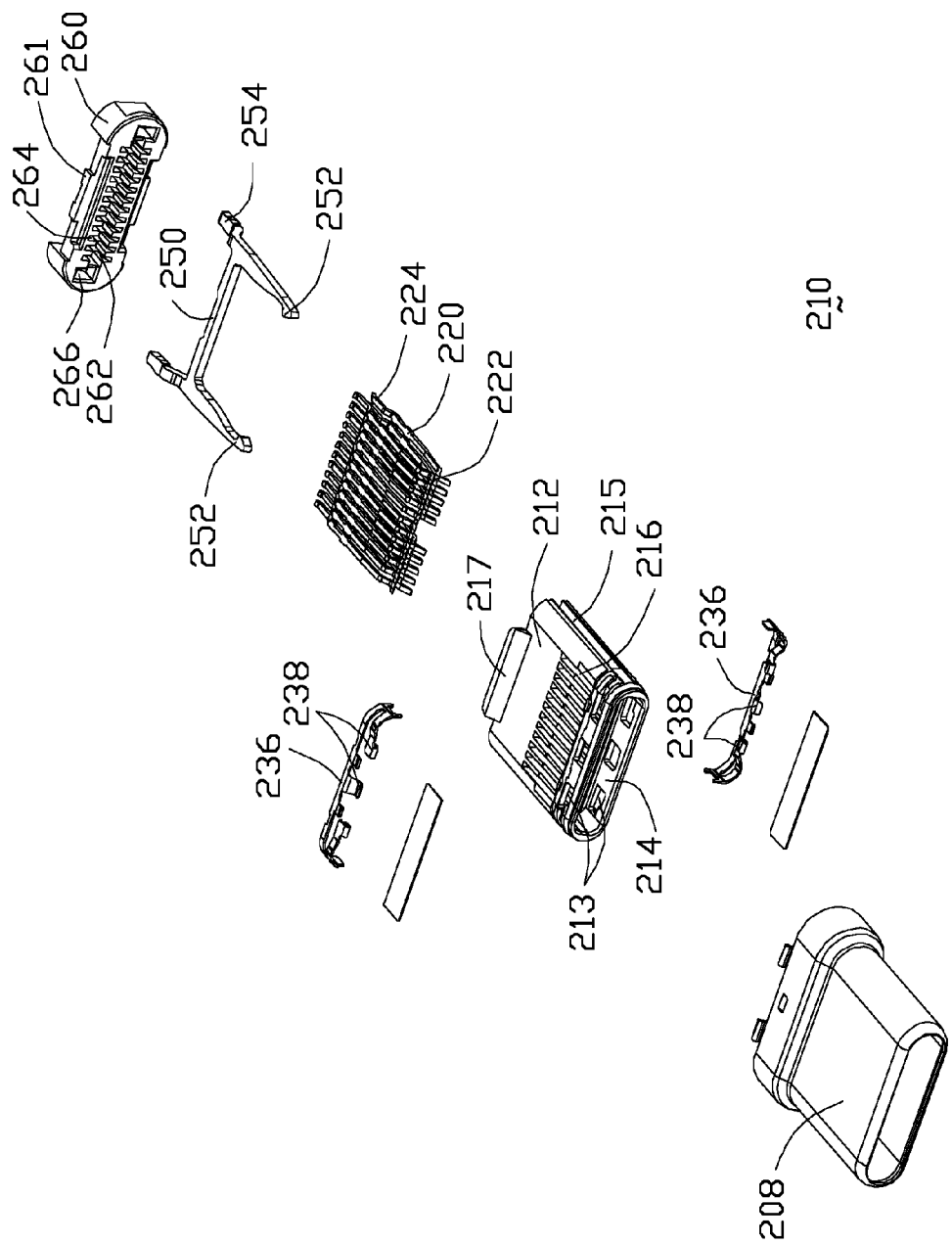
FIG. 21(A) is a further front exploded perspective view of the mating part of the plug connector of FIG. 20(A).
Figure 21B:
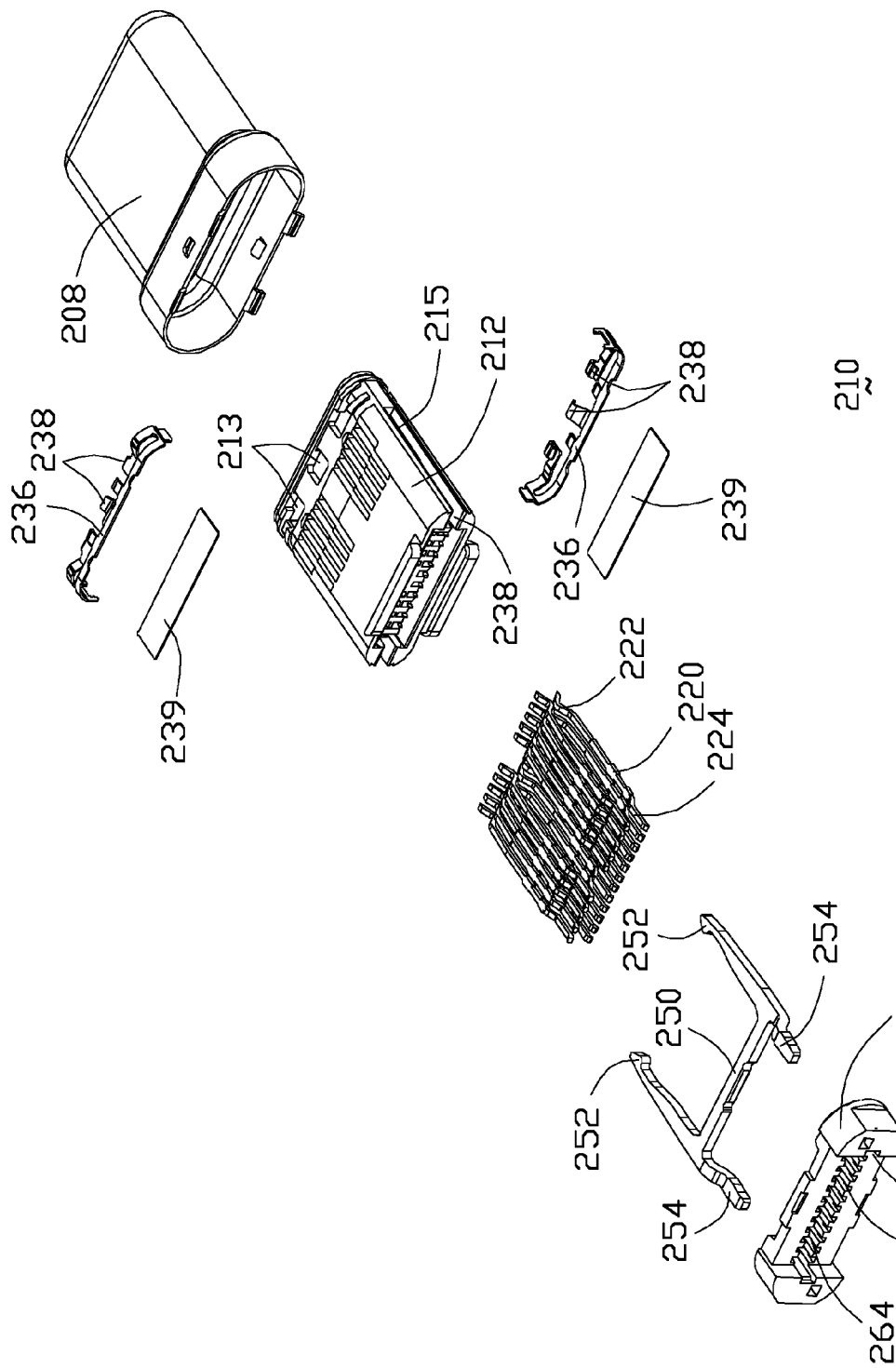
FIG. 21(B) is a further rear exploded perspective view of the mating part of the plug connector of FIG. 20(B).
Figure 21C:
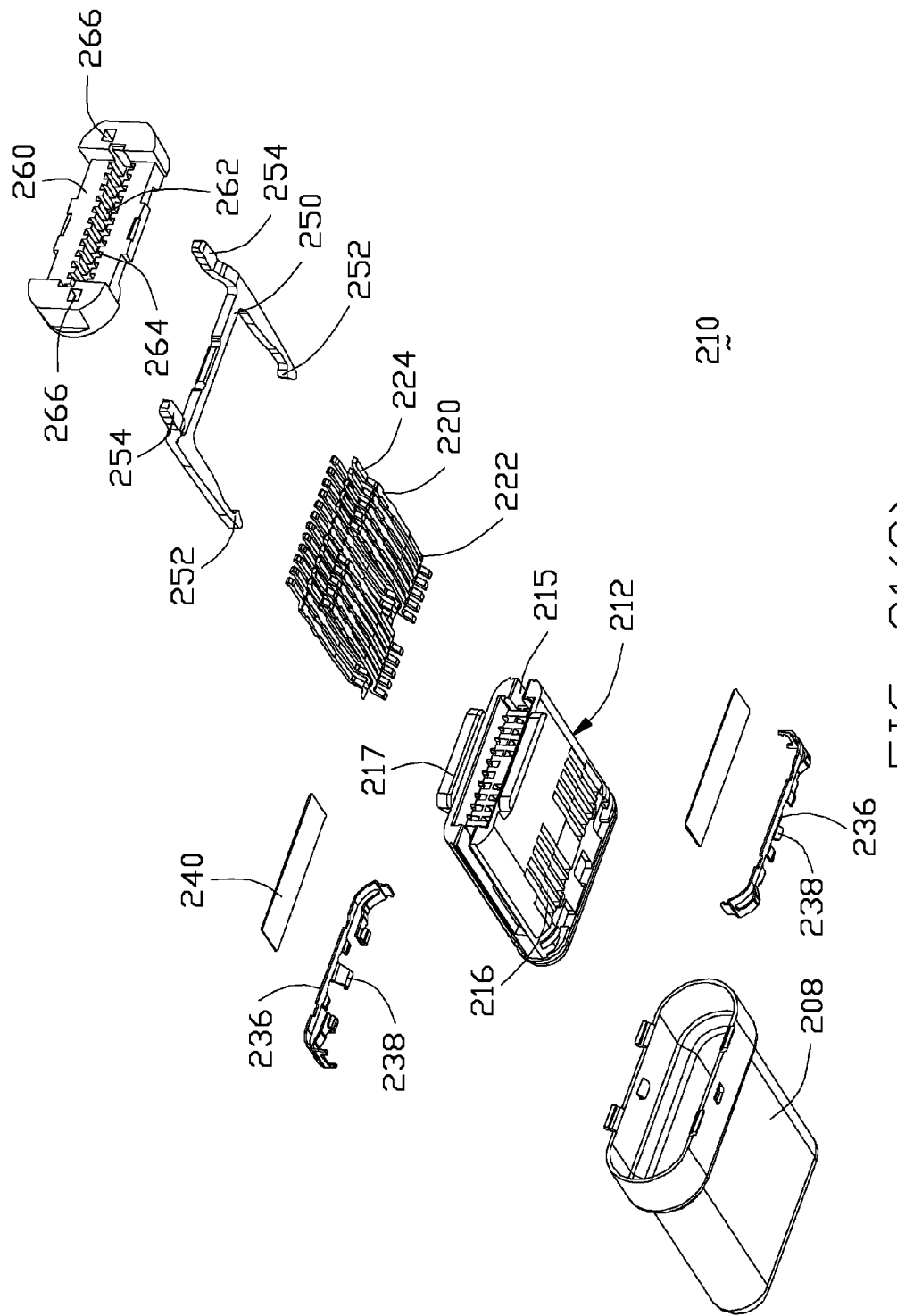
FIG. 21(C) is a further rear and bottom exploded perspective view of the mating part of the plug connector of FIG. 21(B).
Figure 22:
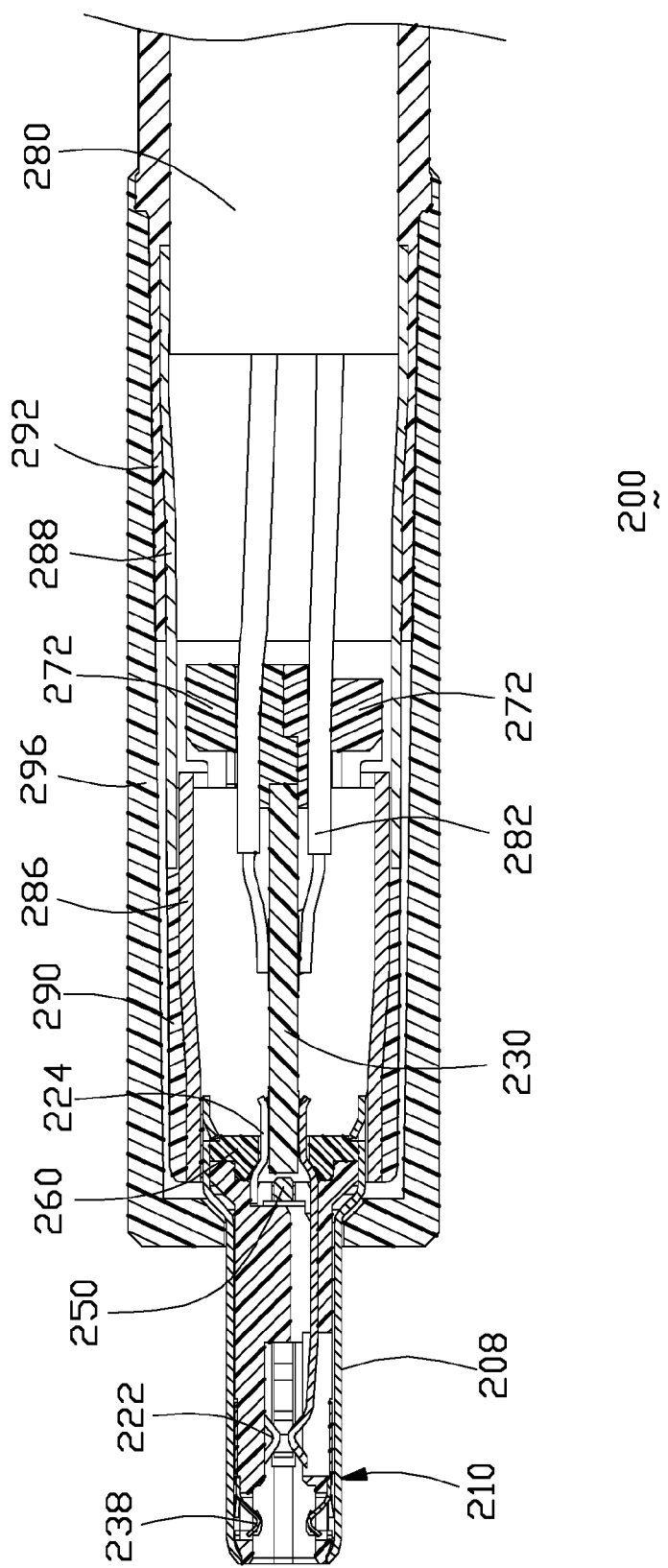
FIG. 22 is a cross-sectional view of the plug connector taken along lines 22-22 in FIG. 16.
Figure 23:
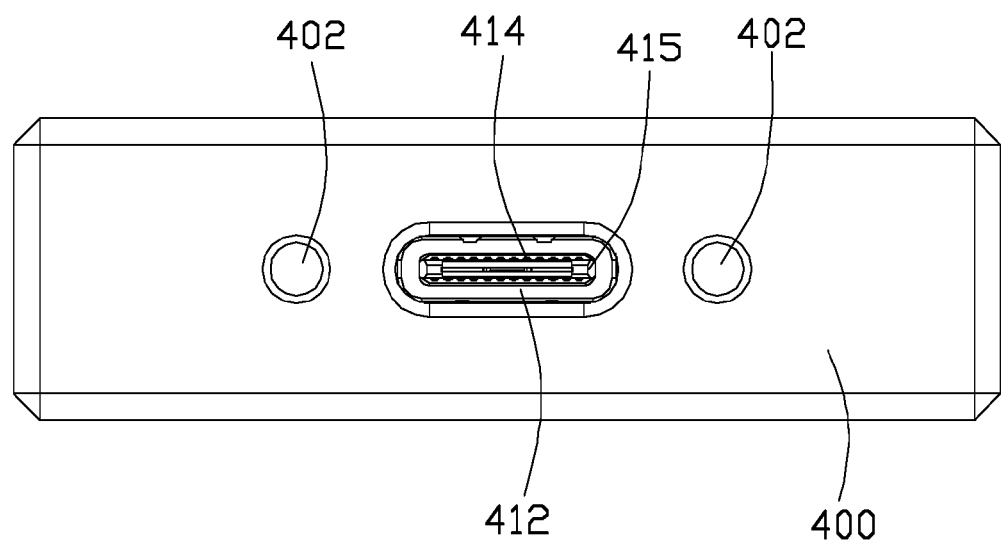
FIG. 23 is a front elevational view of the receptacle connector and the case of FIG. 15.
Figure 24:
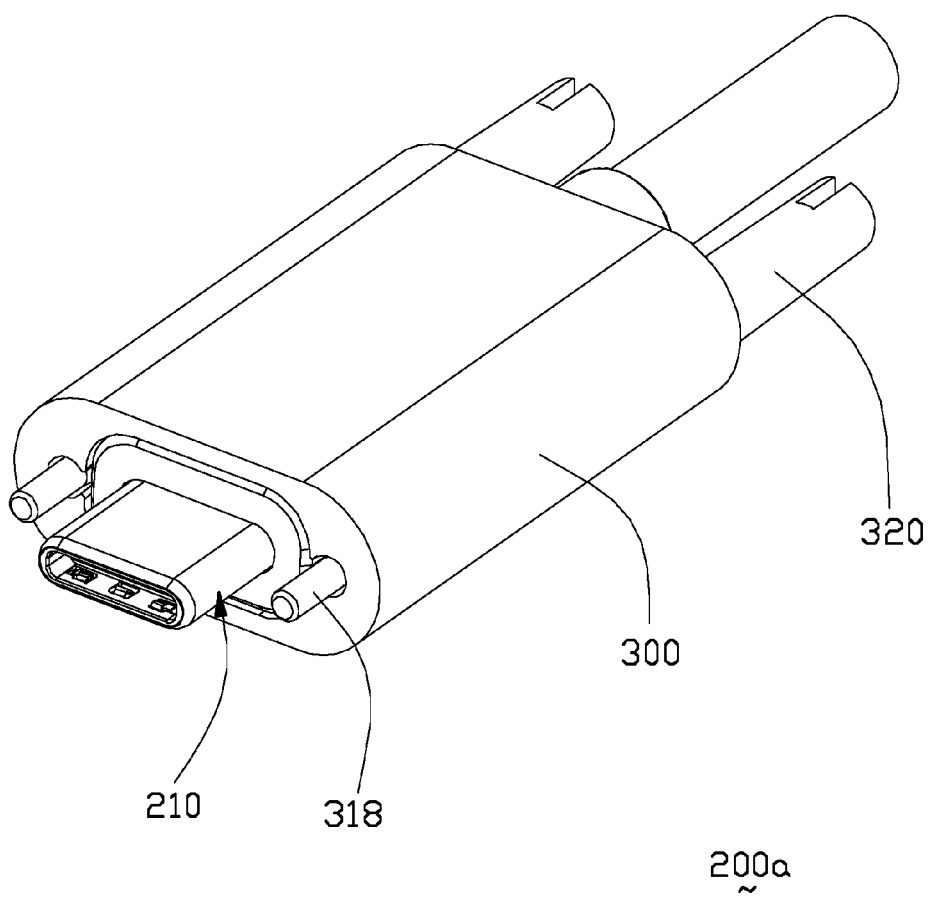
FIG. 24 is a perspective view of a third embodiment of the plug connector according to the invention.

Referring to FIGS. 15, 15(A) and 23, the receptacle connector 410 mounted upon a printed circuit board 500 and enclosed with a case 400, defines a mating cavity 412 to receive the mating part 210 therein. A mating tongue 415 extends in the mating cavity 412 with contacts 414 exposed upon two opposite surfaces of the mating tongue 415 and with a metallic shielding plate 416 embedded therein. The shielding plate 416 forms a pair of latching sections 418 on two opposite lateral sides to be engaged with the corresponding locking heads 252 of the plug connector 200 when the mating part 210 of the plug connector 200 is inserted into the mating cavity 412 of the receptacle connector 410, and the mating tongue 415 of the receptacle connector 410 is received within the receiving cavity 214 of the plug connector 200. A pair of screw holes 402 are formed in the case 400 to receive the corresponding screws 240 therein.

Understandably, compared with the first embodiment, the second embodiment may reliably secure the plug connector 200 to the receptacle connector 410 via the pair of screws 240. Generally, the pair of screws 240 are symmetrically arranged with the mating part 210 in the transverse direction, so that the flippable mating is permitted still. Notably, the diameter of the screw 240 is essentially slightly smaller than or similar to the height of the mating part 210 while that of the operation knob 242 is larger than the height of the mating part 210. It is further noted that because the pair of screws 240 are located by two sides of the mating part 210 and essentially aligned with the pair of locking heads 252 of the latch 250 in the transverse direction so as to efficiently reinforce securing between the latch 250 of the plug connector 200 and the latching sections 318 of the shielding plate 306 of the receptacle connector 410.

FIGS. 24-35 shows a third embodiment of this present invention wherein a plug connector 200a is adapted to be mated with the corresponding receptacle connector (not shown) disposed in a case (not shown) while similar to that disclosed in the second embodiment. The plug connector 200a is similar to the plug connector 200 of the second embodiment except the out cover 296 and the boot 300 added. Therefore, the same elements of the third embodiment share the same numerals to the second embodiment and the description is omitted hereinafter. The insulative outer cover 296 encloses the front inner cover 290, the rear shell 288 and the rear inner cover 292 while exposing the shell 208. The outer cover 296 forms a protrusion 298 on the exterior surface. The outer cover 296 is enclosed within a boot 300 which slides upon the outer cover 296 in a front-to-back direction.

Figure 25:
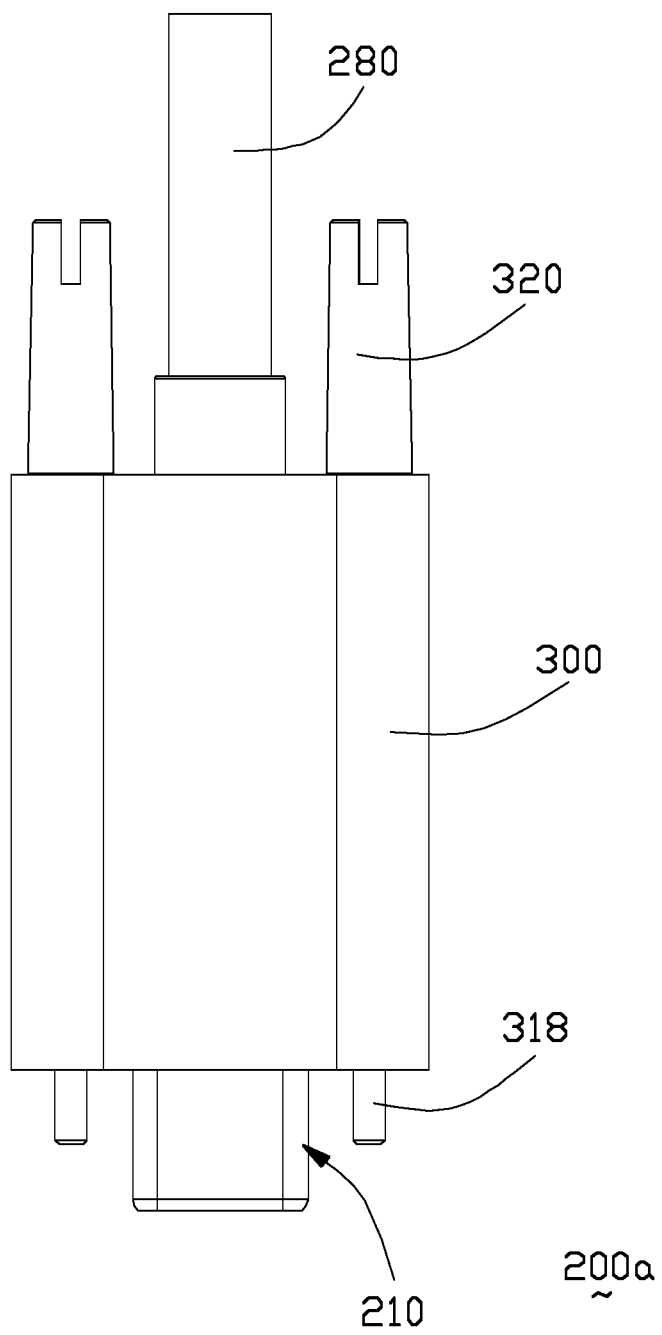
FIG. 25 is a top view of the plug connector of FIG. 24 which is adapted to be mated/locked with the corresponding receptacle connector.
Figure 26:
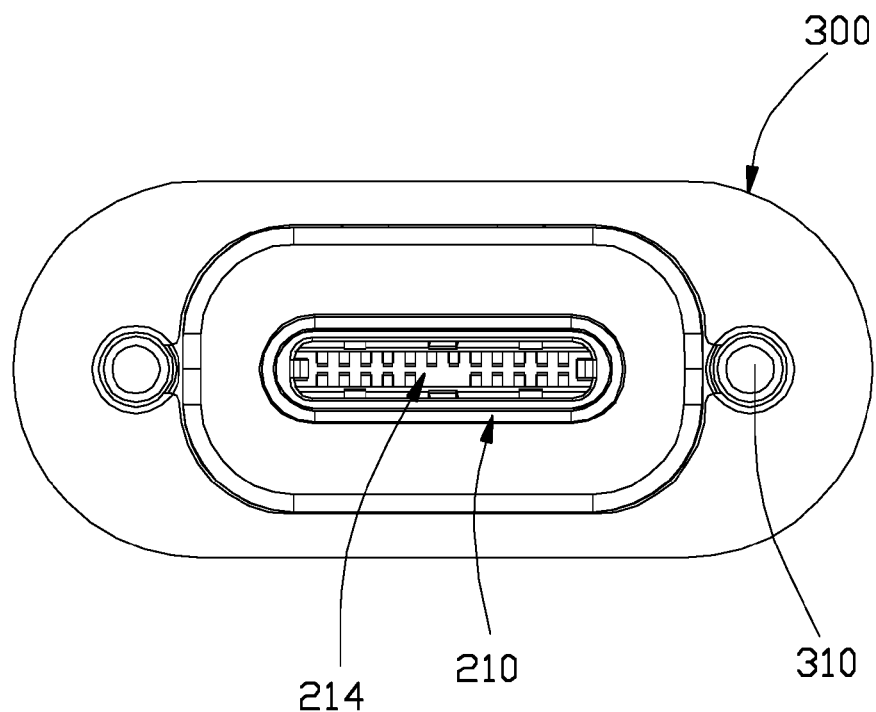
FIG. 26 is a front elevational view of the plug connector of FIG. 24.
Figure 27:
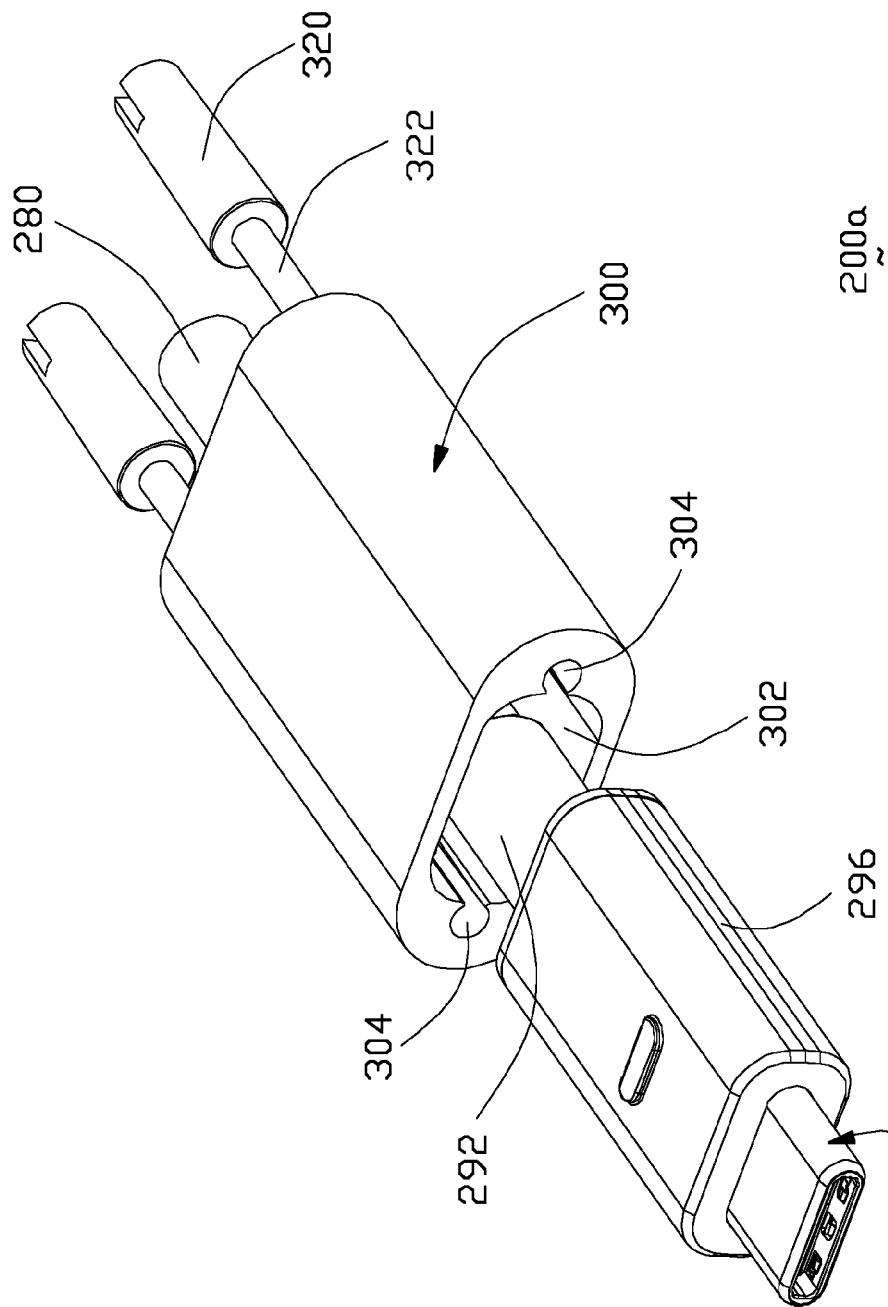
FIG. 27 is a front exploded perspective view of the plug connector of FIG. 24 wherein the boot is removed away from the cover of the plug connector.
Figure 28A:
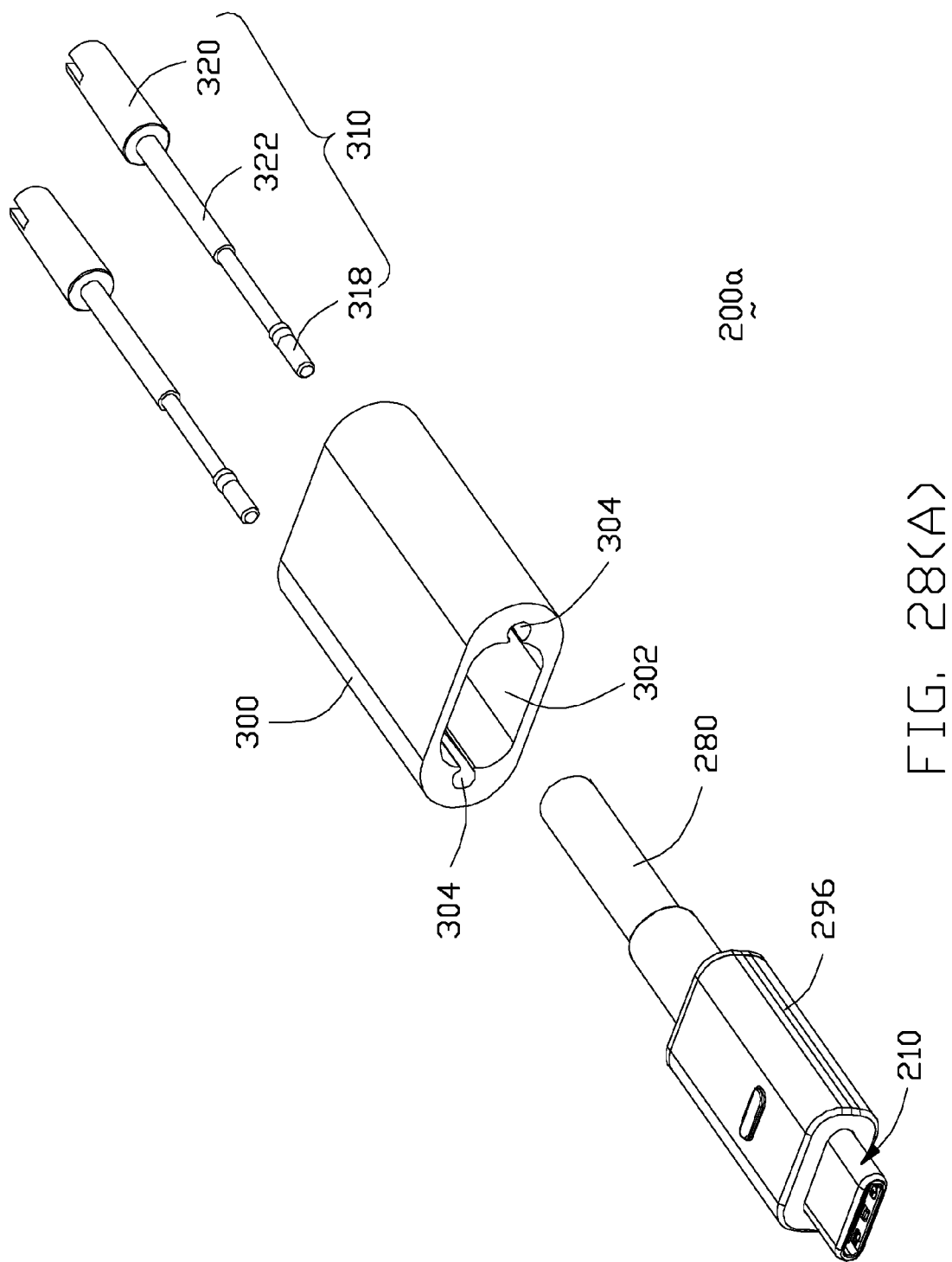
FIG. 28(A) is a further front exploded perspective view of the plug connector of FIG. 27.
Figure 28B:
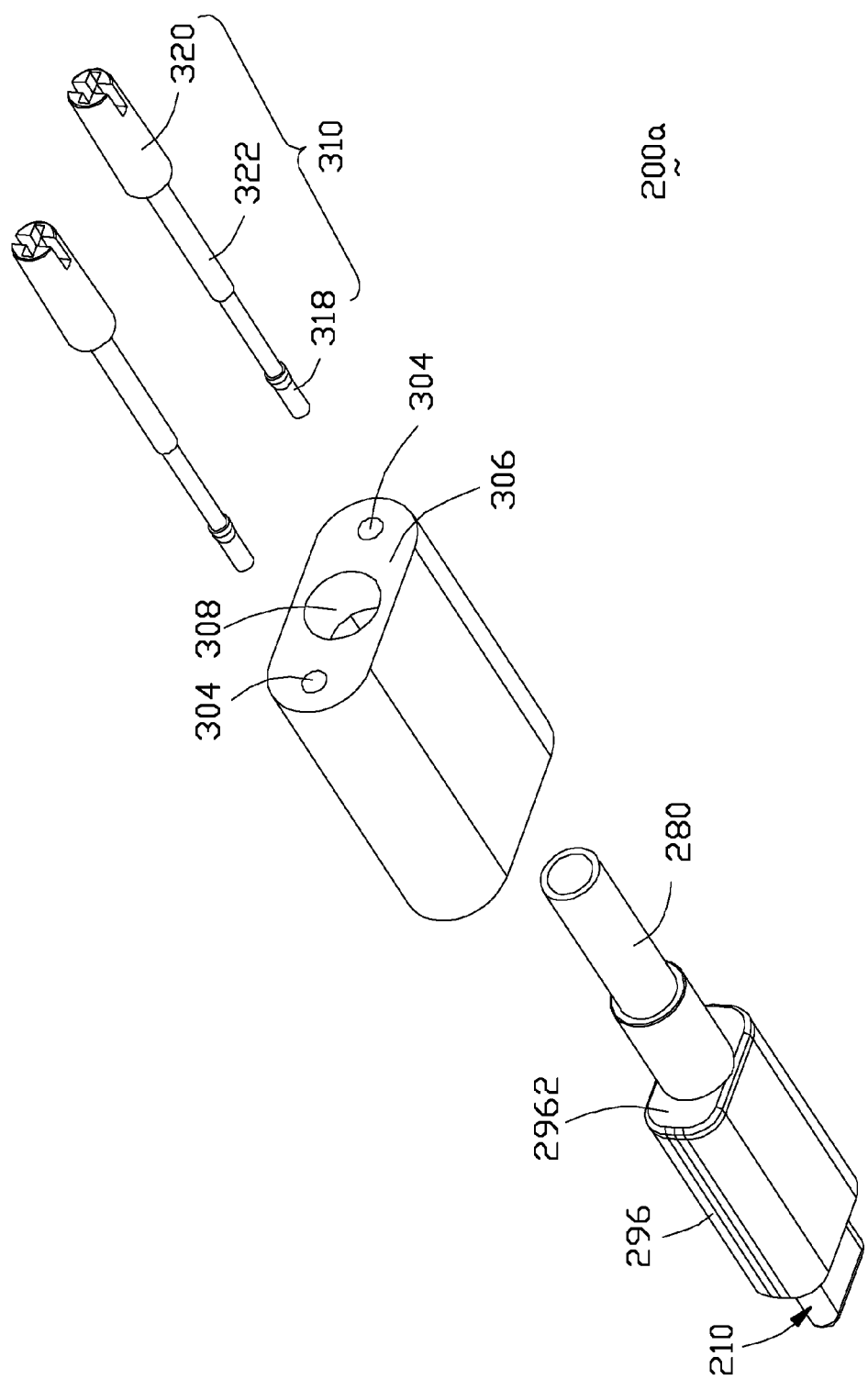
FIG. 28(B) is a rear exploded perspective view of the plug connector of FIG. 27.
Figure 29:
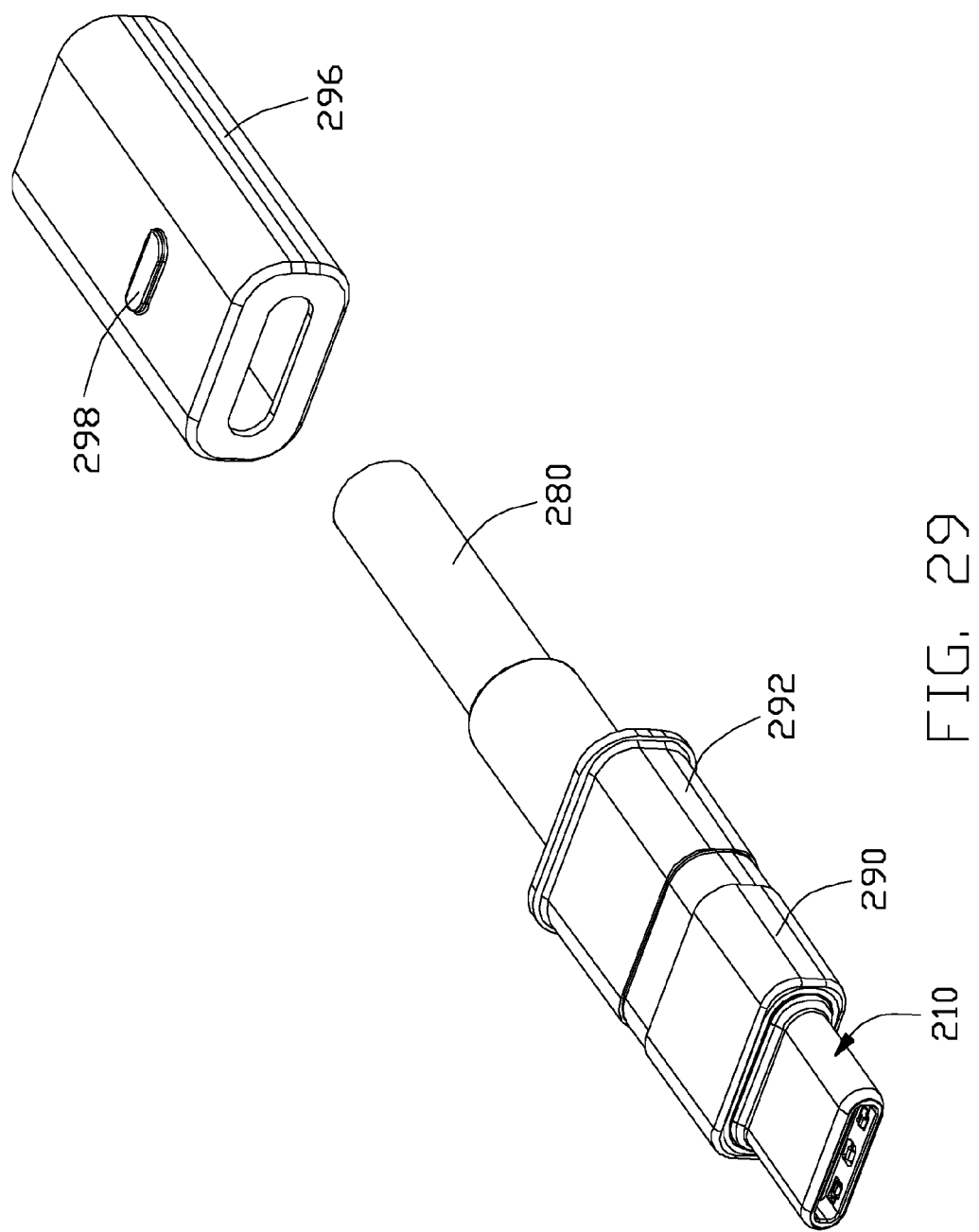
FIG. 29 is a front exploded perspective view of the plug connector of FIG. 28(A) without the boot and the locking screws.
Figure 30A:
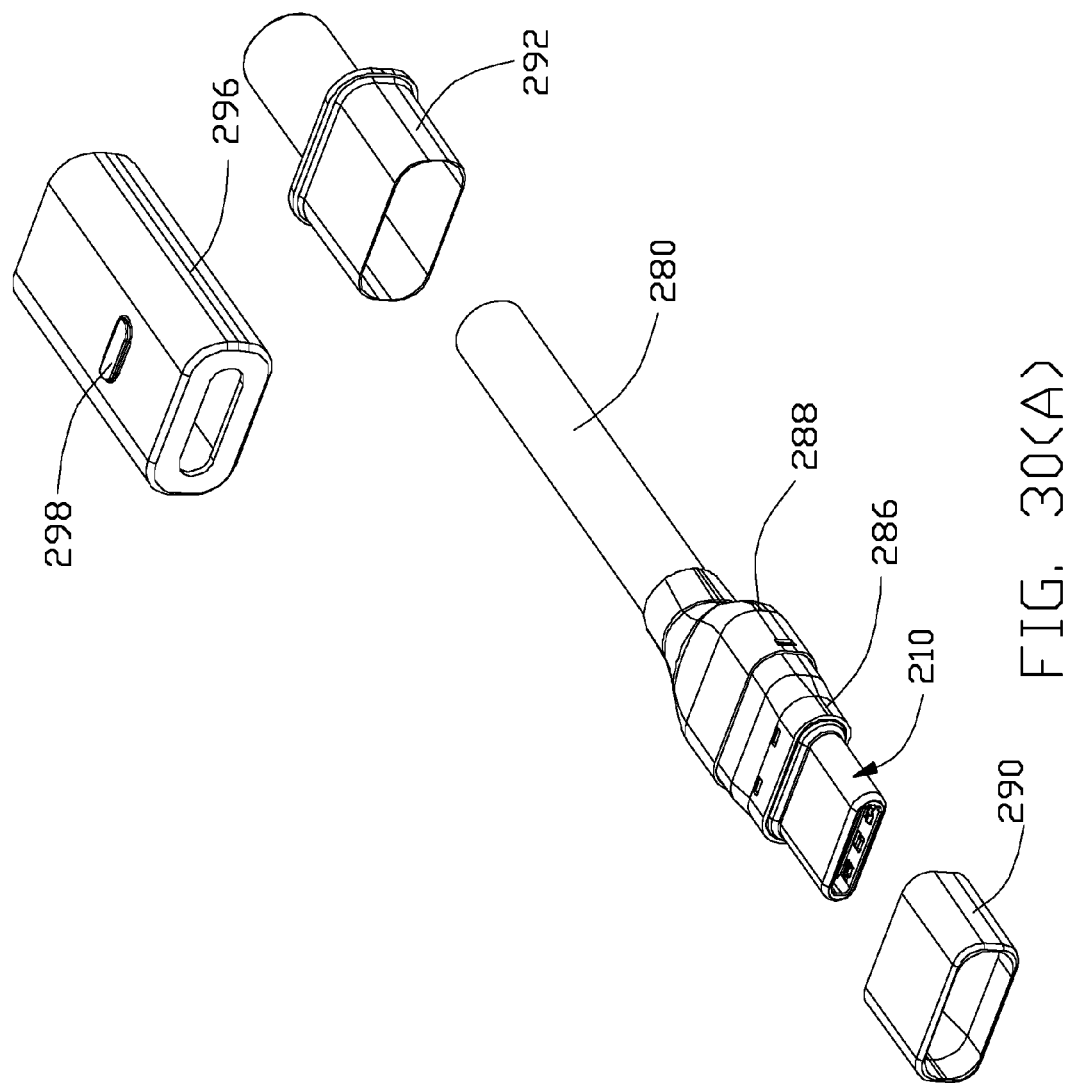
FIG. 30(A) is a further front exploded perspective view of the plug connector of FIG. 29.
Figure 30B:
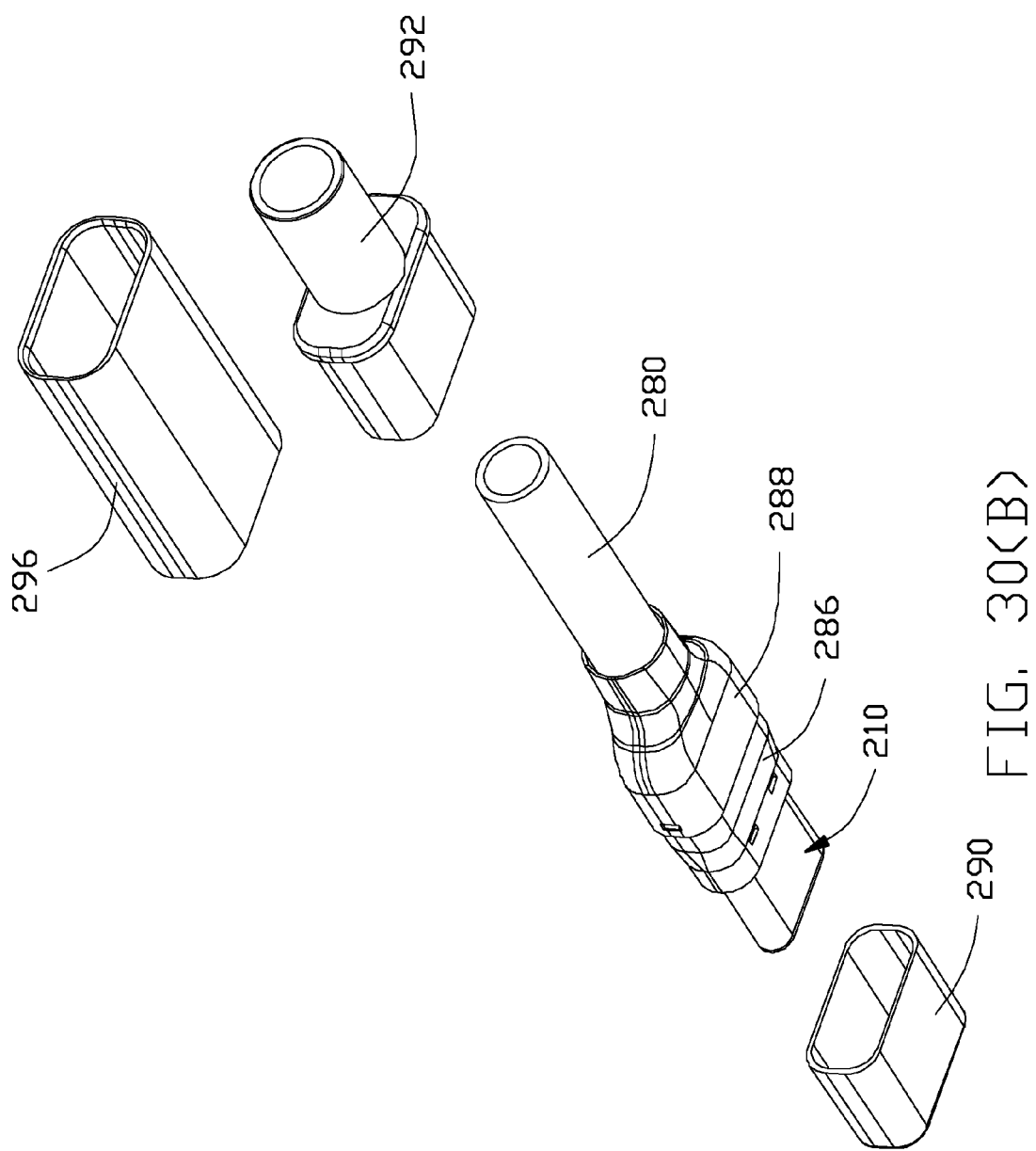
FIG. 30(B) is a further rear exploded perspective view of the plug connector of FIG. 29.
Figure 31:
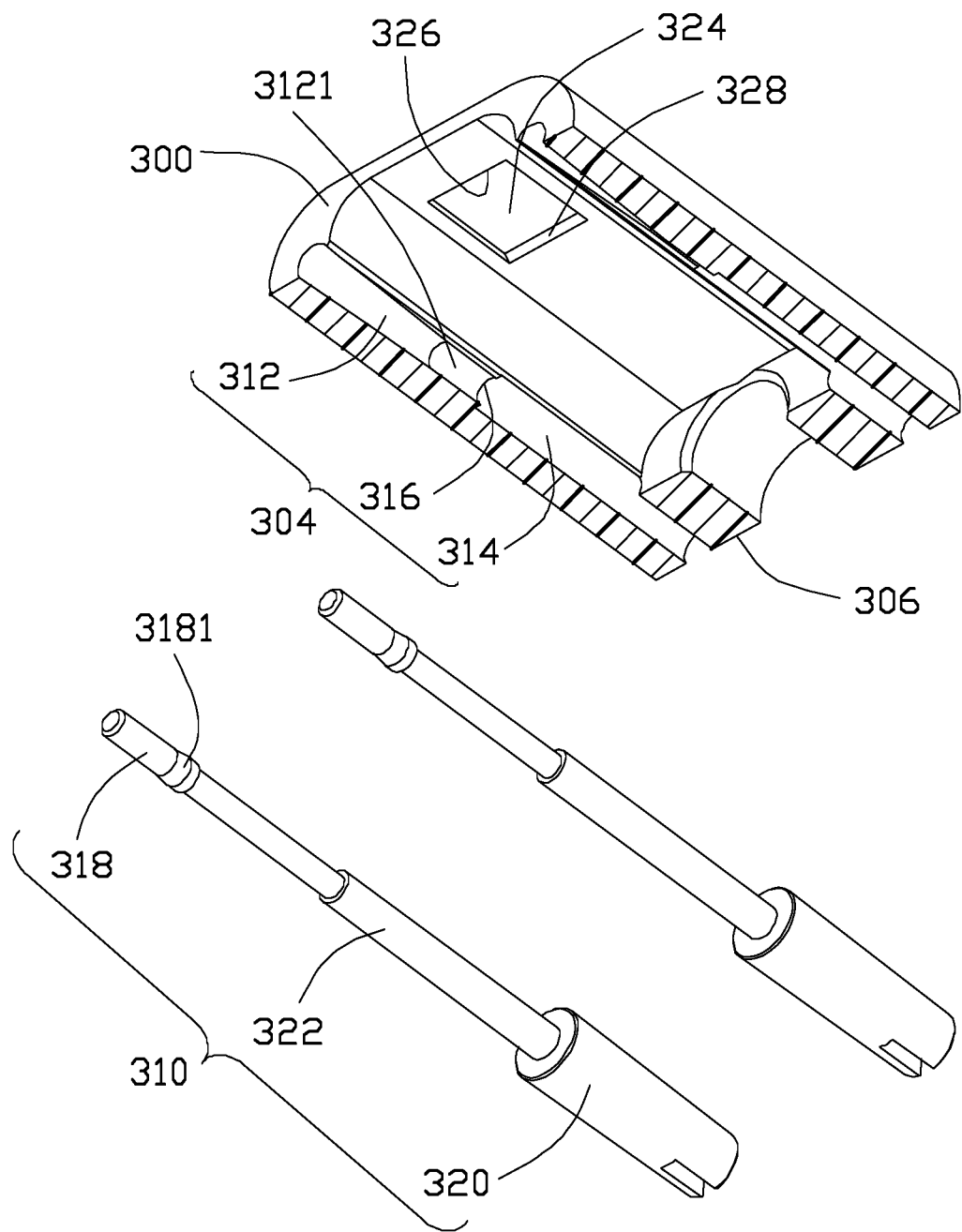
FIG. 31 is a partially exploded perspective view of the boot and the associated locking screws of FIG. 24.
Figure 32A:
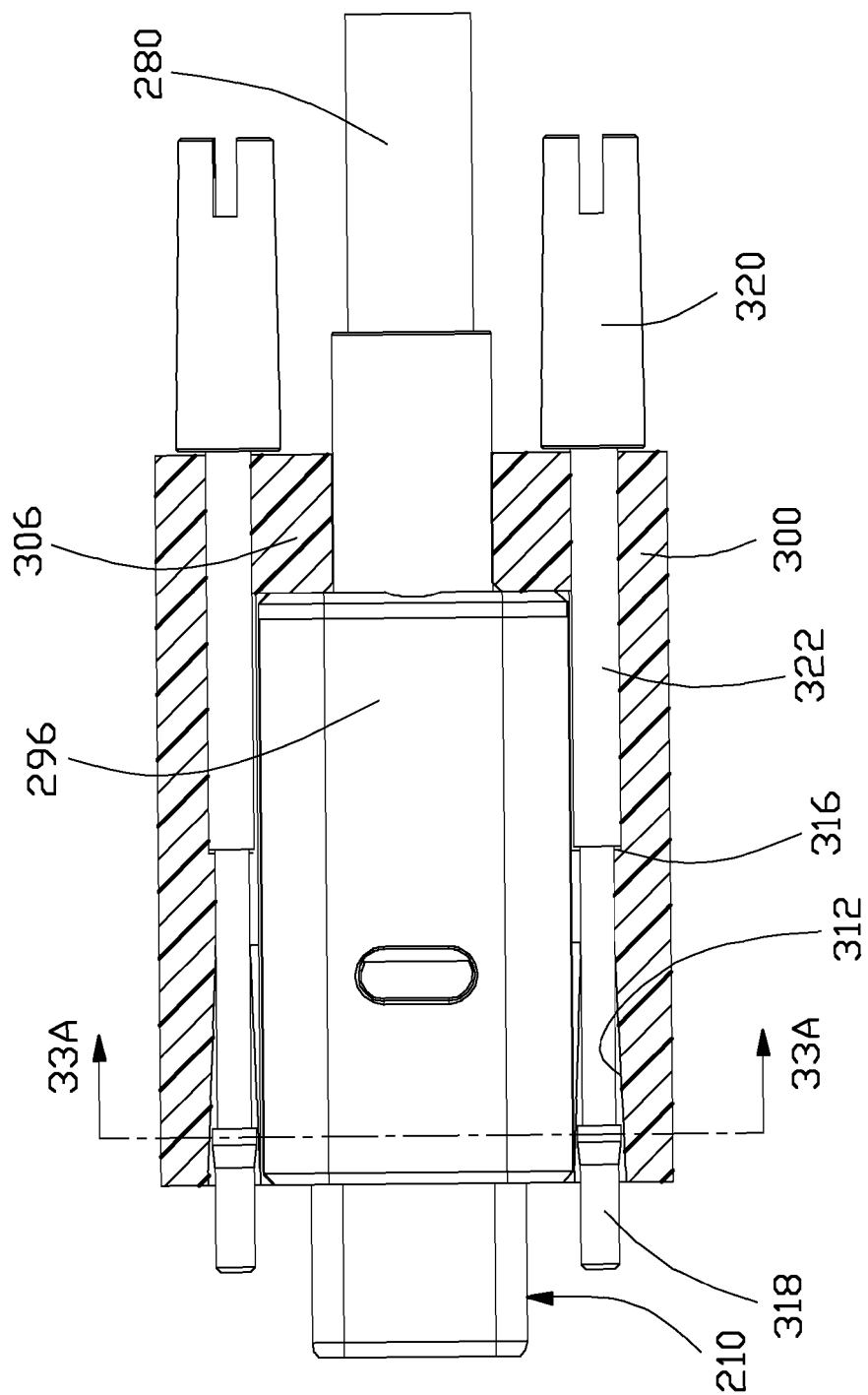
FIG. 32(A) is a cross-sectional view of the plug connector of FIG. 24 when the boot forwardly abuts against the rear end of the cover and the locking screw forwardly abuts against the rear end of the boot.
Figure 32B:
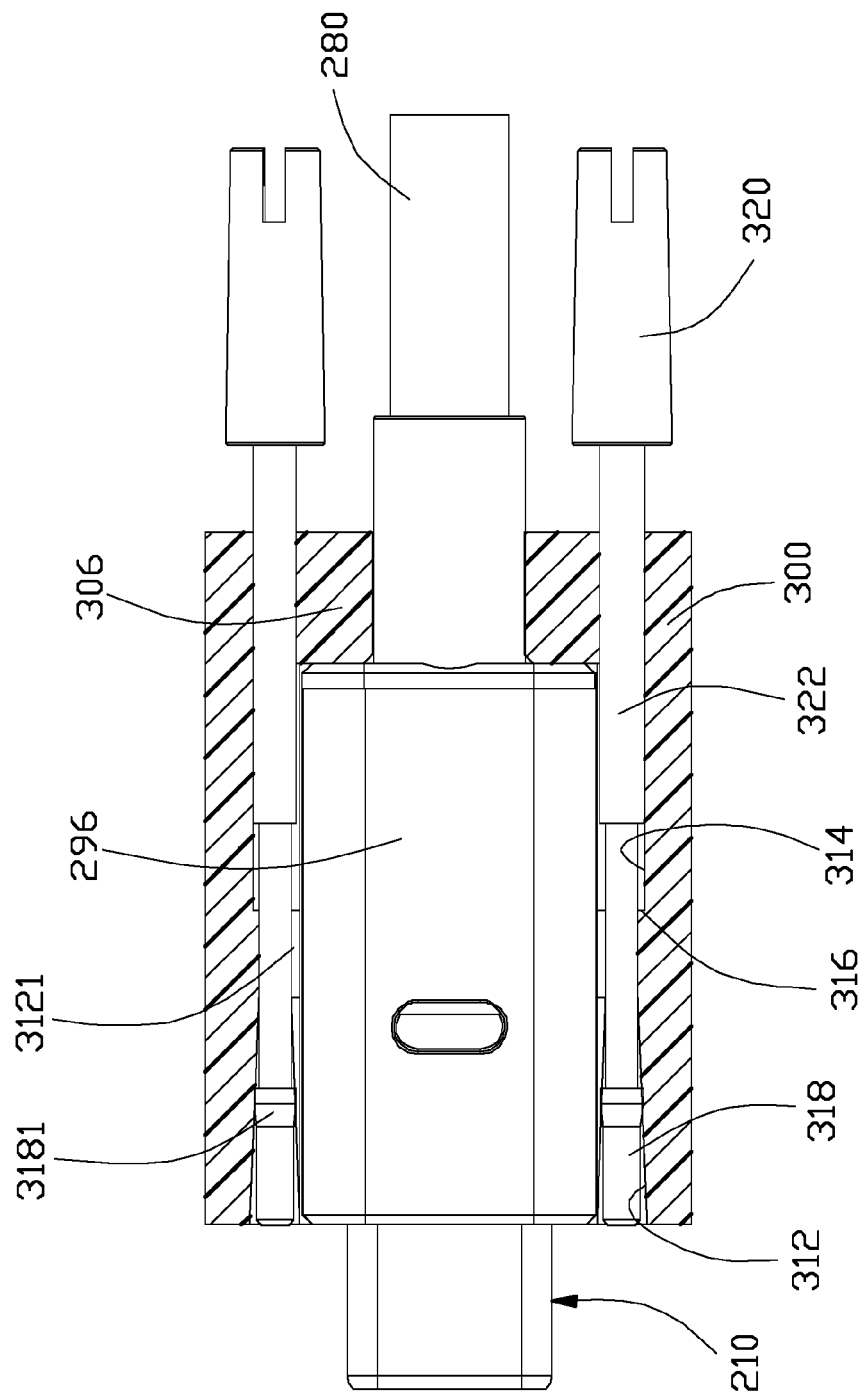
FIG. 32(B) is a cross-sectional view of the plug connector of FIG. 24 when the boot forwardly abuts against the rear end of the cover while the locking screw does not abut against the rear end of the boot but rearwardly spaced therefrom.
Figure 32C:
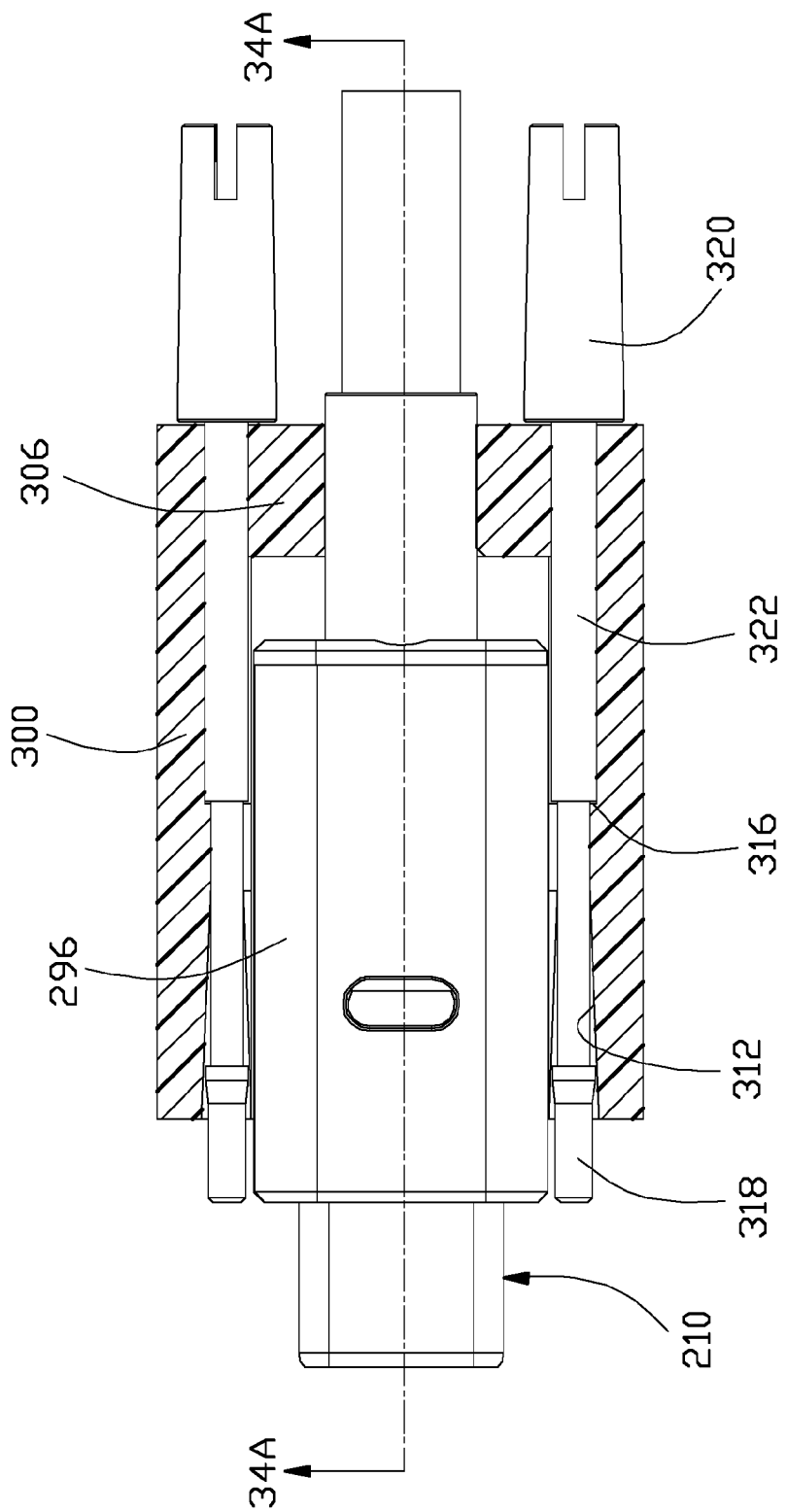
FIG. 32(C) is a cross-sectional view of the plug connector of FIG. 24 when the boot is rearwardly spaced from the rear end of the cover while the locking screw forwardly abuts against the rear end of the boot.
Figure 32D:
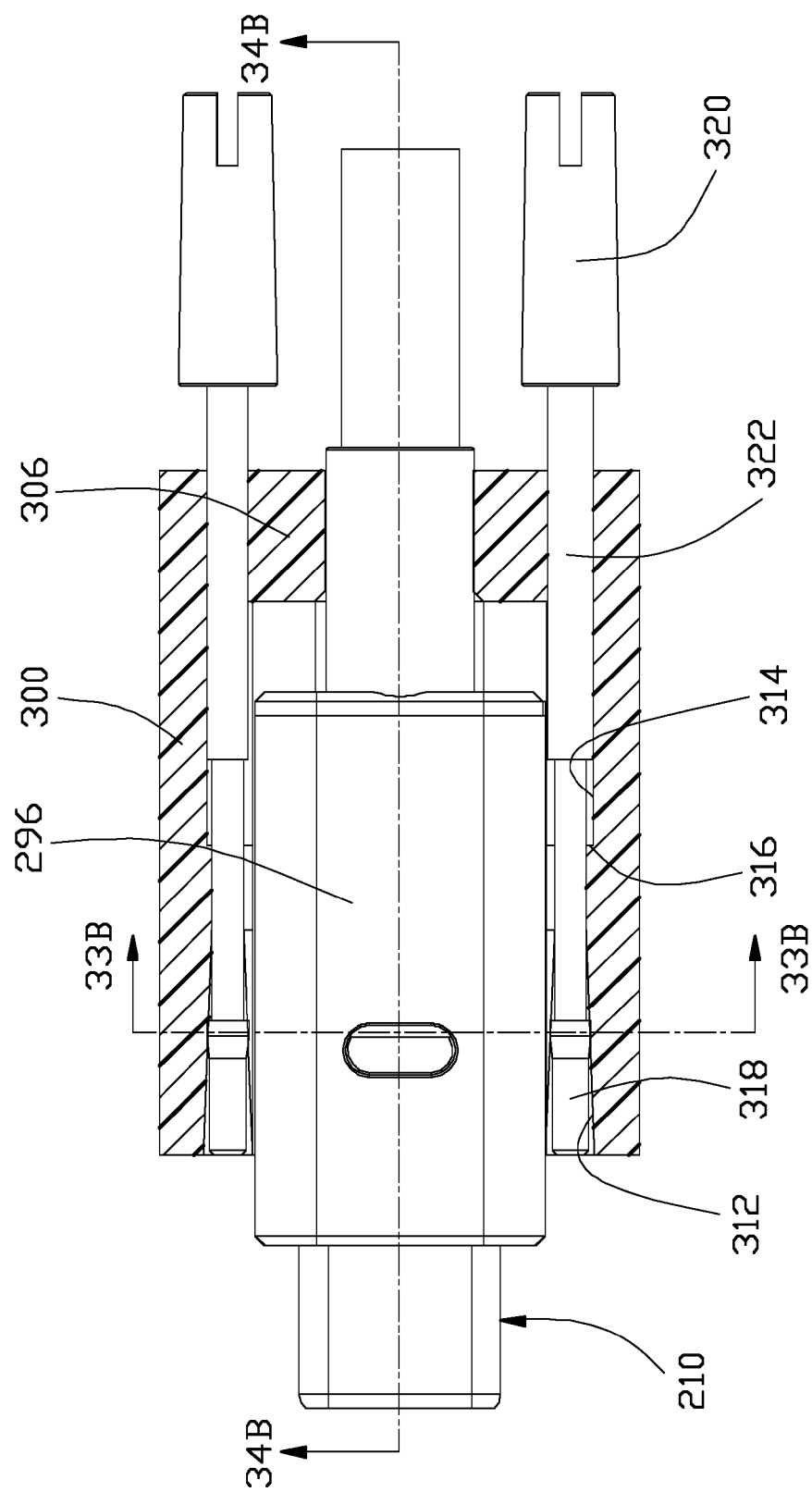
FIG. 32(D) is a cross-sectional view of the plug connector of FIG. 24 when the boot is rearwardly spaced from the rear end of the cover and the locking screw is rearwardly spaced from the rear end of the boot.

The boot 300 forms a main cavity 302 to receive the outer cover 296 therein, and a pair of a pair of channels 304 by two sides of the main cavity 302 in a communicative manner for achieving the minimum pitch between these two channels 304. A rear wall 306 is formed behind the main cavity 302 to abut against a rear end wall 2962 of the cover assembly including the outer cover 296 and the inner cover 292 for preventing further forward movement of the boot 300 with regard to the outer cover 296, when the boot 300 is moved to a front position with regard to the outer cover 296. An opening 308 is formed in the rear wall 306 for allowing rearward extension of the cable 280. A pair of screws 310 are retained within the corresponding channels 304, respectively, and are moveable therein along the front-to-back direction. As shown in FIG. 25, each channel 304 forms a front narrowed section 312 and the rear widened section 314 with a step structure 316 therebetween. The front narrowed section 312 further forms a tapered configuration 3121. Corresponding, the locking screw 310 includes a front threaded section 318, a rear operation section 320 and a middle section 322 therebetween in the front-to-back direction wherein the both the front threaded section 318 and the middle section 322 are essentially received within the corresponding channel 304 while the rear operation section 320 is constantly rearwardly exposed out of the rear wall 306. Therefore, the rear operation section 320 may intimately confront forwardly the rear wall 306 and/or the middle section 322 may intimately confront forwardly against the step structure 316 when the locking screw 310 is located in a front position with regard to the boot 300. On the other hand, the expanded rear region 3181 of the front threaded section 318 abuts rearwardly against the tapered structure 3121 of the front narrowed section 312 when the locking screw 310 is located at a rear position with regard to the boot 300.

The feature of the invention is to provide the boot 300 with capability of sliding upon the outer cover 296 along the front-to-back direction within a range. To implement this function, a recess 324 is formed within an interior face of the boot 300 in which the protrusion 298 of the outer cover 296 is moveably received. Notably, the boot 300 can slide relative to the outer cover 296 along the front-to-back direction between opposite front and rear positions via cooperation/restriction of the protrusion 298 and the recess 324 wherein the front stopper structure 326 efficiently restrain the further rearward movement of the boot 300 relative to the outer cover 296 while the rear stopper structure 328 is tapered to comply with the tapered structure 299 of the protrusion 298 which is used to ease assembling of the boot 300 unto the outer cover 296. Optionally, an interference structure like ribs (not shown), may be formed upon the protrusion 298 so as to be retentively received within the recess 324 for proper retention at the two opposite positions in the recess 324. Complementarily, the recess 324 may be further equipped with a detent (not shown) around two opposite ends to receive such a rib for retaining the protrusion 298 at the two opposite positions in the recess 324, respectively. Understandably, in this embodiment, the rear wall 306, as a stopper, forwardly abuts against or intimately confronts the rear end wall of the outer cover 296 when the boot 300 is move to the front position relative to the outer cover 296

Figure 33A:
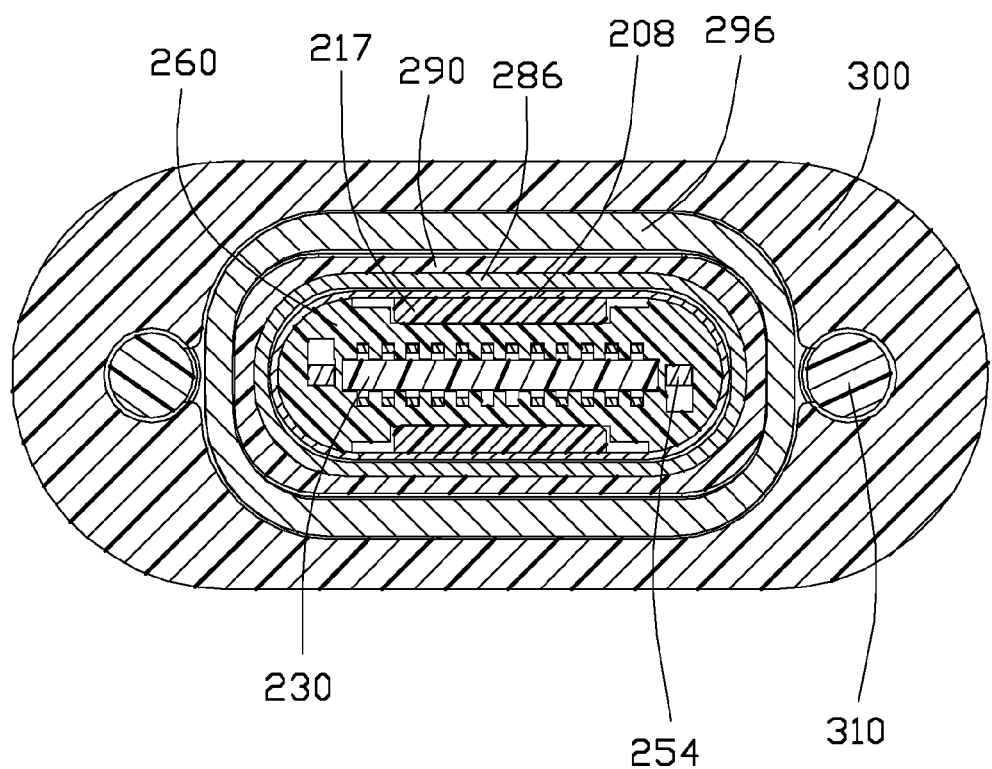
FIG. 33(A) is another cross-sectional view of the plug connector of FIG. 32(A) when the boot forwardly abuts against the rear end of the cover and the locking screw forwardly abuts against the boot.
Figure 33B:
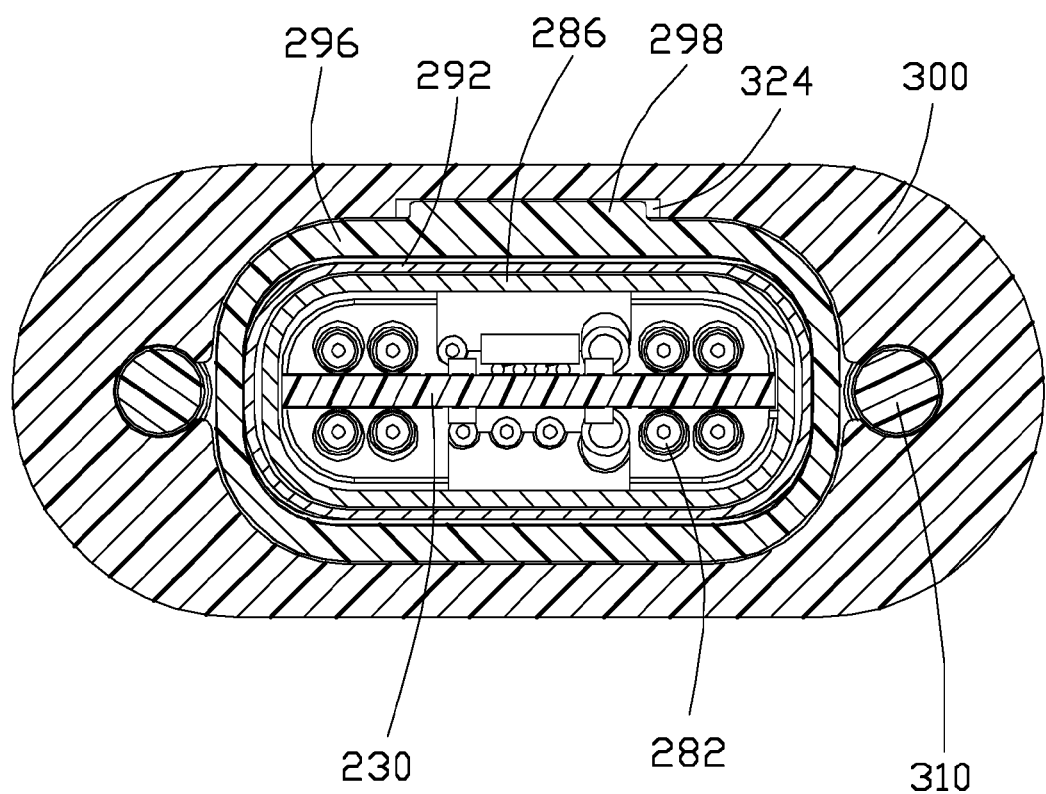
FIG. 33(B) is a cross-sectional view of the plug connector of FIG. 32(D) when the boot is rearwardly spaced from the rear end of the cover and the locking screw is rearwardly spaced from the rear end of the boot.
Figure 34A:
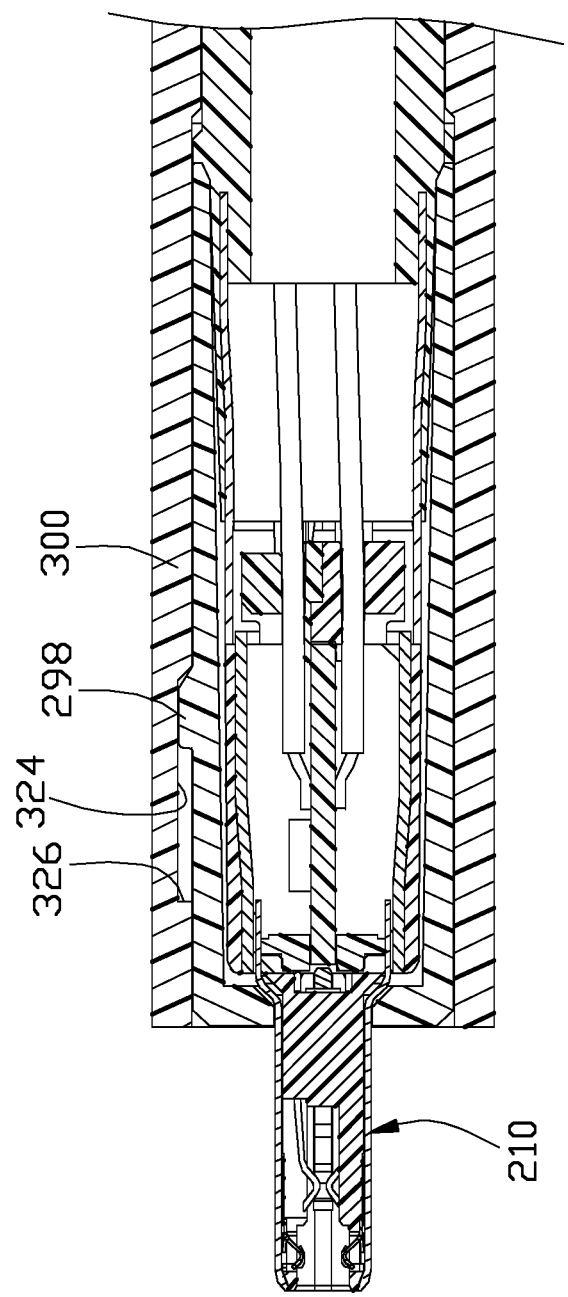
FIG. 34(A) is another cross-sectional view of the plug connector of FIG. 32(A) when the boot forwardly abuts against the rear end of the cover and the locking screw forwardly abuts against the rear end of the boot.
Figure 34B:
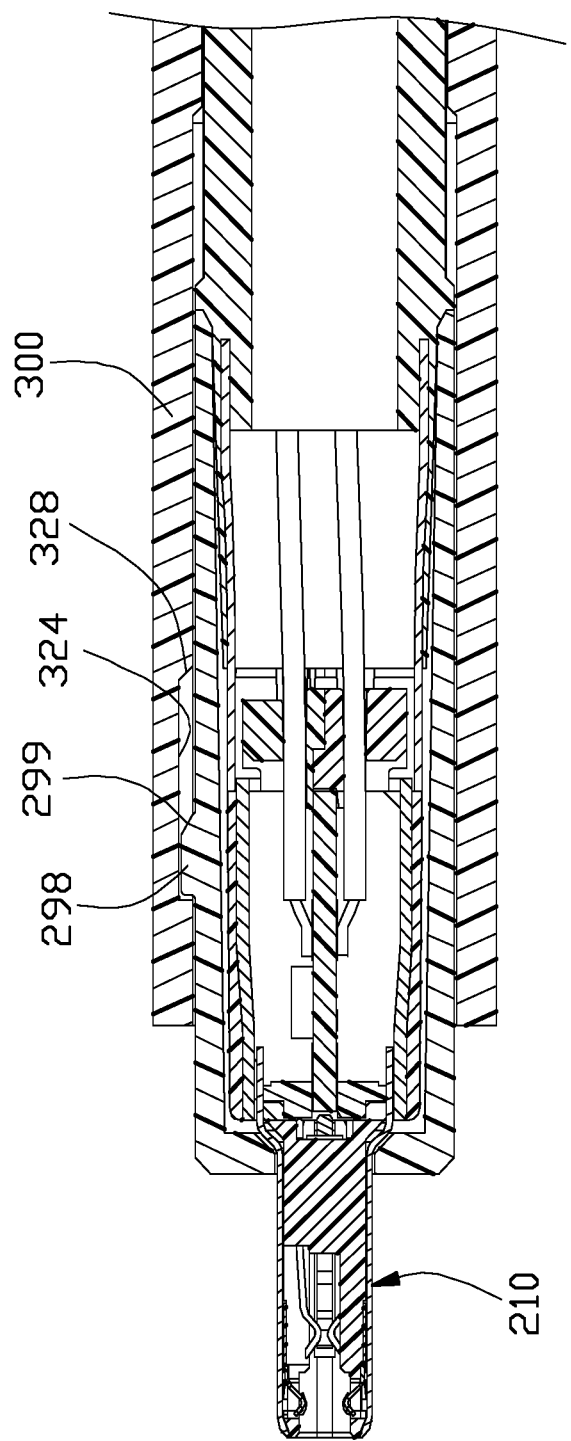
FIG. 34(B) is a cross-sectional view of the plug connector of FIG. 32(D) when the boot is rearwardly spaced from the rear end of the cover and the locking screw is rearwardly spaced from the rear end of the boot.
Figure 35:
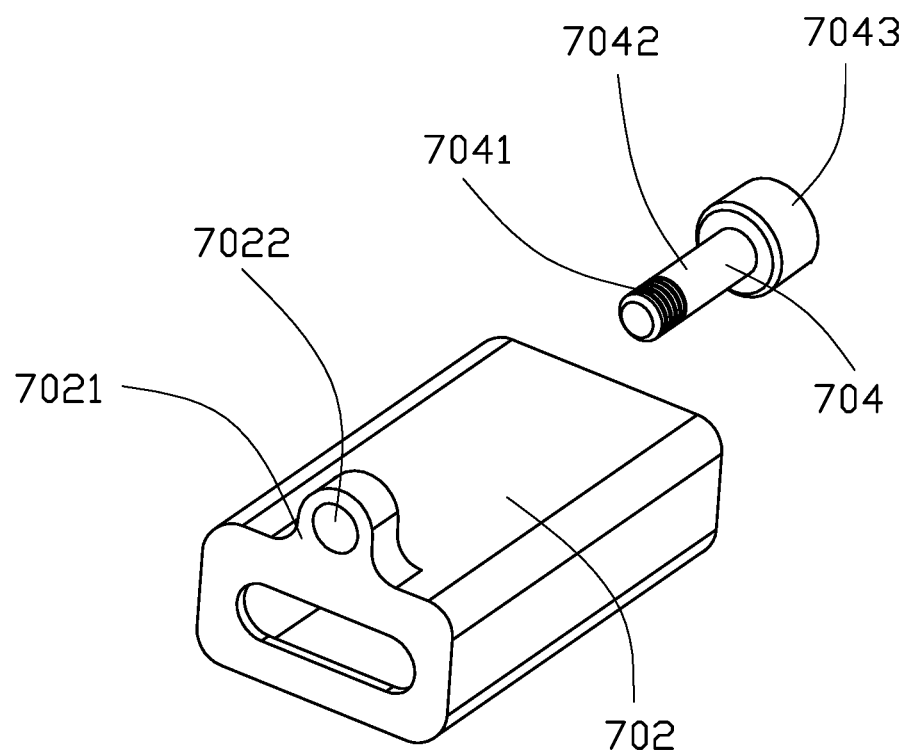
FIG. 35 is a front perspective view of the outer jacket of the plug connector of another embodiment of the invention.

FIGS. 33(A)-33(D) show four stages of the sliding operation among the boot 300, the outer cover 296 and the locking screw 310. FIG. 33(A) shows the boot 300 is located at the front position relative to the outer cover 296, and the locking screw 310 is located at the front position relative to the boot 300 so as to have the locking screw 310 extend beyond the front end of the outer cover 296 to be located at two opposite sides of the capsular section of the mating part 210 to be screwed into the corresponding screw hole of the receptacle connector (not shown); FIG. 33(B) shows the boot 300 is located at the front position relative to the outer cover 296 while the locking screw 310 is located at the rear position relative to the boot 300 so as to have the front treaded section 318 is hidden behind the front end of the boot 300; FIG. 33(C) shows the boot 300 is located at the rear position relative to the outer cover 296 while the locking screw 310 is located at the front position relative to the boot 300; FIG. 33(D) shows the boot 300 is located at the rear position relative to the outer cover 296 and the locking screw 310 is located at the rear position relative to the boot 300.

It can be understood that when the locking screw is locate at the rear position relative to the boot 300, the front threaded section 318 may be hidden behind the front end of the boot 300 so as not to interfere with the complementary receptacle connector. Please be noted that some complementary receptacle connectors may not be equipped with the screw holes for locking screws. The invention is to provide the features upon the plug cable connector with the slidable boot so as not to interfere, during mating, with the receptacle connector which is not equipped with the screw holes. Anyhow, because the locking screw 310 is not significantly fixed relative to the boot 300 and may be slidable along the front-to-back direction, sometimes the front threaded section 318 may protrude out of the front end of the boot 300 and interfere with the receptacle connector, which is not equipped with the screw holes, or the case enclosing such a receptacle connector. Therefore, when the plug cable connector confronts such a without-screw-hole receptacle connector, the boot 300 may intentionally be moved to the rear position relative to the outer cover 296. Under this situation, the front threaded section 318 can no long protrude beyond the front end of the outer cover 296 regardless of whether the locking screw 310 is located at the front position relative to the boot 300 as shown in FIG. 33(C), or at the rear position relative to the boot 300 as shown in FIG. 33(D). In opposite, the traditional plug cable connector with the fixed type boot/outer cover, may have the front treaded section of the locking screw improperly protrude beyond the front end of the outer cover and into the space beside the shell 208, as shown in FIG. 33(A), even if the complementary receptacle connector is not equipped with the screw hole, disadvantageously.

Another feature of the invention is to have the channel 304 to be transversely located as close as possible and transversely communicate with the main cavity 302 so as to reduce the pitch between the two locking screws 310. This structure feature is to not only meet the existing pitch of the screw holes but also comply with the additional slidable/slippery boot structure. The invention may be deemed as the "slip-on-screw-locking-boot". Moreover, the pitch may be 14 mm in a narrower manner. In opposite, in the traditional plug cable connector, the channels essentially defines a closed-type cross-sectional configuration because such channels are directly formed in the outer cover rather than the slidable boot on the outer cover.

Figure 36:
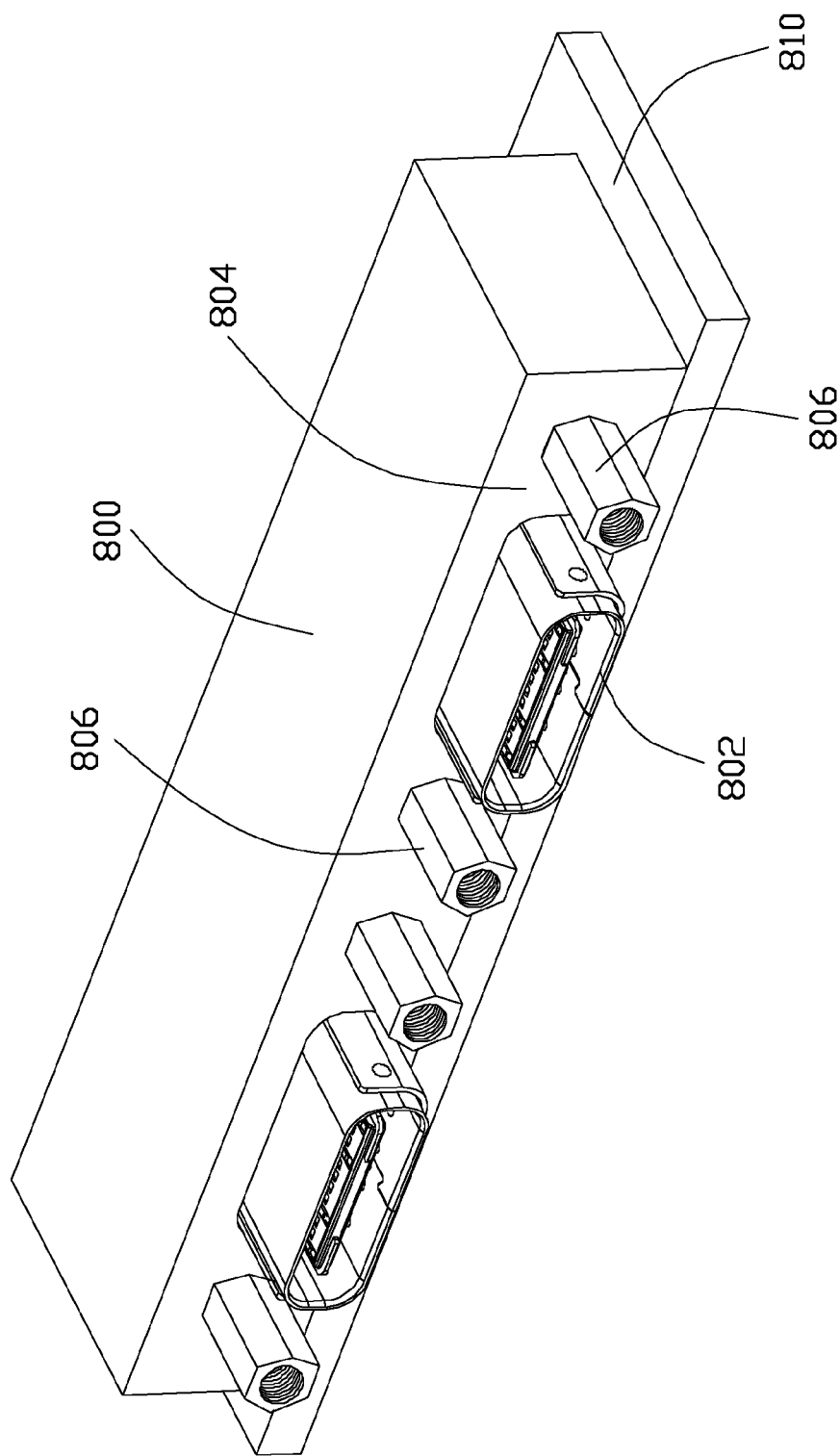
FIG. 36 is a front perspective view of the receptacle connector of another embodiment of the invention.

FIG. 36 shows another embodiment of the plug connector (not completely shown) wherein the outer cover 702 is equipped with the screw 704 in a center vertical line instead of at the lateral side. The insulative cover 702 defines an upward projecting portion 7021 therefrom with a channel 7022, the locking screw 704 is retained in the channel with a middle portion 7042, the front threading section 7041 extends forwardly from a front tip of the channel 7022 and the rear operating section 7043 with a smaller diameter than the middle section 7042 located behind the channel 7022. The rear operating section 7043 is forwardly stopped against a rear face of the protruding portion 7021. Understandably, the case enclosing the receptacle connector, may require the corresponding screw hole in two opposite positions in the vertical direction to allow the plug connector to be mated in a flippable way.

Figure 37:
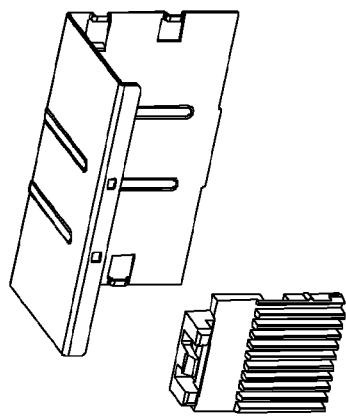
FIG. 37 is a front perspective view of the receptacle connector of another embodiment of the invention.
Figure 37:
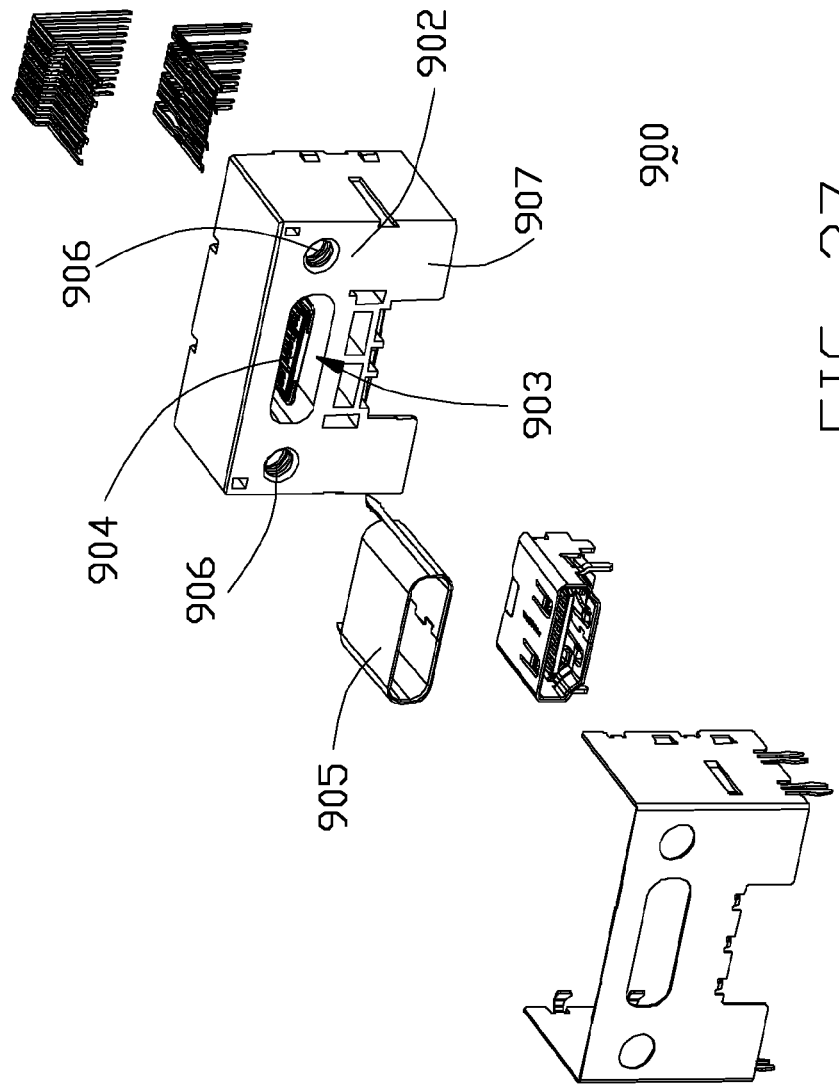

FIG. 37 shows the receptacle connector of another embodiment wherein the receptacle connector 800 mounted upon the printed circuit board 810, includes a mating port 802 extending forwardly beyond a front face 804 of the receptacle connector 800 and a pair of screw nuts 806 extending beyond the front face 804 and located by two sides of the mating port 802 to receive the corresponding screws of the plug connector, respectively. Notably, the length of the screw nut 806 along the front-to-back direction is similar to the depth of the mating port 802 along the front-to-back direction, and the outer diameter of the screw nut 806 is similar to the height of the mating port 806 in the vertical direction, and a distance between the mating port 802 and the screw nut 806 is similar to the outer diameter of the screw nut 806. Accordingly, the whole assembly may perform a compact and robust arrangement.

FIG. 38 shows the receptacle connector 900 of another embodiment wherein the insulative housing 902 defines dual mating ports spaced from each other in the vertical direction, the upper mating port defining a mating cavity 903 with a mating tongue 904 extending forwardly therein and the lower mating port adapted to receive a complete independent connector. A metallic shield 905 is rearwardly inserted into the mating cavity 903 to enclose the mating tongue 904. A pair of screw holes 906 are disposed by two sides of the mating tongue 904. Different from the previous embodiment, in the instant embodiment the mating port including the mating cavity 903 and the screw holes 906 are located behind the front face 907 of the housing 902.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A plug connector for mating with a receptacle connector, comprising:
an insulative housing defining a receiving cavity communicating with an exterior in a front-to-back direction;
two rows of contacts arranged along a transverse direction perpendicular to the front-to-back direction and disposed in the insulative housing with contacting sections of the contacts exposed in said receiving cavity in a vertical direction perpendicular to both the front-to-back direction and the transverse direction;

a metallic latch including a pair of locking heads located beside the receiving cavity in the transverse direction and extending into the receiving cavity;

a metallic shell enclosing the insulative housing;

an insulating outer cover enclosing an outer peripheral of the plug connector; and a locking screw received in the insulating cover and extending in the front-to-back direction;

wherein the locking screw is located in a center vertical line instead of at lateral side of the metallic shell.

2. The plug connector as claimed in claim 1, wherein the locking screw includes a front threading section, a middle section retained in the insulative outer cover and a rear operating section, a diameter of the front threading section is smaller than that of the rear operating section and equal to the middle section.

3. The plug connector as claimed in claim 1, wherein the insulating outer cover defines an upwardly protruding portion with a channel, the locking screw is retained in the channel with the front threading section exposing at a front tip of the protruding portion and the rear operating section behind the protruding portion.

4. The plug connector as claimed in claim 3, wherein the protruding portion is flush with a front face of the insulating outer cover and a length of the protruding portion in the front-to-back direction is shorter than that of the insulating outer cover in the front-to-back direction.

5. The plug connector as claimed in claim 1, comprising a metallic middle shell enclosing a rear portion of the metallic shell and a metallic rear shell enclosing a rear portion of the metallic middle shell and a cable connecting with the contacts.

6. The plug connector as claimed in claim 5, comprising an insulative front inner cover enclosing the metallic middle shell and an insulative rear inner cover enclosing the metallic rear shell, wherein the insulative outer cover encloses the front inner cover, the metallic rear shell and the insulative rear inner cover.

7. A plug connector for mating with a receptacle connector, comprising:

an insulative housing defining a receiving cavity communicating with an exterior in a front-to-back direction;

two rows of contacts arranged along a transverse direction perpendicular to the front-to-back direction and disposed in the insulative housing with contacting sections of the contacts exposed in said receiving cavity in a vertical direction perpendicular to both front-to-back direction and the transverse direction;

a metallic latch including a pair of locking heads located beside the receiving cavity in the transverse direction and extending into the receiving cavity;

a metallic shell enclosing said housing;

an insulating outer cover enclosing an outer periphery of the plug connector; and a pair of locking screws received in the insulating outer cover and extending in the front-to-back direction;

wherein the pair of locking screws is located at lateral side of the metallic shell and in a transverse central line of the metallic shell.

8. The plug connector as claimed in claim 7, comprising a metallic middle shell enclosing a rear portion of the metallic shell and a metallic rear shell enclosing a rear portion of the metallic middle shell and a cable connecting with the contacts.

9. The plug connector as claimed in claim 8, comprising an insulative front inner cover enclosing the metallic middle shell and an insulative rear inner cover enclosing the metallic rear shell, wherein the insulative outer cover encloses the front inner cover, the metallic rear shell and the metallic rear inner cover.

10. The plug connector as claimed in claim 7, wherein the contacts are inserted into and retained in the insulative housing.

11. The plug connector as claimed in claim 7, wherein the insulative outer cover is over-molded on an outer periphery of the plug connector.

12. The plug connector as claimed in claim 7, wherein the metallic latch further comprises a pair of legs extending rearwards and offsetting in the vertical direction.

13. The plug connector as claimed in claim 7, comprising a paddle card and an insulative wire organizer located behind the paddle card.

14. The plug connector as claimed in claim 7, comprising an insulative spacer located behind the insulative housing and a paddle card wherein the insulative spacer defines a slot to receive a front region of the paddle card.

15. The plug connector as claimed in claim 7, comprising a metallic spring plate with spring fingers extending via corresponding discrete through holes defined in the insulative housing into the receiving cavity.

16. An electrical connector assembly comprising:

a plug connector comprising:

an insulative first housing defining a receiving cavity communicating with an exterior in a front-to-back direction;

two rows of first contacts arranged along a transverse direction perpendicular to the front-to-back direction and disposed in the insulative housing with contacting sections of the first contacts exposed in said first receiving cavity in a vertical direction perpendicular to both the front-to-back direction and the transverse direction;

a metallic latch including a pair of locking heads located beside the receiving cavity in the transverse direction and extending into the receiving cavity;

a metallic shell enclosing the insulative first housing;

an insulating outer cover enclosing said shell and said first housing while the front section of the shell extending beyond a front edge of the insulative outer cover for mating; and at least one locking screw received in the insulating cover, located beside the receiving cavity and moveable along the front-to-back direction;

a receptacle connector including:

an insulative second housing equipped with a metallic shield to define a mating cavity with a mating tongue extending along said front-to-back direction so as to receive the plug connector wherein the mating tongue is received within the receiving cavity during mating;

two rows of second contacts disposed in the second housing with contacting portions exposed upon two opposite surfaces of the mating tongue;

at least one screw hole formed by a screw nut and disposed beside the mating tongue; wherein a front end face of the screw hole and a front end face of the mating cavity is generally flush with each other so that during mating, the front section of the shell of the plug connector is received within the mating cavity of the receptacle connector, and the locking screw is inserted into the screw hole.

17. The electrical connector assembly as claimed in claim 16, wherein in the receptacle connector, said insulative second housing integrates the metallic shield and said screw nut together as one piece for easy assembling.

18. The electrical connector assembly as claimed in claim 17, wherein the mating cavity and the screw hole either both extend beyond a front face of the second housing or both recessed behind the front face of the second housing.

19. The electrical connector assembly as claimed in claim 17, wherein without the locking screw, the plug connector is adapted to be mated within the corresponding receptacle connector in a flippable manner; with a pair of locking screws symmetrically located at two opposite lateral sides of the plug connector, the plug is also adapted to be mated with the corresponding receptacle connector in said flippable manner while with one locking screw at a center vertical line of the plug connector, the plug is adapted to be mated with the corresponding receptacle connector in only one single orientation.

20. The electrical connector assembly as claimed in claim 17, wherein said housing further forms a space under the metallic shield to receive another independent connector therein.

* * * * *